United States Patent
Mayuzumi

(10) Patent No.: US 8,231,812 B2
(45) Date of Patent: Jul. 31, 2012

(54) ZNO VAPOR DEPOSITION MATERIAL, PROCESS FOR PRODUCING THE SAME, AND ZNO FILM

(75) Inventor: Yoshitaka Mayuzumi, Moriya (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 12/733,897

(22) PCT Filed: Sep. 29, 2008

(86) PCT No.: PCT/JP2008/067685
§ 371 (c)(1),
(2), (4) Date: Mar. 26, 2010

(87) PCT Pub. No.: WO2009/041694
PCT Pub. Date: Apr. 2, 2009

(65) Prior Publication Data
US 2010/0243966 A1 Sep. 30, 2010

(30) Foreign Application Priority Data

| Sep. 27, 2007 | (JP) | 2007-252759 |
| Sep. 27, 2007 | (JP) | 2007-252760 |
| Sep. 27, 2007 | (JP) | 2007-252761 |
| Sep. 27, 2007 | (JP) | 2007-252762 |
| Sep. 27, 2007 | (JP) | 2007-252763 |
| Sep. 27, 2007 | (JP) | 2007-252764 |
| Sep. 27, 2007 | (JP) | 2007-252765 |
| Sep. 27, 2007 | (JP) | 2007-252766 |
| Sep. 25, 2008 | (JP) | 2008-245299 |
| Sep. 25, 2008 | (JP) | 2008-245300 |
| Sep. 25, 2008 | (JP) | 2008-245301 |
| Sep. 25, 2008 | (JP) | 2008-245302 |
| Sep. 25, 2008 | (JP) | 2008-245303 |
| Sep. 25, 2008 | (JP) | 2008-245304 |
| Sep. 25, 2008 | (JP) | 2008-245305 |
| Sep. 25, 2008 | (JP) | 2008-245306 |

(51) Int. Cl.
*H01B 1/02* (2006.01)

(52) U.S. Cl. ............ 252/519.5; 106/286.2; 106/286.5; 106/286.6; 420/513; 420/514

(58) Field of Classification Search ............ 252/519.5; 106/286.2, 286.5, 286.6; 420/513, 514
See application file for complete search history.

(56) References Cited

U.S. PATENT DOCUMENTS

| 3,664,867 A | 5/1972 | Galli et al. |
| 5,236,632 A * | 8/1993 | Ogawa et al. ............ 252/519.5 |
| 2004/0081836 A1 | 4/2004 | Inoue et al. |
| 2007/0237971 A1 | 10/2007 | Saint-Ramond et al. |
| 2008/0088067 A1 | 4/2008 | Saint-Ramond et al. |
| 2009/0305017 A1 | 12/2009 | His et al. |

FOREIGN PATENT DOCUMENTS

| DE | 10306925 A1 | 9/2004 |
| EP | 1522533 A1 | 4/2005 |
| FR | 2896797 A1 | 8/2007 |
| JP | 04-219359 A | 8/1992 |
| JP | 06-002130 A | 1/1994 |
| JP | 10-088332 A | 4/1998 |
| JP | 11-322332 A | 11/1999 |
| JP | 2004-068054 A | 3/2004 |
| JP | 2005-330158 A | 12/2005 |
| JP | 2006-200016 A | 8/2006 |
| JP | 2008-255475 A | 10/2008 |
| WO | WO-2005/001155 A1 | 1/2005 |

OTHER PUBLICATIONS

The machine translation of JP 10-088332, 1998.*
International Search Report dated Jan. 6, 2009, issued on PCT/JP2008/067685.
Supplementary Partial European Search Report dated Jun. 29, 2011, issued for the corresponding European patent application No. 08834432.0.
Office Action dated Feb. 9, 2012, issued for the Korean patent application No. 2010-7006392 and English translation thereof.
Office Action mailed Apr. 24, 2012, issued for U.S. Appl. No. 13/360,001.

* cited by examiner

*Primary Examiner* — Mark Kopec
*Assistant Examiner* — Haidung Nguyen
(74) *Attorney, Agent, or Firm* — Edwards Wildman Palmer LLP

(57) ABSTRACT

A ZnO vapor deposition material for formation of a transparent conductive film or the like consists mainly of a porous ZnO sintered body containing one or more first additive elements selected from Ce, La, Y, Pr, Nd, Pm, and Sm, and second additive elements selected from Al, Ga, Sc, and B. The content of the first additive elements is higher than the content of the second additive elements. The content of the first additive elements is in a range of 0.1 to 14.9% by mass, and the content of the second additive elements is in a range of 0.1 to 10% by mass. The sintered body has a porosity of 3 to 50%.

10 Claims, No Drawings

US 8,231,812 B2

ZNO VAPOR DEPOSITION MATERIAL, PROCESS FOR PRODUCING THE SAME, AND ZNO FILM

TECHNICAL FIELD

The present invention relates to a ZnO vapor deposition material for formation of, for example, a transparent conductive film used for solar cells; a gas and vapor-resistant film; a transparent electrode of a transparent piezoelectric sensor or a gas or vapor-resistant film in liquid crystal displays, electroluminescence display devices, and touch panel devices; and various films used in active matrix drivers constituting display devices, antistatic conductive coatings, gas sensors, electromagnetic shielding panels, piezoelectric devices, photoelectric converters, luminescence devices, thin film type secondary cells, and the like, a process for producing a ZnO vapor deposition material, a ZnO film formed of the ZnO vapor deposition material, and a process for producing a ZnO film.

This application claims priority based on Japanese Patent Application Nos. 2007-252759, 2007-252760, 2007-252761, 2007-252762, 2007-252763, 2007-252764, 2007-252765, and 2007-252766 filed on Sep. 27, 2007, and Japanese Patent Application Nos. 2008-245299, 2008-245300, 2008-245301, 2008-245302, 2008-245303, 2008-245304, 2008-245305, and 2008-245306 filed on Sep. 25, 2008, the enclosures of which are incorporated herein by reference.

BACKGROUND ART

In recent years, transparent conductive films have been indispensable when manufacturing photoelectric converters, such as solar cells and the like. As a known transparent conductive film, an ITO film (a tin-doped indium oxide film) is known. The ITO film has the advantages of excellent transparency and low resistance.

Meanwhile, there has been a need for cost reduction in solar cells or liquid crystal displays. However, since indium is expensive, when the ITO film is used as a transparent conductive film, there is a disadvantage in that the solar cell also inevitably becomes expensive. In the case of manufacturing solar cells or the like, an amorphous silicon film is formed on a transparent conductive film by a plasma CVD method or the like. At this time, if the transparent conductive film is an ITO film, there is a problem in that hydrogen plasma at the time of plasma CVD leads to deterioration of the ITO film.

In order to solve such problems, it has been proposed that a zinc oxide-based film doped with a conductive active element, such as Al, B, Si, Ga, or Sc, which can be prepared at low cost is used as a transparent conductive film for solar cells or the like, and a zinc oxide-based sputtering target is used to form the zinc oxide-based film by sputtering (for example, Patent Document 1). According to this zinc oxide-based sputtering target, an extremely low resistance zinc oxide-based sintered body is obtained by containing a predetermined amount of the conductive active element in zinc. Sintering density and conductivity of the sintered body are improved if the raw powder is fine and has high dispersibility.

[Patent Document 1] Japanese Unexamined Patent Application Publication No. 6-2130.

DISCLOSURE OF INVENTION

Technical Problem

However, if sputtering is performed to form a film at high speed using the conventional zinc oxide-based sputtering target while applying high voltage, there are disadvantages in that abnormal discharge is likely to occur, the target is inhomogeneously consumed because of an unstable discharge state, compositional shift occurs in the resultant film, and it is difficult to obtain a low resistance film. On the other hand, if the voltage is decreased by decreasing power to be applied, there are disadvantages in that the speed of film formation is lowered and the efficiency of zinc oxide-based film formation is significantly reduced.

Further, since the conventional target material has low evaporation efficiency and film formation efficiency, the lifespan of the target material replacement cycle is shortened, and there is a need for a target material having good evaporation efficiency and film formation efficiency so as to increase productivity. If the speed of film formation increases, film density is lowered, so the refractive index and sputtering resistance may be lowered, and discharge characteristics and insulation characteristics are deteriorated.

The present invention has been completed in order to solve the above-described problems, and an object of the present invention is to provide a ZnO vapor deposition material capable of forming a film having high conductivity like an ITO film at high speed and forming a conductive film having excellent transparency and denseness, and a ZnO film using the ZnO vapor deposition material. Another object of the present invention is to provide a ZnO vapor deposition material capable of improving the speed of film formation with a large amount of evaporation per unit energy, and a ZnO film using the ZnO vapor deposition material.

Technical Solution

A first aspect of the present invention has the following configuration.

[A1] A ZnO vapor deposition material for formation of a transparent conductive film which is composed of a porous ZnO sintered body containing Ce and Al, wherein the Ce content is higher than the Al content, the Ce content is in a range of 0.1 to 14.9% by mass, the Al content is in a range of 0.1 to 10% by mass, and the sintered body has a porosity of 3 to 50%.

[A2] The ZnO vapor deposition material described in [A1], wherein the total content of Ce and Al is in a range of 0.2 to 15% by mass.

[A3] The ZnO vapor deposition material described in [A1] or [A2], wherein the porous ZnO sintered body has pores having an average pore diameter of 0.1 to 500 μm.

[A4] The ZnO vapor deposition material described in any one of [A1] to [A3], wherein the porous ZnO sintered body is a sintered body of grains having an average crystal grain size of 1 to 500 μm.

[A5] The ZnO vapor deposition material described in any one of [A1] to [A4], wherein the porous ZnO sintered body is polycrystal or monocrystal.

In the ZnO vapor deposition material of this aspect, since the porous ZnO sintered body contains a predetermined amount of the two elements Ce and Al at a specific ratio, a ZnO film having high conductivity like an ITO film can be obtained by using the ZnO vapor deposition material. Preferably, the total content of Ce and Al is in a range of 0.2 to 15% by mass, so excellent effects in terms of conduction properties and spectroscopic properties are obtained.

In the ZnO vapor deposition material of this aspect, since the porous ZnO sintered body has a porosity of 3 to 50%, the specific surface area inside the vapor deposition material is large, and the evaporation speed of the vapor deposition material can be increased. Specifically, the evaporation speed can be 1.1 to 2 times higher than the conventional ZnO vapor deposition material.

In the ZnO vapor deposition material of this aspect, since the porous ZnO sintered body has pores having an average pore diameter of 0.1 to 500 μm, the evaporation speed can be increased. The porous ZnO sintered body is a sintered body of grains having an average crystal grain size of 1 to 500 μm, so the specific surface area inside the vapor deposition material increases, thereby increasing the evaporation speed of the vapor deposition material. The formed ZnO film has excellent film characteristics.

In the ZnO vapor deposition material of this aspect, the porous ZnO sintered body is polycrystal or monocrystal, and contains a predetermined amount of the two elements Ce and Al at a specific ratio, so a ZnO film having high conductivity like an ITO film can be obtained.

Another aspect of the present invention provides a process for producing a ZnO vapor deposition material having the following configuration.

[A6] A process for producing a ZnO vapor deposition material, the process including the steps of (I) mixing ZnO powder having a purity equal to or greater than 98%, $CeO_2$ powder in such an amount that the Ce content in the ZnO vapor deposition material is in a range of 0.1 to 14.9% by mass, $Al_2O_3$ powder in such an amount that the Al content in the ZnO vapor deposition material is in a range of 0.1 to 10% by mass, a binder, and an organic solvent to prepare a slurry with a concentration of 30 to 75% by mass, (II) blowing gas into the slurry to obtain a gas-containing slurry, (III) spray-drying the gas-containing slurry to obtain a porous granulation powder having an average grain size of 50 to 300 μm, (IV) molding the porous granulation powder to obtain a porous molded body, and (V) sintering the porous molded body at a predetermined temperature to obtain a porous ZnO sintered body.

[A7] The process for producing a ZnO vapor deposition material of [A6] including, instead of the steps (II) and (III), the steps of (II-2) mixing a foaming agent in raw powder or slurry to obtain a foaming agent-containing slurry, and (III-2) foaming the foaming agent-containing slurry while spray-drying the foaming agent-containing slurry to obtain a porous granulation powder having an average grain size of 50 to 300 μm.

[A8] The process for producing a ZnO vapor deposition material of [A6] including, instead of the steps (II) to (V), the steps of (II-3) mixing an additive, which will be volatized and dissolved at the time of calcination, in raw powder or slurry to obtain an additive-containing slurry, (III-3) spray-drying the additive-containing slurry to obtain a granulation powder having an average grain size of 50 to 300 μm, (IV-3) molding the granulation powder to obtain a molded body, and (V-3) sintering the molded body while volatizing and dissolving the additive to obtain a porous ZnO sintered body.

[A9] The processes for producing a ZnO vapor deposition material of any one of [A6] to [A8], wherein in the step (I), ZnO powder having a purity equal to or greater than 98%, an average grain size of 10 to 500 μm, and a grain size distribution within a range of ±10% of the average grain size, $CeO_2$ powder, and $Al_2O_3$ powder are used, and the powders, a binder, and an organic solvent are mixed to prepare a slurry with a concentration of 30 to 75% by mass.

In the process of this aspect, by the steps (I) to (V), a ZnO vapor deposition material having a large amount of evaporation, and having excellent film formation properties and denseness can be relatively easily produced. In particular, by the step (II) blowing gas into the slurry to obtain a gas-containing slurry, or (II-2) mixing a foaming agent in raw powder or slurry to obtain a foaming agent-containing slurry, a ZnO vapor deposition material having pores with predetermined porosity and average pore diameter, and an average crystal grain size can be relatively easily produced.

In the process of this aspect, since the powder having an average grain size of 10 to 500 μm and a grain size distribution within a range of ±10% of the average grain size is used, fine grains do not substantially enter between grains, and thus a porous molded body having a porosity of 3 to 50% can be easily obtained.

The present invention provides the following ZnO film and production of the same.

[A10] A ZnO film which is formed using the ZnO vapor deposition material described in any one of [A1] to [A5], or a ZnO vapor deposition material produced by the process described in any one of [A6] to [A9].

[A11] A ZnO film which is formed by an electron beam deposition method, an ion plating method, a sputtering method, or a plasma deposition method with the ZnO vapor deposition material described in any one of [A1] to [A5], or a ZnO vapor deposition material produced by the process described in any one of [A6] to [A9] as a target material.

[A12] A process for forming a ZnO film by an electron beam deposition method, an ion plating method, a sputtering method, or a plasma deposition method with the ZnO vapor deposition material described in any one of [A1] to [A5], or a ZnO vapor deposition material produced by the process described in any one of [A6] to [A9] as a target material.

The ZnO vapor deposition material of this aspect can be widely used in a vacuum deposition method, such as an electron beam deposition method, an ion plating method, a sputtering method, or a plasma deposition method. By using the ZnO vapor deposition material of this aspect, for example, when a film is formed at the same speed of film formation as the related art by an electron beam deposition method, the filament replacement frequency can be reduced, and the speed of film formation can be increased, thereby shortening the production time.

The ZnO vapor deposition material of this aspect contains Ce and Al as additive elements, so crystals distorted by Ce having an ion radius greater than Zn are recovered and aligned by adding Al having a small ion radius. Thus, a ZnO film having high permeability is formed, such that a ZnO film having excellent denseness and high durability can be formed. A film having excellent moisture resistance and gas and vapor barrier properties can be obtained.

The ZnO vapor deposition material of this aspect has porosity within a predetermined range, and preferably, pores have an average pore diameter within a specific range, and grains have an average crystal grain size within a predetermined range, so the specific surface area inside the vapor deposition material increases, thereby increasing the evaporation speed. Thus, a ZnO film having good film formation efficiency can be formed. A ZnO film formed of the ZnO vapor deposition material of this aspect is dense, and has high conductivity and excellent durability.

Another aspect of the present invention has the following configuration.

[B1] A ZnO vapor deposition material for formation of a transparent conductive film which is composed of a porous ZnO sintered body containing Ce and Ga, wherein the Ce content is higher than the Ga content, the Ce content is in a range of 0.1 to 14.9% by mass, the Ga content is in a range of 0.1 to 10% by mass, and the sintered body has a porosity of 3 to 50%.

[B2] The ZnO vapor deposition material described in [B1], wherein the total content of Ce and Ga is in a range of 0.2 to 15% by mass.

[B3] The ZnO vapor deposition material described in [B1] or [B2], wherein the porous ZnO sintered body has pores having an average pore diameter of 0.1 to 500 μm.

[B4] The ZnO vapor deposition material described in any one of [B1] to [B3], wherein the porous ZnO sintered body is a sintered body of grains having an average crystal grain size of 1 to 500 μm.

[B5] The ZnO vapor deposition material described in any one of [B1] to [B4], wherein the porous ZnO sintered body is polycrystal or monocrystal.

In the ZnO vapor deposition material of this aspect, the porous ZnO sintered body contains a predetermined amount of the two elements Ce and Ga at a specific ratio, so a ZnO film having high conductivity like an ITO film can be obtained by using the ZnO vapor deposition material. Preferably, the total content of Ce and Ga is in a range of 0.2 to 15% by mass, so excellent effects in terms of conduction properties and spectroscopic properties are obtained.

In the ZnO vapor deposition material of this aspect, since the porous ZnO sintered body has a porosity of 3 to 50%, the specific surface area inside the vapor deposition material is large, and the evaporation speed of the vapor deposition material can be increased. Specifically, the evaporation speed can be 1.1 to 2 times higher than the conventional ZnO vapor deposition material.

In the ZnO vapor deposition material of this aspect, since the porous ZnO sintered body has pores having an average pore diameter of 0.1 to 500 μm, the evaporation speed can be increased. The porous ZnO sintered body is a sintered body of grains having an average crystal grain size of 1 to 500 μm, so the specific surface area inside the vapor deposition material increases, thereby increasing the evaporation speed of the vapor deposition material. The formed ZnO film has excellent film characteristics.

In the ZnO vapor deposition material of this aspect, the porous ZnO sintered body is polycrystal or monocrystal, and contains a predetermined amount of the two elements Ce and Ga at a specific ratio, so a ZnO film having high conductivity like an ITO film can be obtained.

Another aspect of the present invention provides a process for producing a ZnO vapor deposition material having the following configuration.

[B6] A process for producing a ZnO vapor deposition material, the process including the steps of (I) mixing ZnO powder having a purity equal to or greater than 98%, $CeO_2$ powder in such an amount that the Ce content in the ZnO vapor deposition material is in a range of 0.1 to 14.9% by mass, $Ga_2O_3$ powder in such an amount that the Ga content in the ZnO vapor deposition material is in a range of 0.1 to 10% by mass, a binder, and an organic solvent to prepare a slurry with a concentration of 30 to 75% by mass, (II) blowing gas into the slurry to obtain a gas-containing slurry, (III) spray-drying the gas-containing slurry to obtain a porous granulation powder having an average grain size of 50 to 300 μm, (IV) molding the porous granulation powder to obtain a porous molded body, and (V) sintering the porous molded body at a predetermined temperature to obtain a porous ZnO sintered body.

[B7] The process for producing a ZnO vapor deposition material of [B6] including, instead of the steps (II) and (III), the steps of (II-2) mixing a foaming agent in raw powder or slurry to obtain a foaming agent-containing slurry, and (III-2) foaming the foaming agent-containing slurry while spray-drying the foaming agent-containing slurry to obtain a porous granulation powder having an average grain size of 50 to 300 μm.

[B8] The process for producing a ZnO vapor deposition material of [B6] including, instead of the steps (II) to (V), the steps of (II-3) mixing an additive, which will be volatized and dissolved at the time of calcination, in raw powder or slurry to obtain an additive-containing slurry, (III-3) spray-drying the additive-containing slurry to obtain a granulation powder having an average grain size of 50 to 300 μm, (IV-3) molding the granulation powder to obtain a molded body, and (V-3) sintering the molded body while volatizing and dissolving the additive to obtain a porous ZnO sintered body.

[B9] The processes for producing a ZnO vapor deposition material of any one of [B6] to [B8], wherein in the step (I), ZnO powder having a purity equal to or greater than 98%, an average grain size of 10 to 500 μm, and a grain size distribution within a range of ±10% of the average grain size, $CeO_2$ powder, and $Ga_2O_3$ powder are used, and the powders, a binder, and an organic solvent are mixed to prepare a slurry with a concentration of 30 to 75% by mass.

In the process of this aspect, by the steps (I) to (V), a ZnO vapor deposition material having a large amount of evaporation, and having excellent film formation properties and denseness can be relatively easily produced. In particular, by the step (II) blowing gas into the slurry to obtain a gas-containing slurry, or (II-2) mixing a foaming agent in raw powder or slurry to obtain a foaming agent-containing slurry, a ZnO vapor deposition material having pores with predetermined porosity and average pore diameter, and an average crystal grain size can be relatively easily produced.

In the process of this aspect, since the powder having an average grain size of 10 to 500 μm and a grain size distribution within a range of ±10% of the average grain size is used, fine grains do not substantially enter between grains, and thus a porous molded body having a porosity of 3 to 50% can be easily obtained.

The present invention provides the following ZnO film and production of the same.

[B10] A ZnO film which is formed using the ZnO vapor deposition material described in any one of [B1] to [B5], or a ZnO vapor deposition material produced by the process described in any one of [B6] to [B9].

[B11] A ZnO film which is formed by an electron beam deposition method, an ion plating method, a sputtering method, or a plasma deposition method with the ZnO vapor deposition material described in any one of [B1] to [B5], or a ZnO vapor deposition material produced by the process described in any one of [B6] to [B9] as a target material.

[B12] A process for forming a ZnO film by an electron beam deposition method, an ion plating method, a sputtering method, or a plasma deposition method with the ZnO vapor deposition material described in any one of [B1] to [B5], or a ZnO vapor deposition material produced by the process described in any one of [B6] to [B9] as a target material.

The ZnO vapor deposition material of this aspect can be widely used in a vacuum deposition method, such as an electron beam deposition method, an ion plating method, a sputtering method, or a plasma deposition method. By using the ZnO vapor deposition material of this aspect, for example, when a film is formed at the same speed of film formation as the related art by an electron beam deposition method, the filament replacement frequency can be reduced, and the speed of film formation can be increased, thereby shortening the production time.

The ZnO vapor deposition material of this aspect contains Ce and Ga as additive elements, so crystals distorted by Ce having an ion radius greater than Zn are recovered and aligned by adding Ga having a small ion radius. Thus, a ZnO film having high permeability is formed, such that a ZnO film having excellent denseness and high durability can be formed. A film having excellent moisture resistance and gas and vapor barrier properties can be obtained.

The ZnO vapor deposition material of this aspect has porosity within a predetermined range, and preferably, pores have an average pore diameter within a specific range, and grains have an average crystal grain size within a predetermined range, so the specific surface area inside the vapor deposition material increases, thereby increasing the evaporation speed. Thus, a ZnO film having good film formation efficiency can be formed. A ZnO film formed of the ZnO vapor deposition material of this aspect is dense, and has high conductivity and excellent durability.

Another aspect of the present invention has the following configuration.

[C1] A ZnO vapor deposition material for formation of a transparent conductive film which is composed of a porous ZnO sintered body containing Ce and Sc, wherein the Ce content is higher than the Sc content, the Ce content is in a range of 0.1 to 14.9% by mass, the Sc content is in a range of 0.1 to 10% by mass, and the sintered body has a porosity of 3 to 50%.

[C2] The ZnO vapor deposition material described in [C1], wherein the total content of Ce and Sc is in a range of 0.2 to 15% by mass.

[C3] The ZnO vapor deposition material described in [C1] or [C2], wherein the porous ZnO sintered body has pores having an average pore diameter of 0.1 to 500 µm.

[C4] The ZnO vapor deposition material described in any one of [C1] to [C3], wherein the porous ZnO sintered body is a sintered body of grains having an average crystal grain size of 1 to 500 µm.

[C5] The ZnO vapor deposition material described in any one of [C1] to [C4], wherein the porous ZnO sintered body is polycrystal or monocrystal.

In the ZnO vapor deposition material of this aspect, the porous ZnO sintered body contains a predetermined amount of the two elements Ce and Sc at a specific ratio, so a ZnO film having high conductivity like an ITO film can be obtained by using the ZnO vapor deposition material. Preferably, the total content of Ce and Sc is in a range of 0.2 to 15% by mass, so excellent effects in terms of conduction properties and spectroscopic properties are obtained.

In the ZnO vapor deposition material of this aspect, since the porous ZnO sintered body has a porosity of 3 to 50%, the specific surface area inside the vapor deposition material is large, and the evaporation speed of the vapor deposition material can be increased. Specifically, the evaporation speed can be 1.1 to 2 times higher than the conventional ZnO vapor deposition material.

In the ZnO vapor deposition material of this aspect, since the porous ZnO sintered body has pores having an average pore diameter of 0.1 to 500 µm, the evaporation speed can be increased. The porous ZnO sintered body is a sintered body of grains having an average crystal grain size of 1 to 500 µm, so the specific surface area inside the vapor deposition material increases, thereby increasing the evaporation speed of the vapor deposition material. The formed ZnO film has excellent film characteristics.

In the ZnO vapor deposition material of this aspect, the porous ZnO sintered body is polycrystal or monocrystal, and contains a predetermined amount of the two elements Ce and Sc at a specific ratio, so a ZnO film having high conductivity like an ITO film can be obtained.

Another aspect of the present invention provides a process for producing a ZnO vapor deposition material having the following configuration.

[C6] A process for producing a ZnO vapor deposition material, the process including the steps of (I) mixing ZnO powder having a purity equal to or greater than 98%, $CeO_2$ powder in such an amount that the Ce content in the ZnO vapor deposition material is in a range of 0.1 to 14.9% by mass, $Sc_2O_3$ powder in such an amount that the Sc content in the ZnO vapor deposition material is in a range of 0.1 to 10% by mass, a binder, and an organic solvent to prepare a slurry with a concentration of 30 to 75% by mass, (II) blowing gas into the slurry to obtain a gas-containing slurry, (III) spray-drying the gas-containing slurry to obtain a porous granulation powder having an average grain size of 50 to 300 µm, (IV) molding the porous granulation powder to obtain a porous molded body, and (V) sintering the porous molded body at a predetermined temperature to obtain a porous ZnO sintered body.

[C7] The process for producing a ZnO vapor deposition material of [C6] including, instead of the steps (II) and (III), the steps of (II-2) mixing a foaming agent in raw powder or slurry to obtain a foaming agent-containing slurry, and (III-2) foaming the foaming agent-containing slurry while spray-drying the foaming agent-containing slurry to obtain a porous granulation powder having an average grain size of 50 to 300 µm.

[C8] The process for producing a ZnO vapor deposition material of [C6] including, instead of the steps (II) to (V), the steps of (II-3) mixing an additive, which will be volatized and dissolved at the time of calcination, in raw powder or slurry to obtain an additive-containing slurry, (III-3) spray-drying the additive-containing slurry to obtain a granulation powder having an average grain size of 50 to 300 µm, (IV-3) molding the granulation powder to obtain a molded body, and (V-3) sintering the molded body while volatizing and dissolving the additive to obtain a porous ZnO sintered body.

[C9] The process for producing a ZnO vapor deposition material of any one of [C6] to [C8], wherein in the step (I), ZnO powder having a purity equal to or greater than 98%, an average grain size of 10 to 500 µm, and a grain size distribution within a range of ±10% of the average grain size, $CeO_2$ powder, and $Sc_2O_3$ powder are used, and the powders, a binder, and an organic solvent are mixed to prepare a slurry with a concentration of 30 to 75% by mass.

In the process of this aspect, by the steps (I) to (V), a ZnO vapor deposition material having a large amount of evaporation, and having excellent film formation properties and denseness can be relatively easily produced. In particular, by the step (II) blowing gas into the slurry to obtain a gas-containing slurry, or (II-2) mixing a foaming agent in raw powder or slurry to obtain a foaming agent-containing slurry, a ZnO vapor deposition material having pores with predetermined porosity and average pore diameter, and an average crystal grain size can be relatively easily produced.

In the process of this aspect, since the powder having an average grain size of 10 to 500 µm and a grain size distribution within a range of ±10% of the average grain size is used, fine grains do not substantially enter between grains, and thus a porous molded body having a porosity of 3 to 50% can be easily obtained.

The present invention provides the following ZnO film and production of the same.

[C10] A ZnO film which is formed using the ZnO vapor deposition material described in any one of [C1] to [C5], or a ZnO vapor deposition material produced by the process described in any one of [C6] to [C9].

[C11] A ZnO film which is formed by an electron beam deposition method, an ion plating method, a sputtering method, or a plasma deposition method with the ZnO vapor deposition material described in any one of [C1] to [C5], or a ZnO vapor deposition material produced by the process described in any one of [C6] to [C9] as a target material.

[C12] A process for forming a ZnO film by an electron beam deposition method, an ion plating method, a sputtering method, or a plasma deposition method with the ZnO vapor deposition material described in any one of [C1] to [C5], or a ZnO vapor deposition material produced by the process described in any one of [C6] to [C9] as a target material.

The ZnO vapor deposition material of this aspect can be widely used in a vacuum deposition method, such as an electron beam deposition method, an ion plating method, a sputtering method, or a plasma deposition method. By using the ZnO vapor deposition material of this aspect, for example, when a film is formed at the same speed of film formation as the related art by an electron beam deposition method, the filament replacement frequency can be reduced, and the speed of film formation can be increased, thereby shortening the production time.

The ZnO vapor deposition material of this aspect contains Ce and Sc as additive elements, so crystals distorted by Ce having an ion radius greater than Zn are recovered and aligned by adding Sc having a small ion radius. Thus, a ZnO film having high permeability is formed, such that a ZnO film having excellent denseness and high durability can be formed. A film having excellent moisture resistance and gas and vapor barrier properties can be obtained.

The ZnO vapor deposition material of this aspect has porosity within a predetermined range, and preferably, pores have an average pore diameter within a specific range, and grains have an average crystal grain size within a predetermined range, so the specific surface area inside the vapor deposition material increases, thereby increasing the evaporation speed. Thus, a ZnO film having good film formation efficiency can be formed. A ZnO film formed of the ZnO vapor deposition material of this aspect is dense, and has high conductivity and excellent durability.

Another aspect of the present invention has the following configuration.

[D1] A ZnO vapor deposition material for formation of a transparent conductive film which is composed of a porous ZnO sintered body containing Ce and B, wherein the Ce content is higher than the B content, the Ce content is in a range of 0.1 to 14.9% by mass, the B content is in a range of 0.1 to 10% by mass, and the sintered body has a porosity of 3 to 50%.

[D2] The ZnO vapor deposition material described in [D1], wherein the total content of Ce and B is in a range of 0.2 to 15% by mass.

[D3] The ZnO vapor deposition material described in [D1] or [D2], wherein the porous ZnO sintered body has pores having an average pore diameter of 0.1 to 500 μm.

[D4] The ZnO vapor deposition material described in any one of [D1] to [D3], wherein the porous ZnO sintered body is a sintered body of grains having an average crystal grain size of 1 to 500 μm.

[D5] The ZnO vapor deposition material described in any one of [D1] to [D4], wherein the porous ZnO sintered body is polycrystal or monocrystal.

In the ZnO vapor deposition material of this aspect, the porous ZnO sintered body contains a predetermined amount of the two elements Ce and B at a specific ratio, so a ZnO film having high conductivity like an ITO film can be obtained by using the ZnO vapor deposition material. Preferably, the total content of Ce and B is in a range of 0.2 to 15% by mass, so excellent effects in terms of conduction properties and spectroscopic properties are obtained.

In the ZnO vapor deposition material of this aspect, since the porous ZnO sintered body has a porosity of 3 to 50%, the specific surface area inside the vapor deposition material is large, and the evaporation speed of the vapor deposition material can be increased. Specifically, the evaporation speed can be 1.1 to 2 times higher than the conventional ZnO vapor deposition material.

In the ZnO vapor deposition material of this aspect, since the porous ZnO sintered body has pores having an average pore diameter of 0.1 to 500 μm, the evaporation speed can be increased. The porous ZnO sintered body is a sintered body of grains having an average crystal grain size of 1 to 500 μm, so the specific surface area inside the vapor deposition material increases, thereby increasing the evaporation speed of the vapor deposition material. The formed ZnO film has excellent film characteristics.

In the ZnO vapor deposition material of this aspect, the porous ZnO sintered body is polycrystal or monocrystal, and contains a predetermined amount of the two elements Ce and B at a specific ratio, so a ZnO film having high conductivity like an ITO film can be obtained.

Another aspect of the present invention provides a process for producing a ZnO vapor deposition material having the following configuration.

[D6] A process for producing a ZnO vapor deposition material, the process including the steps of (I) mixing ZnO powder having a purity equal to or greater than 98%, $CeO_2$ powder in such an amount that the Ce content in the ZnO vapor deposition material is in a range of 0.1 to 14.9% by mass, $B_2O_3$ powder in such an amount that the B content in the ZnO vapor deposition material is in a range of 0.1 to 10% by mass, a binder, and an organic solvent to prepare a slurry with a concentration of 30 to 75% by mass, (II) blowing gas into the slurry to obtain a gas-containing slurry, (III) spray-drying the gas-containing slurry to obtain a porous granulation powder having an average grain size of 50 to 300 μm, (IV) molding the porous granulation powder to obtain a porous molded body, and (V) sintering the porous molded body at a predetermined temperature to obtain a porous ZnO sintered body.

[D7] The process for producing a ZnO vapor deposition material of [D6] including, instead of the steps (II) and (III), the steps of (II-2) mixing a foaming agent in raw powder or slurry to obtain a foaming agent-containing slurry, and (III-2) foaming the foaming agent-containing slurry while spray-drying the foaming agent-containing slurry to obtain a porous granulation powder having an average grain size of 50 to 300 μm.

[D8] The process for producing a ZnO vapor deposition material of [D6] including, instead of the steps (II) to (V), the steps of (II-3) mixing an additive, which will be volatized and dissolved at the time of calcination, in raw powder or slurry to obtain an additive-containing slurry, (III-3) spray-drying the additive-containing slurry to obtain a granulation powder having an average grain size of 50 to 300 μm, (IV-3) molding the granulation powder to obtain a molded body, and (V-3) sintering the molded body while volatizing and dissolving the additive to obtain a porous ZnO sintered body.

[D9] The process for producing a ZnO vapor deposition material of any one of [D6] to [D8], wherein in the step (I), ZnO powder having a purity equal to or greater than 98%, an average grain size of 10 to 500 μm, and a grain size distribution within a range of ±10% of the average grain size, $CeO_2$ powder, and $B_2O_3$ powder are used, and the powders, a binder, and an organic solvent are mixed to prepare a slurry with a concentration of 30 to 75% by mass.

In the process of this aspect, by the steps (I) to (V), a ZnO vapor deposition material having a large amount of evaporation, and having excellent film formation properties and denseness can be relatively easily produced. In particular, by the step (II) blowing gas into the slurry to obtain a gas-containing slurry, or (II-2) mixing a foaming agent in raw powder or slurry to obtain a foaming agent-containing slurry, a ZnO vapor deposition material having pores with predetermined porosity and average pore diameter, and an average crystal grain size can be relatively easily produced.

In the process of this aspect, since the powder having an average grain size of 10 to 500 μm and a grain size distribution within a range of ±10% of the average grain size is used, fine grains do not substantially enter between grains, and thus a porous molded body having a porosity of 3 to 50% can be easily obtained.

The present invention provides the following ZnO film and production of the same.

[D10] A ZnO film which is formed using the ZnO vapor deposition material described in any one of [D1] to [D5], or a ZnO vapor deposition material produced by the process described in any one of [D6] to [D9].

[D11] A ZnO film which is formed by an electron beam deposition method, an ion plating method, a sputtering method, or a plasma deposition method with the ZnO vapor deposition material described in any one of [D1] to [D5], or a ZnO vapor deposition material produced by the process described in any one of [D6] to [D9] as a target material.

[D12] A process for forming a ZnO film by an electron beam deposition method, an ion plating method, a sputtering method, or a plasma deposition method with the ZnO vapor deposition material described in any one of [D1] to [D5], or a ZnO vapor deposition material produced by the process described in any one of [D6] to [D9] as a target material.

The ZnO vapor deposition material of this aspect can be widely used in a vacuum deposition method, such as an electron beam deposition method, an ion plating method, a sputtering method, or a plasma deposition method. By using the ZnO vapor deposition material of this aspect, for example, when a film is formed at the same speed of film formation as the related art by an electron beam deposition method, the filament replacement frequency can be reduced, and the speed of film formation can be increased, thereby shortening the production time.

The ZnO vapor deposition material of this aspect contains Ce and B as additive elements, so crystals distorted by Ce having an ion radius greater than Zn are recovered and aligned by adding B having a small ion radius. Thus, a ZnO film having high permeability is formed, such that a ZnO film having excellent denseness and high durability can be formed. A film having excellent moisture resistance and gas and vapor barrier properties can be obtained.

The ZnO vapor deposition material of this aspect has porosity within a predetermined range, and preferably, pores have an average pore diameter within a specific range, and grains have an average crystal grain size within a predetermined range, so the specific surface area inside the vapor deposition material increases, thereby increasing the evaporation speed. Thus, a ZnO film having good film formation efficiency can be formed. A ZnO film formed of the ZnO vapor deposition material of this aspect is dense, and has high conductivity and excellent durability.

Another aspect of the present invention has the following configuration.

[E1] A ZnO vapor deposition material for formation of a transparent conductive film which is composed of a sintered body containing ZnO as a major component, wherein the sintered body contains La as a first additive element and a second additive element, the second additive element is one or more elements selected from the group consisting of B, Al, Ga, and Sc, the La content is in a range of 0.1 to 14.9% by mass, the content of the second additive element is in a range of 0.1 to 10% by mass, the La content is higher than the content of the second additive element, and the sintered body is a porous sintered body having a porosity of 3 to 50%.

[E2] The ZnO vapor deposition material described in [E1], wherein the total content of La as a first additive element and the second additive element is in a range of 0.2 to 15% by mass.

[E3] The ZnO vapor deposition material described in [E1] or [E2], wherein the porous ZnO sintered body has pores having an average pore diameter of 0.1 to 500 μm.

[E4] The ZnO vapor deposition material described in any one of [E1] to [E3], wherein the porous ZnO sintered body is a sintered body of grains having an average crystal grain size of 1 to 500 μm.

[E5] The ZnO vapor deposition material described in any one of [E1] to [E4], wherein the porous ZnO sintered body is polycrystal or monocrystal.

In the ZnO vapor deposition material of this aspect, the porous sintered body containing ZnO as a major component (hereinafter, simply referred to as porous ZnO sintered body) contains La as a first additive element and the second additive element at a specific ratio, so a ZnO film having high conductivity like an ITO film can be obtained by using the ZnO vapor deposition material. Specifically, the porous sintered body contains one or more elements selected from the group consisting of B, Al, Ga, and Sc as the second additive element, and the total content of La as a first additive element and the second additive element is in a range of 0.2 to 15% by mass, so excellent effects in terms of conduction properties and spectroscopic properties are obtained.

In the ZnO vapor deposition material of this aspect, since the porous ZnO sintered body has a porosity of 3 to 50%, the specific surface area inside the vapor deposition material is large, and the evaporation speed of the vapor deposition material can be increased. Specifically, the evaporation speed can be 1.1 to 2 times higher than the conventional ZnO vapor deposition material.

In the ZnO vapor deposition material of this aspect, since the porous ZnO sintered body has pores having an average pore diameter of 0.1 to 500 μm, the evaporation speed can be increased. The porous ZnO sintered body is a sintered body of grains having an average crystal grain size of 1 to 500 μm, so the specific surface area inside the vapor deposition material increases, thereby increasing the evaporation speed of the vapor deposition material. The formed ZnO film has excellent film characteristics.

In the ZnO vapor deposition material of this aspect, the porous ZnO sintered body is polycrystal or monocrystal, and contains a predetermined amount of the two elements La and Al at a specific ratio, so a ZnO film having high conductivity like an ITO film can be obtained.

Another aspect of the present invention provides a process for producing a ZnO vapor deposition material having the following configuration.

[E6] A process for producing a ZnO vapor deposition material, the process including the steps of (I) mixing ZnO powder having a purity equal to or greater than 98%, $La_2O_3$ powder in such an amount that the La content in the ZnO vapor deposition material is in a range of 0.1 to 14.9% by mass, an oxide powder of a second additive element in such an amount that the content of the second additive element in the ZnO vapor deposition material is in a range of 0.1 to 10% by mass, a binder, and an organic solvent to prepare a slurry with a concentration of 30 to 75% by mass, (II) blowing gas into the slurry to obtain a gas-containing slurry, (III) spray-drying the gas-containing slurry to obtain a porous granulation powder having an average grain size of 50 to 300 μm, (IV) molding the porous granulation powder to obtain a porous molded body, and (V) sintering the porous molded body at a predetermined temperature to obtain a porous ZnO sintered body.

[E7] The process for producing a ZnO vapor deposition material of [E6] including, instead of the steps (II) and (III), the steps of (II-2) mixing a foaming agent in raw powder or slurry to obtain a foaming agent-containing slurry, and (III-2) foaming the foaming agent-containing slurry while spray-drying the foaming agent-containing slurry to obtain a porous granulation powder having an average grain size of 50 to 300 μm.

[E8] The process for producing a ZnO vapor deposition material of [E6] including, instead of the steps (II) to (V), the steps of (II-3) mixing an additive, which will be volatized and dissolved at the time of calcination, in raw powder or slurry to obtain an additive-containing slurry, (III-3) spray-drying the additive-containing slurry to obtain a granulation powder having an average grain size of 50 to 300 μm, (IV-3) molding the granulation powder to obtain a molded body, and (V-3) sintering the molded body while volatizing and dissolving the additive to obtain a porous ZnO sintered body.

[E9] The process for producing a ZnO vapor deposition material of any one of [E6] to [E8], wherein in the step (I), ZnO powder having a purity equal to or greater than 98%, an average grain size of 10 to 500 μm, and a grain size distribution within a range of ±10% of the average grain size, $La_2O_3$ powder, and oxide powder of the second additive element are used, and the powders, a binder, and an organic solvent are mixed to prepare a slurry with a concentration of 30 to 75% by mass.

In the process of this aspect, by the steps (I) to (V), a ZnO vapor deposition material having a large amount of evaporation, and having excellent film formation properties and denseness can be relatively easily produced. In particular, by the step (II) blowing gas into the slurry to obtain a gas-containing slurry, or (II-2) mixing a foaming agent in raw powder or slurry to obtain a foaming agent-containing slurry, a ZnO vapor deposition material having pores with predetermined porosity and average pore diameter, and an average crystal grain size can be relatively easily produced.

In the process of this aspect, since the powder having an average grain size of 10 to 500 μm and a grain size distribution within a range of ±10% of the average grain size is used, fine grains do not substantially enter between grains, and thus a porous molded body having a porosity of 3 to 50% can be easily obtained.

The present invention provides the following ZnO film and production of the same.

[E10] A ZnO film which is formed using the ZnO vapor deposition material described in any one of [E1] to [E5], or a ZnO vapor deposition material produced by the process described in any one of [E6] to [E9].

[E11] A ZnO film which is formed by an electron beam deposition method, an ion plating method, a sputtering method, or a plasma deposition method with the ZnO vapor deposition material described in any one of [E1] to [E5], or a ZnO vapor deposition material produced by the process described in any one of [E6] to [E9] as a target material.

[E12] A process for forming a ZnO film by an electron beam deposition method, an ion plating method, a sputtering method, or a plasma deposition method with the ZnO vapor deposition material described in any one of [E1] to [E5], or a ZnO vapor deposition material produced by the process described in any one of [E6] to [E9] as a target material.

The ZnO vapor deposition material of this aspect can be widely used in a vacuum deposition method, such as an electron beam deposition method, an ion plating method, a sputtering method, or a plasma deposition method. By using the ZnO vapor deposition material of this aspect, for example, when a film is formed at the same speed of film formation as the related art by an electron beam deposition method, the filament replacement frequency can be reduced, and the speed of film formation can be increased, thereby shortening the production time.

The ZnO vapor deposition material of this aspect contains La as a first additive element and the second additive element, and the second additive element is one or more elements selected from the group consisting of B, Al, Ga, and Sc, so crystals distorted by La having an ion radius greater than Zn are recovered and aligned by adding B, Al, or Ga having an ion radius smaller than La, or Sc having high reactivity is added to form a film having a regulated crystal structure. Thus, a ZnO film having high permeability is formed, such that a ZnO film having excellent denseness and high durability can be formed. A film having excellent moisture resistance and gas and vapor barrier properties can be obtained.

The ZnO vapor deposition material of this aspect has porosity within a predetermined range, and preferably, pores have an average pore diameter within a specific range, and grains have an average crystal grain size within a predetermined range, so the specific surface area inside the vapor deposition material increases, thereby increasing the evaporation speed. Thus, a ZnO film having good film formation efficiency can be formed. A ZnO film formed of the ZnO vapor deposition material of this aspect is dense, and has high conductivity and excellent durability.

Another aspect of the present invention has the following configuration.

[F1] A ZnO vapor deposition material for formation of a transparent conductive film which is composed of a sintered body containing ZnO as a major component, wherein the sintered body contains Y as a first additive element and a second additive element, the second additive element is one or more elements selected from the group consisting of B, Al, Ga, and Sc, the Y content is in a range of 0.1 to 14.9% by mass, the content of the second additive element is in a range of 0.1 to 10% by mass, the Y content is higher than the content of the second additive element, and the sintered body is a porous sintered body having a porosity of 3 to 50%.

[F2] The ZnO vapor deposition material described in [F1], wherein the total content of Y as a first additive element and the second additive element is in a range of 0.2 to 15% by mass.

[F3] The ZnO vapor deposition material described in [F1] or [F2], wherein the porous ZnO sintered body has pores having an average pore diameter of 0.1 to 500 μm.

[F4] The ZnO vapor deposition material described in any one of [F1] to [F3], wherein the porous ZnO sintered body is a sintered body of grains having an average crystal grain size of 1 to 500 μm.

[F5] The ZnO vapor deposition material described in any one of [F1] to [F4], wherein the porous ZnO sintered body is polycrystal or monocrystal.

In the ZnO vapor deposition material of this aspect, the porous sintered body containing ZnO as a major component (hereinafter, simply referred to as porous ZnO sintered body) contains Y as a first additive element and the second additive element at a specific ratio, so a ZnO film having high conductivity like an ITO film can be obtained by using the ZnO vapor deposition material. Specifically, the porous sintered body contains one or more elements selected from the group consisting of B, Al, Ga, and Sc as the second additive element, and the total content of Y as a first additive element and the second additive element is in a range of 0.2 to 15% by mass, so excellent effects in terms of conduction properties and spectroscopic properties are obtained.

In the ZnO vapor deposition material of this aspect, since the porous ZnO sintered body has a porosity of 3 to 50%, the specific surface area inside the vapor deposition material is large, and the evaporation speed of the vapor deposition material can be increased. Specifically, the evaporation speed can be 1.1 to 2 times higher than the conventional ZnO vapor deposition material.

In the ZnO vapor deposition material of this aspect, since the porous ZnO sintered body has pores having an average pore diameter of 0.1 to 500 µm, the evaporation speed can be increased. The porous ZnO sintered body is a sintered body of grains having an average crystal grain size of 1 to 500 µm, so the specific surface area inside the vapor deposition material increases, thereby increasing the evaporation speed of the vapor deposition material. The formed ZnO film has excellent film characteristics.

In the ZnO vapor deposition material of this aspect, the porous ZnO sintered body is polycrystal or monocrystal, and contains a predetermined amount of the two elements Y and Al at a specific ratio, so a ZnO film having high conductivity like an ITO film can be obtained.

Another aspect of the present invention provides a process for producing a ZnO vapor deposition material having the following configuration.

[F6] A process for producing a ZnO vapor deposition material, the process including the steps of (I) mixing ZnO powder having a purity equal to or greater than 98%, $Y_2O_3$ powder in such an amount that the Y content in the ZnO vapor deposition material is in a range of 0.1 to 14.9% by mass, an oxide powder of a second additive element in such an amount that the content of the second additive element in the ZnO vapor deposition material is in a range of 0.1 to 10% by mass, a binder, and an organic solvent to prepare a slurry with a concentration of 30 to 75% by mass, (II) blowing gas into the slurry to obtain a gas-containing slurry, (III) spray-drying the gas-containing slurry to obtain a porous granulation powder having an average grain size of 50 to 300 µm, (IV) molding the porous granulation powder to obtain a porous molded body, and (V) sintering the porous molded body at a predetermined temperature to obtain a porous ZnO sintered body.

[F7] The process for producing a ZnO vapor deposition material of [F6] including, instead of the steps (II) and (III), the steps of (II-2) mixing a foaming agent in raw powder or slurry to obtain a foaming agent-containing slurry, and (III-2) foaming the foaming agent-containing slurry while spray-drying the foaming agent-containing slurry to obtain a porous granulation powder having an average grain size of 50 to 300 µm.

[F8] The process for producing a ZnO vapor deposition material of [F6] including, instead of the steps (II) to (V), the steps of (II-3) mixing an additive, which will be volatized and dissolved at the time of calcination, in raw powder or slurry to obtain an additive-containing slurry, (III-3) spray-drying the additive-containing slurry to obtain a granulation powder having an average grain size of 50 to 300 µm, (IV-3) molding the granulation powder to obtain a molded body, and (V-3) sintering the molded body while volatizing and dissolving the additive to obtain a porous ZnO sintered body.

[F9] The process for producing a ZnO vapor deposition material of any one of [F6] to [F8], wherein in the step (I), ZnO powder having a purity equal to or greater than 98%, an average grain size of 10 to 500 µm, and a grain size distribution within a range of ±10% of the average grain size, $Y_2O_3$ powder, and oxide powder of the second additive element are used, and the powders, a binder, and an organic solvent are mixed to prepare a slurry with a concentration of 30 to 75% by mass.

In the process of this aspect, by the steps (I) to (V), a ZnO vapor deposition material having a large amount of evaporation, and having excellent film formation properties and denseness can be relatively easily produced. In particular, by the step (II) blowing gas into the slurry to obtain a gas-containing slurry, or (II-2) mixing a foaming agent in raw powder or slurry to obtain a foaming agent-containing slurry, a ZnO vapor deposition material having pores with predetermined porosity and average pore diameter, and an average crystal grain size can be relatively easily produced.

In the process of this aspect, since the powder having an average grain size of 10 to 500 µm and a grain size distribution within a range of ±10% of the average grain size is used, fine grains do not substantially enter between grains, and thus a porous molded body having a porosity of 3 to 50% can be easily obtained.

The present invention provides the following ZnO film and production of the same.

[F10] A ZnO film which is formed using the ZnO vapor deposition material described in any one of [F1] to [F5], or a ZnO vapor deposition material produced by the process described in any one of [F6] to [F9].

[F11] A ZnO film which is formed by an electron beam deposition method, an ion plating method, a sputtering method, or a plasma deposition method with the ZnO vapor deposition material described in any one of [F1] to [F5], or a ZnO vapor deposition material produced by the process described in any one of [F6] to [F9] as a target material.

[F12] A process for forming a ZnO film by an electron beam deposition method, an ion plating method, a sputtering method, or a plasma deposition method with the ZnO vapor deposition material described in any one of [F1] to [F5], or a ZnO vapor deposition material produced by the process described in any one of [F6] to [F9] as a target material.

The ZnO vapor deposition material of this aspect can be widely used in a vacuum deposition method, such as an electron beam deposition method, an ion plating method, a sputtering method, or a plasma deposition method. By using the ZnO vapor deposition material of this aspect, for example, when a film is formed at the same speed of film formation as the related art by an electron beam deposition method, the filament replacement frequency can be reduced, and the speed of film formation can be increased, thereby shortening the production time.

The ZnO vapor deposition material of this aspect contains Y as a first additive element and the second additive element, and the second additive element is one or more elements selected from the group consisting of B, Al, Ga, and Sc, so crystals distorted by Y having an ion radius greater than Zn are recovered and aligned by adding B, Al, or Ga having an ion radius smaller than Y, or Sc having high reactivity is added to form a film having a regulated crystal structure. Thus, a ZnO film having high permeability is formed, such that a ZnO film having excellent denseness and high durability can be formed. A film having excellent moisture resistance and gas and vapor barrier properties can be obtained.

The ZnO vapor deposition material of this aspect has porosity within a predetermined range, and preferably, pores have an average pore diameter within a specific range, and grains have an average crystal grain size within a predetermined range, so the specific surface area inside the vapor deposition material increases, thereby increasing the evaporation speed. Thus, a ZnO film having good film formation efficiency can be formed. A ZnO film formed of the ZnO vapor deposition material of this aspect is dense, and has high conductivity and excellent durability.

Another aspect of the present invention has the following configuration.

[G1] A ZnO vapor deposition material for formation of a transparent conductive film which is composed of a sintered body containing ZnO as a major component, wherein the sintered body contains a first additive element and a second additive element, the first additive element is one or more elements selected from the group consisting of Pr, Nd, Pm, and Sm, the second additive element is one or more elements selected from the group consisting of B, Al, Ga, and Sc, the content of the first additive element is in a range of 0.1 to 14.9% by mass, the content of the second additive element is in a range of 0.1 to 10% by mass, the content of the first additive element is higher than the content of the second additive element, and the sintered body is a porous sintered body having a porosity of 3 to 50%.

[G2] The ZnO vapor deposition material described in [G1], wherein the total content of the first additive element and the second additive element is in a range of 0.2 to 15% by mass.

[G3] The ZnO vapor deposition material described in [G1] or [G2], wherein the porous ZnO sintered body has pores having an average pore diameter of 0.1 to 500 μm.

[G4] The ZnO vapor deposition material described in any one of [G1] to [G3], wherein the porous ZnO sintered body is a sintered body of grains having an average crystal grain size of 1 to 500 μm.

[G5] The ZnO vapor deposition material described in any one of [G1] to [G4], wherein the porous ZnO sintered body is polycrystal or monocrystal.

In the ZnO vapor deposition material of this aspect, the porous sintered body containing ZnO as a major component (hereinafter, simply referred to as porous ZnO sintered body) contains the first additive element and the second additive element at a specific ratio, so a ZnO film having high conductivity like an ITO film can be obtained by using the ZnO vapor deposition material. Specifically, the first additive element is one or more elements selected from the group consisting of Pr, Nd, Pm, and Sm, and the total content of the first additive element and the second additive element is in a range of 0.2 to 15% by mass, so excellent effects in terms of conduction properties and spectroscopic properties are obtained.

In the ZnO vapor deposition material of this aspect, since the porous ZnO sintered body has a porosity of 3 to 50%, the specific surface area inside the vapor deposition material is large, and the evaporation speed of the vapor deposition material can be increased. Specifically, the evaporation speed can be 1.1 to 2 times higher than the conventional ZnO vapor deposition material.

In the ZnO vapor deposition material of this aspect, since the porous ZnO sintered body has pores having an average pore diameter of 0.1 to 500 μm, the evaporation speed can be increased. The porous ZnO sintered body is a sintered body of grains having an average crystal grain size of 1 to 500 μm, so the specific surface area inside the vapor deposition material increases, thereby increasing the evaporation speed of the vapor deposition material. The formed ZnO film has excellent film characteristics.

In the ZnO vapor deposition material of this aspect, the porous ZnO sintered body is polycrystal or monocrystal, and contains a predetermined amount of the two elements the first additive element and Al at a specific ratio, so a ZnO film having high conductivity like an ITO film can be obtained.

Another aspect of the present invention provides a process for producing a ZnO vapor deposition material having the following configuration.

[G6] A process for producing a ZnO vapor deposition material, the process including the steps of (I) mixing ZnO powder having a purity equal to or greater than 98%, an oxide powder of a first additive element in such an amount that the content of the first additive element in the ZnO vapor deposition material is in a range of 0.1 to 14.9% by mass, an oxide powder of a second additive element in such an amount that the content of the second additive element in the ZnO vapor deposition material is in a range of 0.1 to 10% by mass, a binder, and an organic solvent to prepare a slurry with a concentration of 30 to 75% by mass, (II) blowing gas into the slurry to obtain a gas-containing slurry, (III) spray-drying the gas-containing slurry to obtain a porous granulation powder having an average grain size of 50 to 300 μm, (IV) molding the porous granulation powder to obtain a porous molded body, and (V) sintering the porous molded body at a predetermined temperature to obtain a porous ZnO sintered body.

[G7] The process for producing a ZnO vapor deposition material of [G6] including, instead of the steps (II) and (III), the steps of (II-2) mixing a foaming agent in raw powder or slurry to obtain a foaming agent-containing slurry, and (III-2) foaming the foaming agent-containing slurry while spray-drying the foaming agent-containing slurry to obtain a porous granulation powder having an average grain size of 50 to 300 μm.

[G8] The process for producing a ZnO vapor deposition material of [G6] including, instead of the steps (II) to (V), the steps of (II-3) mixing an additive, which will be volatized and dissolved at the time of calcination, in raw powder or slurry to obtain an additive-containing slurry, (III-3) spray-drying the additive-containing slurry to obtain a granulation powder having an average grain size of 50 to 300 μm, (IV-3) molding the granulation powder to obtain a molded body, and (V-3) sintering the molded body while volatizing and dissolving the additive to obtain a porous ZnO sintered body.

[G9] The process for producing a ZnO vapor deposition material of any one of [G6] to [G8], wherein in the step (I), ZnO powder having a purity equal to or greater than 98%, an average grain size of 10 to 500 μm, and a grain size distribution within a range of ±10% of the average grain size, and oxide powder of the first additive element and the second additive element are used, and the powders, a binder, and an organic solvent are mixed to prepare a slurry with a concentration of 30 to 75% by mass.

In the process of this aspect, by the steps (I) to (V), a ZnO vapor deposition material having a large amount of evaporation, and having excellent film formation properties and denseness can be relatively easily produced. In particular, by the step (II) blowing gas into the slurry to obtain a gas-containing slurry, or (II-2) mixing a foaming agent in raw powder or slurry to obtain a foaming agent-containing slurry, a ZnO vapor deposition material having pores with predetermined porosity and average pore diameter, and an average crystal grain size can be relatively easily produced.

In the process of this aspect, since the powder having an average grain size of 10 to 500 μm and a grain size distribution within a range of ±10% of the average grain size is used, fine grains do not substantially enter between grains, and thus a porous molded body having a porosity of 3 to 50% can be easily obtained.

The present invention provides the following ZnO film and production of the same.

[G10] A ZnO film which is formed using the ZnO vapor deposition material described in any one of [G1] to [G5], or a ZnO vapor deposition material produced by the process described in any one of [G6] to [G9].

[G11] A ZnO film which is formed by an electron beam deposition method, an ion plating method, a sputtering method, or a plasma deposition method with the ZnO vapor deposition material described in any one of [G1] to [G5], or a ZnO vapor deposition material produced by the process described in any one of [G6] to [G9] as a target material.

[G12] A process for forming a ZnO film by an electron beam deposition method, an ion plating method, a sputtering method, or a plasma deposition method with the ZnO vapor deposition material described in any one of [G1] to [G5], or a ZnO vapor deposition material produced by the process described in any one of [G6] to [G9] as a target material.

The ZnO vapor deposition material of this aspect can be widely used in a vacuum deposition method, such as an electron beam deposition method, an ion plating method, a sputtering method, or a plasma deposition method. By using the ZnO vapor deposition material of this aspect, for example, when a film is formed at the same speed of film formation as the related art by an electron beam deposition method, the filament replacement frequency can be reduced, and the speed of film formation can be increased, thereby shortening the production time.

The ZnO vapor deposition material of this aspect contains the first additive element and the second additive element, the first additive element is one or more elements selected from the group consisting of Pr, Nd, Pm, and Sm, and the second additive element is one or more elements selected from the group consisting of B, Al, Ga, and Sc, so crystals distorted by the first additive element having an ion radius greater than Zn are recovered and aligned by adding B, Al, or Ga, which is the second additive element having an ion radius smaller than the first additive element, or Sc having high reactivity is added to form a film having a regulated crystal structure. Thus, a ZnO film having high permeability is formed, such that a ZnO film having excellent denseness and high durability can be formed. A film having excellent moisture resistance and gas and vapor barrier properties can be obtained.

The ZnO vapor deposition material of this aspect has porosity within a predetermined range, and preferably, pores have an average pore diameter within a specific range, and grains have an average crystal grain size within a predetermined range, so the specific surface area inside the vapor deposition material increases, thereby increasing the evaporation speed. Thus, a ZnO film having good film formation efficiency can be formed. A ZnO film formed of the ZnO vapor deposition material of this aspect is dense, and has high conductivity and excellent durability.

Another aspect of the present invention has the following configuration.

[H1] A ZnO vapor deposition material for formation of a transparent conductive film which is composed of a ZnO sintered body having a ZnO purity equal to or greater than 98%, wherein the sintered body contains one or more additive elements selected from the group consisting of Y, La, Sc, Ce, Pr, Nd, Pm, and Sm, and the sintered body is a porous sintered body having a porosity of 3 to 50%.

[H2] The ZnO vapor deposition material described in [H1], wherein the content of the additive elements in the ZnO sintered body is in a range of 2 to 20% by mass.

[H3] The ZnO vapor deposition material described in [H1] or [H2], wherein the porous ZnO sintered body has pores having an average pore diameter of 0.1 to 500 µm.

[H4] The ZnO vapor deposition material described in any one of [H1] to [H3], wherein the porous ZnO sintered body is a sintered body of grains having an average crystal grain size of 1 to 500 µm.

[H5] The ZnO vapor deposition material described in any one of [H1] to [H4], wherein the porous ZnO sintered body is polycrystal or monocrystal.

The ZnO vapor deposition material of this aspect is composed of a ZnO sintered body having a ZnO purity equal to or greater than 98%, and the sintered body contains one or more additive elements selected from the group consisting of Y, La, Sc, Ce, Pr, Nd, Pm, and Sm, so a ZnO film having good conductivity over a wide temperature range can be obtained by using the ZnO vapor deposition material.

In the ZnO vapor deposition material of this aspect, since the porous ZnO sintered body has a porosity of 3 to 50%, the specific surface area inside the vapor deposition material is large, and the evaporation speed of the vapor deposition material can be increased. Specifically, the evaporation speed can be 1.1 to 2 times higher than the conventional ZnO vapor deposition material.

In the ZnO vapor deposition material of this aspect, since the porous ZnO sintered body has pores having an average pore diameter of 0.1 to 500 µm, the evaporation speed can be increased. The porous ZnO sintered body is a sintered body of grains having an average crystal grain size of 1 to 500 µm, so the specific surface area inside the vapor deposition material increases, thereby increasing the evaporation speed of the vapor deposition material. The formed ZnO film has excellent film characteristics.

In the ZnO vapor deposition material of this aspect, the porous ZnO sintered body is polycrystal or monocrystal, and contains a predetermined amount of the two elements the first additive element and Al at a specific ratio, so a ZnO film having high conductivity like an ITO film can be obtained.

Another aspect of the present invention provides a process for producing a ZnO vapor deposition material having the following configuration.

[H6] A process for producing a ZnO vapor deposition material, the process including the steps of (I) mixing ZnO powder having a purity equal to or greater than 98%, an oxide powder of additive elements, a binder, and an organic solvent to prepare a slurry with a concentration of 30 to 75% by mass, (II) blowing gas into the slurry to obtain a gas-containing slurry, (III) spray-drying the gas-containing slurry to obtain a porous granulation powder having an average grain size of 50 to 300 µm, (IV) molding the porous granulation powder to obtain a porous molded body, and (V) sintering the porous molded body at a predetermined temperature to obtain a porous ZnO sintered body.

[H7] The process for producing a ZnO vapor deposition material of [H6] including, instead of the steps (II) and (III), the steps of (II-2) mixing a foaming agent in raw powder or slurry to obtain a foaming agent-containing slurry, and (III-2) foaming the foaming agent-containing slurry while spray-drying the foaming agent-containing slurry to obtain a porous granulation powder having an average grain size of 50 to 300 µm.

[H8] The process for producing a ZnO vapor deposition material of [H6] including, instead of the steps (II) to (V), the steps of (II-3) mixing an additive, which will be volatized and dissolved at the time of calcination, in raw powder or slurry to obtain an additive-containing slurry, (III-3) spray-drying the additive-containing slurry to obtain a granulation powder having an average grain size of 50 to 300 μm, (IV-3) molding the granulation powder to obtain a molded body, and (V-3) sintering the molded body while volatizing and dissolving the additive to obtain a porous ZnO sintered body.

[H9] The process for producing a ZnO vapor deposition material of any one of [H6] to [H8], wherein in the step (I), ZnO powder having a purity equal to or greater than 98%, an average grain size of 10 to 500 μm, and a grain size distribution within a range of ±10% of the average grain size, and oxide powder of the additive element are used, and the powders, a binder, and an organic solvent are mixed to prepare a slurry with a concentration of 30 to 75% by mass.

In the process of this aspect, by the steps (I) to (V), a ZnO vapor deposition material having a large amount of evaporation, and having excellent film formation properties and denseness can be relatively easily produced. In particular, by the step (II) blowing gas into the slurry to obtain a gas-containing slurry, or (II-2) mixing a foaming agent in raw powder or slurry to obtain a foaming agent-containing slurry, a ZnO vapor deposition material having pores with predetermined porosity and average pore diameter, and an average crystal grain size can be relatively easily produced.

In the process of this aspect, since the powder having an average grain size of 10 to 500 μm and a grain size distribution within a range of ±10% of the average grain size is used, fine grains do not substantially enter between grains, and thus a porous molded body having a porosity of 3 to 50% can be easily obtained.

The present invention provides the following ZnO film and production of the same.

[H10] A ZnO film which is formed using the ZnO vapor deposition material described in any one of [H1] to [H5], or a ZnO vapor deposition material produced by the process described in any one of [H6] to [H9].

[H11] A ZnO film which is formed by an electron beam deposition method, an ion plating method, a sputtering method, or a plasma deposition method with the ZnO vapor deposition material described in any one of [H1] to [H5], or a ZnO vapor deposition material produced by the process described in any one of [H6] to [H9] as a target material.

[H12] A process for forming a ZnO film by an electron beam deposition method, an ion plating method, a sputtering method, or a plasma deposition method with the ZnO vapor deposition material described in any one of [H1] to [H5], or a ZnO vapor deposition material produced by the process described in any one of [H6] to [H9] as a target material.

The ZnO vapor deposition material of this aspect can be widely used in a vacuum deposition method, such as an electron beam deposition method, an ion plating method, a sputtering method, or a plasma deposition method. By using the ZnO vapor deposition material of this aspect, for example, when a film is formed at the same speed of film formation as the related art by an electron beam deposition method, the filament replacement frequency can be reduced, and the speed of film formation can be increased, thereby shortening the production time.

The ZnO vapor deposition material of this aspect is composed of the ZnO sintered body having a ZnO purity equal to or greater than 98%, and the sintered body contains one or more additive elements selected from the group consisting of Y, La, Sc, Ce, Pr, Nd, Pm, and Sm, so a ZnO film having good conductivity over a wide temperature range can be obtained by using the ZnO vapor deposition material.

In the ZnO vapor deposition material of this aspect, since the ZnO sintered body contains the additive element(s), regardless of polycrystal or monocrystal, a ZnO film having good conductivity over a wide temperature range can be obtained. Further, a film having excellent moisture resistance, and gas and vapor barrier properties can be obtained.

The ZnO vapor deposition material of this aspect has porosity within a predetermined range, and preferably, pores have an average pore diameter within a specific range, and grains have an average crystal grain size within a predetermined range, so the specific surface area inside the vapor deposition material increases, thereby increasing the evaporation speed. Thus, a ZnO film having good film formation efficiency can be formed. A ZnO film formed of the ZnO vapor deposition material of this aspect is dense, and has high conductivity and excellent durability.

Advantageous Effects

According to the present invention, a ZnO film having high permeability, excellent denseness, and high durability can be formed. Further, a film having excellent moisture resistance, and gas and vapor barrier properties can be obtained.

BEST MODE FOR CARRYING OUT THE INVENTION

Hereinafter, an aspect of the present invention will be described specifically.

[ZnO Vapor Deposition Material]

A ZnO vapor deposition material of this aspect is a ZnO vapor deposition material for formation of a transparent conductive film which is composed mainly of a porous ZnO sintered body containing Ce and Al, wherein the Ce content is higher than the Al content, the Ce content is in a range of 0.1 to 14.9% by mass, the Al content is in a range of 0.1 to 10% by mass, and the sintered body has a porosity of 3 to 50%.

The inventors have investigated in detail the effect on conductivity due to additive species and its content in a ZnO vapor deposition material and a ZnO film formed by using the vapor deposition material, and have found that there is a significant level of influence due to the content ratio of the two elements of Ce and Al as the additive elements in the porous ZnO sintered body. Based on the above-described knowledge, the ZnO vapor deposition material according to this aspect contains ZnO as a major component, and also contains both elements of Ce and Al, such that excess electrons contributing to conduction are developed in large amounts and maintained, thereby forming a ZnO film having high conductivity.

As the ratio of the two elements of Ce and Al in the porous ZnO sintered body increases within a predetermined range, the conductivity of the ZnO film becomes better, and if the ratio is outside the range, the conductivity adversely deteriorates. Specifically, the Ce content in the ZnO vapor deposition material is appropriately in a range of 0.1 to 14.9% by mass, and preferably, in a range of 3 to 6% by mass. If the Ce content is lower than the lower limit value, 0.1% by mass, the conductivity is significantly lowered. If the Ce content exceeds the upper limit value, 14.9% by mass, the permeability is significantly lowered.

The Al content in the ZnO vapor deposition material is appropriately in a range of 0.1 to 10% by mass, and preferably, in a range of 1 to 3% by mass. If the Al content is lower than the lower limit value, 0.1% by mass, the conductivity is significantly lowered. If the Al content exceeds the upper limit value, 10% by mass, compositional shift at the time of deposition occurs.

The ZnO vapor deposition material of this aspect contains a larger amount of Ce than Al, such that a dense crystal structure is maintained. If the Ce content is lower than the Al content, the conductivity and permeability are lowered. The total content of Ce and Al is preferably in a range of 0.2 to 15% by mass. If the total content of Ce and Al exceeds this range, the specific resistance and permeability of the ZnO vapor deposition material are significantly lowered.

When a very small amount of Ce and Al is contained in the ZnO vapor deposition material, Ce and Al do not exist as granular precipitates in grain boundaries or grains in the ZnO matrix but are uniformly dispersed in the ZnO vapor deposition material. It is considered that, in the ZnO vapor deposition material, Ce is present as an oxide, such as $CeO_2$ or $Ce_2O_3$, and Al is present as $Al_2O_3$.

The ZnO vapor deposition material of this aspect contains Ce, which is a trivalent or quadrivalent rare earth element, as an additive element, and Ce causes excess carrier electrons to be generated with respect to divalent Zn, such that high conductivity can be ensured. When a rare earth element is added to the ZnO vapor deposition material, compositional shift at the time of deposition is unlikely to occur, and a desired composition ratio can be maintained when a film is formed.

According to the ZnO vapor deposition material of this aspect, the conductivity is obtained by oxygen defect as well as compulsive injection of carrier electrons. Usually, oxygen gas is introduced in a vapor deposition method, but generally oxygen in the film composition is insufficient. At the time of transparent conductive film formation, a technique is conventionally used in which resistance is lowered by generating oxygen defect. However, in the case of adding a rare earth element, it is easy to control because the element is excellent in evaporation performance. In addition to this advantage, since the ZnO vapor deposition material of this aspect contains Al as an additive element, high conductivity like ITO can be obtained.

The ZnO vapor deposition material of this aspect is composed of a porous ZnO sintered body having a porosity of 3 to 50%. The porosity of the sintered body is appropriately in a range of 3 to 50%, preferably in a range of 5 to 30%, more preferably in a range of 10 to 30%, and still more preferably in a range of 20 to 30%. If the porosity is smaller than 3%, it is not preferable since, at the time of film formation by an electron beam deposition method or an ion plating method, the evaporation speed of the vapor deposition material does not increase, and as a result, the speed of film formation decreases, which results in an increase in manufacturing costs. If the porosity exceeds 50%, the strength of the porous sintered body is lowered, and it is difficult to obtain sufficient mechanical strength. If the porosity is equal to or greater than 10%, the evaporation speed can be improved. Further, if the porosity is equal to or greater than 20%, a vapor deposition material having an evaporation speed about 2.0 times higher than the conventional ZnO vapor deposition material can be obtained.

In the porous ZnO sintered body of this aspect, the pores preferably have an average pore diameter of 0.1 to 500 µm. If the average pore diameter of the pores is within the above-described range, the evaporation speed can be further increased. If the pore diameter is smaller than 0.1 µm, there is no merit in the pores. If the pore diameter exceeds 500 µm, it is not preferable because the strength of the sintered body is lowered, which causes damages due to EB (electron beam) irradiation, that is, splash.

The term "pore diameter" (the inner diameter of the pore) refers to, for example, the maximum value of the internal dimensions in the pores when the sectional portion of the vapor deposition material is observed by observation means, such as SEM or the like. As the evaluation method of the pores, measurement of porosity by a substitution method, measurement of porosity by microscopy, measurement of surface area and micropore distribution by gas absorption, measurement of surface area and micropore distribution by a mercury intrusion method, measurement of surface area by a gas permeation method, or measurement of micropore distribution by an X-ray small-angle scattering method may be used.

The pores are preferably rounded, and in terms of improvement in the evaporation speed, micropores are preferably formed at the surface of the pores. For the evaluation method of the pores, the surface area is preferably in a range of 5 to 40 $m^2/g$, and at least one peak of the micropore distribution is present within a range of 1 to 100 µm. Portions (frame portion) other than the pores are preferably substantially sintered. For example, the frame portion of the porous sintered body preferably has a density equal to or greater than 98%.

In the porous ZnO sintered body of this aspect, it is preferable that grains preferably have an average crystal grain size of 1 to 500 µm, and rounded pores of about 0.1 to 500 µm are provided in the sintered body. The porous ZnO sintered body has a fine crystal structure in which the average crystal grain size is within the above-described range, and the occurrence of defects in the boundary of crystal grains can be reduced. Thus, the formed ZnO film has excellent film characteristics, such as ZnO film density, thickness distribution, refractive index, sputtering resistance, discharge characteristics (discharge voltage, discharge responsiveness, and the like), insulation characteristics, and the like. If the average crystal grain size is smaller than 1 µm, the speed of film formation is lowered. If the average crystal grain size exceeds 500 µm, the deposition rate of the additive element is not uniform. The average crystal grain size is preferably in a range of 5 to 40 µm, and more preferably, in a range of 10 to 30 µm.

The ZnO vapor deposition material of this aspect is preferably molded in the form of disc-like or circular pellets. When the vapor deposition material has a circular shape, the diameter of the vapor deposition material is appropriately in a range of 5 to 30 mm, and preferably, in a range of 5 to 15 mm. This is because, if the diameter is excessively small and smaller than 5 mm, splash occurs, and if the diameter exceeds 30 mm, it is difficult to handle the vapor deposition material in an actual production process. When the vapor deposition material is disc-like, the diameter of the vapor deposition material is appropriately in a range of 5 to 20 mm, and preferably, in a range of 5 to 10 mm. The height of the vapor deposition material is in a range of 1 to 10 mm, and preferably, in a range of 2 to 5 mm. This is because, if the diameter is excessively small and smaller than 5 mm or the height is excessively small and smaller than 1 mm, splash occurs, and if the diameter exceeds 30 mm or the height exceeds 10 mm, it is difficult to handle the vapor deposition material in an actual production process.

Hereinafter, a process for producing a ZnO vapor deposition material according to this aspect will be described.

[Production Process]

The ZnO vapor deposition material according to this aspect can be produced by mixing ZnO powder having a purity equal to or greater than 98%, $CeO_2$ powder in such an amount that the Ce content in the ZnO vapor deposition material is in a range of 0.1 to 14.9% by mass, $Al_2O_3$ powder in such an amount that the Al content in the ZnO vapor deposition material is in a range of 0.1 to 10% by mass, a binder, and an organic solvent to prepare a slurry with a concentration of 30 to 75% by mass, spray-drying the slurry to obtain a granulation powder having an average grain size of 50 to 300 μm, molding the granulation powder to obtain a porous molded body, and sintering the molded body at a predetermined temperature to obtain a porous ZnO sintered body.

The ZnO powder preferably has purity equal to or greater than 98%, and more preferably, equal to or greater than 98.4%. If the ZnO powder has purity equal to or greater than 98%, reduction of conductivity by the effect of impurities can be suppressed. The average grain size of the ZnO powder is in a range of 0.1 to 10 μm. When the average grain size of the ZnO powder is smaller than 0.1 μm, the powder is excessively fine and aggregated, so there is a tendency that the handling of the powder becomes worse, and it is difficult to prepare a high-concentration slurry. When the average grain size exceeds 10 μm, there is a tendency that it is difficult to control the micro-structure, and a dense pellet is hard to obtain. If the average grain size of the ZnO powder is adjusted to the above-described range, a desired sintered body is also obtained without using a sintering auxiliary agent.

With regard to the $CeO_2$ powder, considering the prevention of maldistribution of the Ce powder, reactivity with the ZnO matrix, and the purity of the Ce compound, it is preferable to add cerium oxide grains whose primary grain size is of a nanometer scale. The $Al_2O_3$ powder preferably has an average grain size of 0.01 to 1 μm, and still more preferably, the average grain size is in a range of 0.05 to 0.5 μm. If the $Al_2O_3$ powder having this average grain size is used, it is beneficial in terms of the uniform dispersion of the $CeO_2$ powder.

For a binder, polyethylene glycol, polyvinyl butyral, or the like may be used. It is preferable to add the binder at 0.2 to 2.5% by mass. For an organic solvent, ethanol, propanol, or the like may be used.

The raw powder, the binder, and the organic solvent are mixed to prepare a slurry with a concentration of 30 to 75% by mass, and preferably, 40 to 65% by mass. If the slurry concentration exceeds 75% by mass, since the slurry is a non-aqueous system, stable granulation is difficult. If the slurry concentration is less than 30% by mass, it is difficult to obtain a dense ZnO sintered body having a uniform composition. If the slurry concentration is adjusted within the above-described range, the viscosity of the slurry is in a range of 200 to 1000 cps. Therefore, powder granulation using a spray drier can be performed stably. Further, the density of a molded body increases, such that a dense sintered body can be obtained.

Wet blending of raw powder, a binder, and an organic solvent, and in particular, wet blending of raw powder and an organic solvent as a dispersion medium is preferably performed by a wet ball mill or a stirring mill. In the case of using a $ZrO_2$ ball in the wet ball mill, wet blending is preferably performed using a large number of $ZrO_2$ balls having a diameter of 5 to 10 mm for 8 to 24 hours, and preferably, for 20 to 24 hours. If the diameter of the $ZrO_2$ ball is smaller than 5 mm, blending may be insufficient. If the diameter of the $ZrO_2$ ball exceeds 10 mm, impurities are increased. Even though the blending time is long, up to 24 hours, impurities are hardly generated due to milling. On the other hand, when a resin ball with a metal support is used in the wet ball mill, a ball having a diameter of 10 to 15 mm is preferably used.

In the stirring mill, wet blending is preferably performed using a $ZrO_2$ ball having a diameter of 1 to 3 mm for 0.5 to 1 hour. If the diameter of the $ZrO_2$ ball is smaller than 1 mm, blending is insufficient. If the diameter exceeds 3 mm, impurities are increased. If the blending time exceeds 1 hour, while raw materials are mixed, milling leads to the generation of impurities. Sufficient blending can be done within 1 hour. Blending/granulation of powder and additives may be performed by a general tumbling granulation method. In this case, it is not necessary to perform a separation operation from the balls or the like after the process, and thus the process is simplified.

In the production process of this aspect, as a first step for obtaining a porous sintered body, gas is blown and mixed into the slurry to prepare a gas-containing slurry. Gas blowing and mixing is preferably performed by blowing using a mechanical pump, gas pressure, or the like. As the gas, air, an insoluble gas, a non-aqueous gas, or the like may be used.

The gas-containing slurry is spray-dried. The spray drying is preferably performed at 150 to 250° C. for 3 hours by using a spray drier. Since gas is blown into the slurry, the granulation powder obtained by spray-drying the slurry is porous. Through the spray drying, a porous granulation powder having an average grain size of 50 to 300 μm can be obtained.

In the production process of this aspect, as a second step for obtaining a porous sintered body, a slurry is prepared in which a foaming agent is mixed. For the foaming agent, an organic foaming agent or an inorganic foaming agent may be used. For the organic foaming agent, azodicarboxylamide, dinitrosobenta methylene tetramine, or the like is used, and for the inorganic foaming agent, carbonate or the like is used. The foaming agent may be mixed with ZnO powder, $CeO_2$ powder, and $Al_2O_3$ powder, or may be added upon slurry preparation.

The foaming agent-containing slurry is spray-dried. The spray drying is preferably performed at 150 to 250° C. for 3 hours by using a spray drier. The foaming agent contained in the slurry is foamed and dissolved upon this spray drying, such that resultant granulation powder is made porous. Through the spray drying, a porous granulation powder having an average grain size of 50 to 300 μm can be obtained.

In the production process of this aspect, as a third step for obtaining a porous sintered body, a slurry is prepared in which an additive, which will be volatized and dissolved upon sintering, is mixed. Examples of the additive include butyral capable of being dissolved in a solvent, and a cellulose-based additive, a polyvinyl-based additive, a polyester-based additive, a polyethylene-based additive, and the like capable of being dissolved in an alcohol-based solvent. Examples of the additive which will not be dissolved in the alcohol-based solvent include a starch-based additive and a polystyrene-based additive having an average grain size of about several μm to 500 μm. It is preferable that butyral is mixed in the slurry at about 20% by mass, or starch is mixed in the slurry at about 20% by mass.

If the slurry contains the additive, the additive is volatized and dissolved upon sintering to form pores, thereby obtaining a porous sintered body. The diameter and shape of the pores can be controlled by adjusting the kind and amount of the additive. For example, when a butyral-based additive is used, pores having a pore diameter of 0.1 μm to 10 μm order can be formed. When starch is used, pores having the same pore diameter as the grain size of starch and the same shape as starch can be formed. Thus, when starch is used, the pore diameter and shape of the pores can be more easily controlled.

Specifically, in the case of the ZnO vapor deposition material of this aspect, a vapor deposition material using a butyral-based additive can obtain a deposition speed about 1.3 times higher than the evaporation speed of the conventional ZnO vapor deposition material having relative density equal to or greater than about 98%, and a vapor deposition material using starch having an average grain size of 0.1 to 500 μm can obtain an evaporation speed about two times higher than the evaporation speed of the conventional ZnO vapor deposition material having relative density equal to or greater than about 98%. Therefore, a high speed of film formation can be obtained.

In the production process of this aspect, as a fourth step for obtaining a porous sintered body, a slurry using ZnO powder having a grain size distribution within a predetermined range is prepared. Specifically, ZnO powder having an average grain size of 10 to 500 μm and a grain size distribution within a range of ±10% of the average grain size is used. If the grain size distribution of ZnO powder is outside the range of ±10% of the average grain size, the porosity is lowered. More preferably, the grain size distribution is within a range of ±5% of the average grain size. The preferred grain size of $CeO_2$ powder and $Al_2O_3$ powder is significantly smaller than that of ZnO powder, and the usage is smaller than that of ZnO powder, so $CeO_2$ powder and $Al_2O_3$ powder may be outside the limitation of the grain size distribution.

The slurry using ZnO powder with a controlled grain size distribution is spray-dried. The spray drying is preferably performed at 150 to 250° C. for 3 hours by using a spray drier. In the slurry to be spray-dried, ZnO powder having an average grain size of 10 to 500 μm and a grain size distribution within a range of ±10% of the average grain size is used, and no fine ZnO powder is substantially contained. Thus, there are no cases where fine ZnO grains fill the gaps between ZnO grains, so the gaps between ZnO grains remain as pores, and granulation powder becomes porous. Through the spray drying, a porous granulation powder having an average grain size of 50 to 300 μm can be obtained.

After the slurry is spray-dried to obtain a granulation powder having an average grain size of 50 to 300 μm, the granulation powder is molded under a predetermined pressure. If the average grain size of the granulation powder is smaller than 50 μm, moldability deteriorates, and if the average grain size is larger than 300 μm, the density of the molded body is lowered, and the strength is likely to be insufficient.

For a pressing molding device, a uniaxial press device, a cold isostatic press (CIP) molding device, or other devices may be used. The molding pressure is appropriately in a range of 100 to 2000 kgf/cm$^2$ (9.8 to 196 MPa), and preferably, 100 to 1000 kgf/cm$^2$ (9.8 to 98 MPa). Molding is performed under pressure within the above-described range, such that the density of the molded body can be increased, deformation after sintering can be suppressed, and postprocessing is not required.

Next, the molded body is sintered. Before sintering, the molded body is preferably degreased at a temperature of 350 to 620° C. Through this degreasing, spots on the molded body after sintering can be suppressed. The degreasing is preferably performed for a sufficient time.

Sintering is performed in an atmosphere of air, an inactive gas, a vacuum, or a reductive gas at a temperature equal to or higher than 1000° C., and preferably, at a temperature of 1200 to 1400° C. for 1 to 10 hours, and preferably, for 2 to 5 hours. The sintering is performed under air pressure, but in the case of pressure sintering, such as hot press (HP) sintering or hot isostatic press (HIP) sintering, the sintering is preferably performed in an atmosphere of inactive gas, vacuum, or reductive gas at a temperature equal to or higher than 1000° C. for 1 to 5 hours.

A ZnO film is formed on the surface of the substrate by a vacuum film formation method with a ZnO vapor deposition material composed of the resultant porous sintered body as a target material. As the vacuum film formation method suitable for forming a film using the ZnO vapor deposition material of this aspect, an electron beam deposition method, an ion plating method, a sputtering method, or a plasma deposition method may be used. A ZnO film of this aspect formed by the film formation method uses the ZnO vapor deposition material of this aspect, so the ZnO film has high conductivity with specific resistance of 3 to $5\times10^{-4}$ Ω·cm and high permeability with visible light permeability equal to or greater than 90%, like ITO. Crystals distorted by Ce having an ion radius larger than Zn are recovered and aligned by adding Al having a small ion radius, such that the durability of the film is improved.

According to the production process of this aspect, in any of the first step of mixing gas in the slurry, the second step of preparing the foaming agent-containing slurry, the third step of preparing the slurry containing the additive which will be volatized and dissolved upon sintering, and the fourth step of preparing the slurry using ZnO powder having a grain size distribution within a predetermined range, the porosity, pore diameter, and pore shape can be easily controlled. Therefore, a vapor deposition material having optimum pores can be produced. As a result, even when a large number of pore states are required by the production conditions or the like, an optimum vapor deposition material can be provided to cope with the requirements.

The ZnO vapor deposition material of this aspect is composed mainly of a porous sintered body having a porosity of 5 to 30% and a pore diameter of 0.1 to 500 μm, so when a ZnO transparent conductive film is formed by an electron beam deposition method or an ion plating method using the ZnO vapor deposition material, the evaporation speed can be improved. That is, when film formation is performed with the same electron beam energy, the speed of film formation increases, and the operation time is shortened, thereby increasing the number of products for a predetermined time. Further, when film formation is performed at the same film formation speed, electron beam energy is reduced, and the replacement timing of a filament of an electron gun or the like is delayed, such that the number of times of maintenance is reduced and productivity is improved. As a result, manufacturing costs can be reduced.

Next, another aspect of the present invention will be described.

[ZnO Vapor Deposition Material]

A ZnO vapor deposition material of this aspect is a ZnO vapor deposition material for formation of a transparent conductive film which is composed mainly of a porous ZnO sintered body containing Ce and Ga, wherein the Ce content is higher than the Ga content, the Ce content is in a range of 0.1 to 14.9% by mass, the Ga content is in a range of 0.1 to 10% by mass, and the sintered body has a porosity of 3 to 50%.

The inventors have investigated in detail the effect on conductivity due to additive species and its content in a ZnO vapor deposition material and a ZnO film formed by using the vapor deposition material, and have found that there is a significant level of influence due to the content ratio of the two elements of Ce and Ga as the additive elements in the porous ZnO sintered body. Based on the above-described knowledge, the ZnO vapor deposition material according to this aspect contains ZnO as a major component, and also contains both elements of Ce and Ga, such that excess electrons contributing to conduction are developed in large amounts and maintained, thereby forming a ZnO film having high conductivity.

As the ratio of the two elements of Ce and Ga in the porous ZnO sintered body increases within a predetermined range, the conductivity of the ZnO film becomes better, and if the ratio is outside the range, the conductivity adversely deteriorates. Specifically, the Ce content in the ZnO vapor deposition material is appropriately in a range of 0.1 to 14.9% by mass, and preferably, in a range of 3 to 6% by mass. If the Ce content is lower than the lower limit value, 0.1% by mass, the conductivity is significantly lowered. If the Ce content exceeds the upper limit value, 14.9% by mass, the permeability is significantly lowered.

The Ga content in the ZnO vapor deposition material is appropriately in a range of 0.1 to 10% by mass, and preferably, in a range of 1 to 3% by mass. If the Ga content is lower than the lower limit value, 0.1% by mass, the conductivity is significantly lowered. If the Ga content exceeds the upper limit value, 10% by mass, compositional shift at the time of deposition occurs.

The ZnO vapor deposition material of this aspect contains a larger amount of Ce than Ga, such that a dense crystal structure is maintained. If the Ce content is lower than the Ga content, the conductivity and permeability are lowered. The total content of Ce and Ga is preferably in a range of 0.2 to 15% by mass. If the total content of Ce and Ga exceeds this range, the specific resistance and permeability of the ZnO vapor deposition material are significantly lowered.

When a very small amount of Ce and Ga is contained in the ZnO vapor deposition material, Ce and Ga do not exist as granular precipitates in grain boundaries or grains in the ZnO matrix but are uniformly dispersed in the ZnO vapor deposition material. It is considered that, in the ZnO vapor deposition material, Ce is present as an oxide, such as $CeO_2$ or $Ce_2O_3$, and Ga is present as $Ga_2O_3$.

The ZnO vapor deposition material of this aspect contains Ce, which is a trivalent or quadrivalent rare earth element, as an additive element, and Ce causes excess carrier electrons to be generated with respect to divalent Zn, such that high conductivity can be ensured. When a rare earth element is added to the ZnO vapor deposition material, compositional shift at the time of deposition is unlikely to occur, and a desired composition ratio can be maintained when a film is formed.

According to the ZnO vapor deposition material of this aspect, the conductivity is obtained by oxygen defect as well as compulsive injection of carrier electrons. Usually, oxygen gas is introduced in a vapor deposition method, but generally oxygen in the film composition is insufficient. At the time of transparent conductive film formation, a technique is conventionally used in which resistance is lowered by generating oxygen defect. However, in the case of adding a rare earth element, it is easy to control because the element is excellent in evaporation performance. In addition to this advantage, since the ZnO vapor deposition material of this aspect contains Ga as an additive element, high conductivity like ITO can be obtained.

The ZnO vapor deposition material of this aspect is composed of a porous ZnO sintered body having a porosity of 3 to 50%. The porosity of the sintered body is appropriately in a range of 3 to 50%, preferably in a range of 5 to 30%, more preferably in a range of 10 to 30%, and still more preferably in a range of 20 to 30%. If the porosity is smaller than 3%, it is not preferable since, at the time of film formation by an electron beam deposition method or an ion plating method, the evaporation speed of the vapor deposition material does not increase, and as a result, the speed of film formation decreases, which results in an increase in manufacturing costs. If the porosity exceeds 50%, the strength of the porous sintered body is lowered, and it is difficult to obtain sufficient mechanical strength. If the porosity is equal to or greater than 10%, the evaporation speed can be improved. Further, if the porosity is equal to or greater than 20%, a vapor deposition material having an evaporation speed about two times higher than the conventional ZnO vapor deposition material can be obtained.

In the porous ZnO sintered body of this aspect, the pores preferably have an average pore diameter of 0.1 to 500 µm. If the average pore diameter of the pores is within the above-described range, the evaporation speed can be further increased. If the pore diameter is smaller than 0.1 µm, there is no merit in the pores. If the pore diameter exceeds 500 µm, it is not preferable because the strength of the sintered body is lowered, which causes damages due to EB (electron beam) irradiation, that is, splash.

The term "pore diameter" (the inner diameter of the pore) refers to, for example, the maximum value of the internal dimensions in the pores when the sectional portion of the vapor deposition material is observed by observation means, such as SEM or the like. As the evaluation method of the pores, measurement of porosity by a substitution method, measurement of porosity by microscopy, measurement of surface area and micropore distribution by gas absorption, measurement of surface area and micropore distribution by a mercury intrusion method, measurement of surface area by a gas permeation method, or measurement of micropore distribution by an X-ray small-angle scattering method may be used.

The pores are preferably rounded, and in terms of improvement in the evaporation speed, micropores are preferably formed at the surface of the pores. For the evaluation method of the pores, the surface area is preferably in a range of 5 to 40 $m^2/g$, and at least one peak of the micropore distribution is present within a range of 1 to 100 µm. Portions (frame portion) other than the pores are preferably substantially sintered. For example, the frame portion of the porous sintered body preferably has a density equal to or greater than 98%.

In the porous ZnO sintered body of this aspect, it is preferable that grains preferably have an average crystal grain size of 1 to 500 µm, and rounded pores of about 0.1 to 500 µm are provided in the sintered body. The porous ZnO sintered body has a fine crystal structure in which the average crystal grain size is within the above-described range, and the occurrence of defects in the boundary of crystal grains can be reduced. Thus, the formed ZnO film has excellent film characteristics, such as ZnO film density, thickness distribution, refractive index, sputtering resistance, discharge characteristics (discharge voltage, discharge responsiveness, and the like), insulation characteristics, and the like. If the average crystal grain size is smaller than 1 µm, the speed of film formation is lowered. If the average crystal grain size exceeds 500 µm, the deposition rate of the additive element is not uniform. The average crystal grain size is preferably in a range of 5 to 40 µm, and more preferably, in a range of 10 to 30 µm.

The ZnO vapor deposition material of this aspect is preferably molded in the form of disc-like or circular pellets. When the vapor deposition material has a circular shape, the diameter of the vapor deposition material is appropriately in a range of 5 to 30 mm, and preferably, in a range of 5 to 15 mm. This is because, if the diameter is excessively small and smaller than 5 mm, splash occurs, and if the diameter exceeds 30 mm, it is difficult to handle the vapor deposition material in an actual production process. When the vapor deposition material is disc-like, the diameter of the vapor deposition material is appropriately in a range of 5 to 20 mm, and preferably, in a range of 5 to 10 mm. The height of the vapor deposition material is in a range of 1 to 10 mm, and preferably, in a range of 2 to 5 mm. This is because, if the diameter is excessively small and smaller than 5 mm or the height is excessively small and smaller than 1 mm, splash occurs, and if the diameter exceeds 30 mm or the height exceeds 10 mm, it is difficult to handle the vapor deposition material in an actual production process.

Hereinafter, a process for producing a ZnO vapor deposition material according to this aspect will be described.

[Production Process]

The ZnO vapor deposition material according to this aspect can be produced by mixing ZnO powder having a purity equal to or greater than 98%, $CeO_2$ powder in such an amount that the Ce content in the ZnO vapor deposition material is in a range of 0.1 to 14.9% by mass, $Ga_2O_3$ powder in such an amount that the Ga content in the ZnO vapor deposition material is in a range of 0.1 to 10% by mass, a binder, and an organic solvent to prepare a slurry with a concentration of 30 to 75% by mass, spray-drying the slurry to obtain a granulation powder having an average grain size of 50 to 300 μm, molding the granulation powder to obtain a porous molded body, and sintering the molded body at a predetermined temperature to obtain a porous ZnO sintered body.

The ZnO powder preferably has purity equal to or greater than 98%, more preferably, equal to or greater than 98.4%, and still more preferably, equal to or greater than 99%. If the ZnO powder has purity equal to or greater than 98%, reduction of conductivity by the effect of impurities can be suppressed. The average grain size of the ZnO powder is in a range of 0.1 to 10 μm. When the average grain size of the ZnO powder is smaller than 0.1 μm, the powder is excessively fine and aggregated, so there is a tendency that the handling of the powder becomes worse, and it is difficult to prepare a high-concentration slurry. When the average grain size exceeds 10 μm, there is a tendency that it is difficult to control the microstructure, and a dense pellet is hard to obtain. If the average grain size of the ZnO powder is adjusted to the above-described range, a desired sintered body is also obtained without using a sintering auxiliary agent.

With regard to the $CeO_2$ powder, considering the prevention of maldistribution of the Ce powder, reactivity with the ZnO matrix, and the purity of the Ce compound, it is preferable to add cerium oxide grains whose primary grain size is of a nanometer scale. The $Ga_2O_3$ powder preferably has an average grain size of 0.01 to 1 μm, and still more preferably, the average grain size is in a range of 0.05 to 0.5 μm. If the $Ga_2O_3$ powder having this average grain size is used, it is beneficial in terms of the uniform dispersion of the $CeO_2$ powder.

For a binder, polyethylene glycol, polyvinyl butyral, or the like may be used. It is preferable to add the binder at 0.2 to 2.5% by mass. For an organic solvent, ethanol, propanol, or the like may be used.

The raw powder, the binder, and the organic solvent are mixed to prepare a slurry with a concentration of 30 to 75% by mass, and preferably, 40 to 65% by mass. If the slurry concentration exceeds 75% by mass, since the slurry is a non-aqueous system, stable granulation is difficult. If the slurry concentration is less than 30% by mass, it is difficult to obtain a dense ZnO sintered body having a uniform composition. If the slurry concentration is adjusted within the above-described range, the viscosity of the slurry is in a range of 200 to 1000 cps. Therefore, powder granulation using a spray drier can be performed stably. Further, the density of a molded body increases, such that a dense sintered body can be obtained.

Wet blending of raw powder, a binder, and an organic solvent, and in particular, wet blending of raw powder and an organic solvent as a dispersion medium is preferably performed by a wet ball mill or a stirring mill. In the case of using a $ZrO_2$ ball in the wet ball mill, wet blending is preferably performed using a large number of $ZrO_2$ balls having a diameter of 5 to 10 mm for 8 to 24 hours, and preferably, for 20 to 24 hours. If the diameter of the $ZrO_2$ ball is smaller than 5 mm, blending may be insufficient. If the diameter of the $ZrO_2$ ball exceeds 10 mm, impurities are increased. Even though the blending time is long, up to 24 hours, impurities are hardly generated due to milling. On the other hand, when a resin ball with a metal support is used in the wet ball mill, a ball having a diameter of 10 to 15 mm is preferably used.

In the stirring mill, wet blending is preferably performed using a $ZrO_2$ ball having a diameter of 1 to 3 mm for 0.5 to 1 hour. If the diameter of the $ZrO_2$ ball is smaller than 1 mm, blending is insufficient. If the diameter exceeds 3 mm, impurities are increased. If the blending time exceeds 1 hour, while raw materials are mixed, milling leads to the generation of impurities. Sufficient blending can be done within 1 hour. Blending/granulation of powder and additives may be performed by a general tumbling granulation method. In this case, it is not necessary to perform a separation operation from the balls or the like after the process, and thus the process is simplified.

In the production process of this aspect, as a first step for obtaining a porous sintered body, gas is blown and mixed into the slurry to prepare a gas-containing slurry. Gas blowing and mixing is preferably performed by blowing using a mechanical pump, gas pressure, or the like. As the gas, air, an insoluble gas, a non-aqueous gas, or the like may be used.

The gas-containing slurry is spray-dried. The spray drying is preferably performed at 150 to 250° C. for 3 hours by using a spray drier. Since gas is blown into the slurry, the granulation powder obtained by spray-drying the slurry is porous. Through the spray drying, a porous granulation powder having an average grain size of 50 to 300 μm can be obtained.

In the production process of this aspect, as a second step for obtaining a porous sintered body, a slurry is prepared in which a foaming agent is mixed. For the foaming agent, an organic foaming agent or an inorganic foaming agent may be used. For the organic foaming agent, azodicarboxylamide, dinitrosobenta methylene tetramine, or the like is used, and for the inorganic foaming agent, carbonate or the like is used. The foaming agent may be mixed with ZnO powder, $CeO_2$ powder, and $Ga_2O_3$ powder, or may be added upon slurry preparation.

The foaming agent-containing slurry is spray-dried. The spray drying is preferably performed at 150 to 250° C. for 3 hours by using a spray drier. The foaming agent contained in the slurry is foamed and dissolved upon this spray drying, such that resultant granulation powder is made porous. Through the spray drying, a porous granulation powder having an average grain size of 50 to 300 μm can be obtained.

In the production process of this aspect, as a third step for obtaining a porous sintered body, a slurry is prepared in which an additive, which will be volatized and dissolved upon sintering, is mixed. Examples of the additive include butyral capable of being dissolved in a solvent, and a cellulose-based additive, a polyvinyl-based additive, a polyester-based additive, a polyethylene-based additive, and the like capable of being dissolved in an alcohol-based solvent. Examples of the additive which will not be dissolved in the alcohol-based solvent include a starch-based additive and a polystyrene-based additive having an average grain size of about several μm to 500 μm. It is preferable that butyral is mixed in the slurry at about 20% by mass, or starch is mixed in the slurry at about 20% by mass.

If the slurry contains the additive, the additive is volatized and dissolved upon sintering to form pores, thereby obtaining a porous sintered body. The diameter and shape of the pores can be controlled by adjusting the kind and amount of the additive. For example, when a butyral-based additive is used, pores having a pore diameter of 0.1 μm to 10 μm order can be formed. When starch is used, pores having the same pore diameter as the grain size of starch and the same shape as starch can be formed. Thus, when starch is used, the pore diameter and shape of the pores can be more easily controlled.

Specifically, in the case of the ZnO vapor deposition material of this aspect, a vapor deposition material using a butyral-based additive can obtain a deposition speed about 1.3 times higher than the evaporation speed of the conventional ZnO vapor deposition material having relative density equal to or greater than about 98%, and a vapor deposition material using starch having an average grain size of 0.1 to 500 μm can obtain an evaporation speed about two times higher than the evaporation speed of the conventional ZnO vapor deposition material having relative density equal to or greater than about 98%. Therefore, a high speed of film formation can be obtained.

In the production process of this aspect, as a fourth step for obtaining a porous sintered body, a slurry using ZnO powder having a grain size distribution within a predetermined range is prepared. Specifically, ZnO powder having an average grain size of 10 to 500 μm and a grain size distribution within a range of ±10% of the average grain size is used. If the grain size distribution of ZnO powder is outside the range of ±10% of the average grain size, the porosity is lowered. More preferably, the grain size distribution is within a range of ±5% of the average grain size. The preferred grain size of $CeO_2$ powder and $Ga_2O_3$ powder is significantly smaller than that of ZnO powder, and the usage is smaller than that of ZnO powder, so $CeO_2$ powder and $Ga_2O_3$ powder may be outside the limitation of the grain size distribution.

The slurry using ZnO powder with a controlled grain size distribution is spray-dried. The spray drying is preferably performed at 150 to 250° C. for 3 hours by using a spray drier. In the slurry to be spray-dried, ZnO powder having an average grain size of 10 to 500 μm and a grain size distribution within a range of ±10% of the average grain size is used, and no fine ZnO powder is substantially contained. Thus, there are no cases where fine ZnO grains fill the gaps between ZnO grains, so the gaps between ZnO grains remain as pores, and granulation powder becomes porous. Through the spray drying, a porous granulation powder having an average grain size of 50 to 300 μm can be obtained.

After the slurry is spray-dried to obtain a granulation powder having an average grain size of 50 to 300 μm, the granulation powder is molded under a predetermined pressure. If the average grain size of the granulation powder is smaller than 50 μm, moldability deteriorates, and if the average grain size is larger than 300 μm, the density of the molded body is lowered, and the strength is likely to be insufficient.

For a pressing molding device, a uniaxial press device, a cold isostatic press (CIP) molding device, or other devices may be used. The molding pressure is appropriately in a range of 100 to 2000 $kgf/cm^2$ (9.8 to 196 MPa), and preferably, 100 to 1000 $kgf/cm^2$ (9.8 to 98 MPa). Molding is performed under pressure within the above-described range, such that the density of the molded body can be increased, deformation after sintering can be suppressed, and postprocessing is not required.

Next, the molded body is sintered. Before sintering, the molded body is preferably degreased at a temperature of 350 to 620° C. Through this degreasing, spots on the molded body after sintering can be suppressed. The degreasing is preferably performed for a sufficient time.

Sintering is performed in an atmosphere of air, an inactive gas, a vacuum, or a reductive gas at a temperature equal to or higher than 1000° C., and preferably, at a temperature of 1200 to 1400° C. for 1 to 10 hours, and preferably, for 2 to 5 hours. The sintering is performed under air pressure, but in the case of pressure sintering, such as hot press (HP) sintering or hot isostatic press (HIP) sintering, the sintering is preferably performed in an atmosphere of inactive gas, vacuum, or reductive gas at a temperature equal to or higher than 1000° C. for 1 to 5 hours.

A ZnO film is formed on the surface of the substrate by a vacuum film formation method with a ZnO vapor deposition material composed of the resultant porous sintered body as a target material. As the vacuum film formation method suitable for forming a film using the ZnO vapor deposition material of this aspect, an electron beam deposition method, an ion plating method, a sputtering method, or a plasma deposition method may be used. A ZnO film of this aspect formed by the film formation method uses the ZnO vapor deposition material of this aspect, so the ZnO film has high conductivity with specific resistance of 3 to $5 \times 10^{-4}$ Ω·cm and high permeability with visible light permeability equal to or greater than 90%, like ITO. Crystals distorted by Ce having an ion radius larger than Zn are recovered and aligned by adding Ga having a small ion radius, such that the durability of the film is improved.

According to the production process of this aspect, in any of the first step of mixing gas in the slurry, the second step of preparing the foaming agent-containing slurry, the third step of preparing the slurry containing the additive which will be volatized and dissolved upon sintering, and the fourth step of preparing the slurry using ZnO powder having a grain size distribution within a predetermined range, the porosity, pore diameter, and pore shape can be easily controlled. Therefore, a vapor deposition material having optimum pores can be produced. As a result, even when a large number of pore states are required by the production conditions or the like, an optimum vapor deposition material can be provided to cope with the requirements.

The ZnO vapor deposition material of this aspect is composed mainly of a porous sintered body having a porosity of 5 to 30% and a pore diameter of 0.1 to 500 μm, so when a ZnO transparent conductive film is formed by an electron beam deposition method or an ion plating method using the ZnO vapor deposition material, the evaporation speed can be improved. That is, when film formation is performed with the same electron beam energy, the speed of film formation increases, and the operation time is shortened, thereby increasing the number of products for a predetermined time. Further, when film formation is performed at the same film formation speed, electron beam energy is reduced, and the replacement timing of a filament of an electron gun or the like is delayed, such that the number of times of maintenance is reduced and productivity is improved. As a result, manufacturing costs can be reduced.

Next, another aspect of the present invention will be described.

[ZnO Vapor Deposition Material]

A ZnO vapor deposition material of this aspect is a ZnO vapor deposition material for formation of a transparent conductive film which is composed mainly of a porous ZnO sintered body containing Ce and Sc, wherein the Ce content is higher than the Sc content, the Ce content is in a range of 0.1 to 14.9% by mass, the Sc content is in a range of 0.1 to 10% by mass, and the sintered body has a porosity of 3 to 50%.

The inventors have investigated in detail the effect on conductivity due to additive species and its content in a ZnO vapor deposition material and a ZnO film formed by using the vapor deposition material, and have found that there is a significant level of influence due to the content ratio of the two elements of Ce and Sc as the additive elements in the porous ZnO sintered body. Based on the above-described knowledge, the ZnO vapor deposition material according to this aspect contains ZnO as a major component, and also contains both elements of Ce and Sc, such that excess electrons contributing to conduction are developed in large amounts and maintained, thereby forming a ZnO film having high conductivity.

As the ratio of the two elements of Ce and Sc in the porous ZnO sintered body increases within a predetermined range, the conductivity of the ZnO film becomes better, and if the ratio is outside the range, the conductivity adversely deteriorates. Specifically, the Ce content in the ZnO vapor deposition material is appropriately in a range of 0.1 to 14.9% by mass, and preferably, in a range of 3 to 6% by mass. If the Ce content is lower than the lower limit value, 0.1% by mass, the conductivity is significantly lowered. If the Ce content exceeds the upper limit value, 14.9% by mass, the permeability is significantly lowered.

The Sc content in the ZnO vapor deposition material is appropriately in a range of 0.1 to 10% by mass, and preferably, in a range of 1 to 3% by mass. If the Sc content is lower than the lower limit value, 0.1% by mass, the conductivity is significantly lowered. If the Sc content exceeds the upper limit value, 10% by mass, compositional shift at the time of deposition occurs.

The ZnO vapor deposition material of this aspect contains a larger amount of Ce than Sc, such that a dense crystal structure is maintained. If the Ce content is lower than the Sc content, the conductivity and permeability are lowered. The total content of Ce and Sc is preferably in a range of 0.2 to 15% by mass. If the total content of Ce and Sc exceeds this range, the specific resistance and permeability of the ZnO vapor deposition material are significantly lowered.

When a very small amount of Ce and Sc is contained in the ZnO vapor deposition material, Ce and Sc do not exist as granular precipitates in grain boundaries or grains in the ZnO matrix but are uniformly dispersed in the ZnO vapor deposition material. It is considered that, in the ZnO vapor deposition material, Ce is present as an oxide, such as $CeO_2$ or $Ce_2O_3$, and Sc is present as $Sc_2O_3$.

The ZnO vapor deposition material of this aspect contains Ce, which is a trivalent or quadrivalent rare earth element, as an additive element, and Ce causes excess carrier electrons to be generated with respect to divalent Zn, such that high conductivity can be ensured. When a rare earth element is added to the ZnO vapor deposition material, compositional shift at the time of deposition is unlikely to occur, and a desired composition ratio can be maintained when a film is formed.

According to the ZnO vapor deposition material of this aspect, the conductivity is obtained by oxygen defect as well as compulsive injection of carrier electrons. Usually, oxygen gas is introduced in a vapor deposition method, but generally oxygen in the film composition is insufficient. At the time of transparent conductive film formation, a technique is conventionally used in which resistance is lowered by generating oxygen defect. However, in the case of adding a rare earth element, it is easy to control because the element is excellent in evaporation performance. In addition to this advantage, since the ZnO vapor deposition material of this aspect contains Sc as an additive element, high conductivity like ITO can be obtained.

The ZnO vapor deposition material of this aspect is composed of a porous ZnO sintered body having a porosity of 3 to 50%. The porosity of the sintered body is appropriately in a range of 3 to 50%, preferably in a range of 5 to 30%, more preferably in a range of 10 to 30%, and still more preferably in a range of 20 to 30%. If the porosity is smaller than 3%, it is not preferable since, at the time of film formation by an electron beam deposition method or an ion plating method, the evaporation speed of the vapor deposition material does not increase, and as a result, the speed of film formation decreases, which results in an increase in manufacturing costs. If the porosity exceeds 50%, the strength of the porous sintered body is lowered, and it is difficult to obtain sufficient mechanical strength. If the porosity is equal to or greater than 10%, the evaporation speed can be improved. Further, if the porosity is equal to or greater than 20%, a vapor deposition material having an evaporation speed about two times higher than the conventional ZnO vapor deposition material can be obtained.

In the porous ZnO sintered body of this aspect, the pores preferably have an average pore diameter of 0.1 to 500 µm. If the average pore diameter of the pores is within the above-described range, the evaporation speed can be further increased. If the pore diameter is smaller than 0.1 µm, there is no merit in the pores. If the pore diameter exceeds 500 µm, it is not preferable because the strength of the sintered body is lowered, which causes damages due to EB (electron beam) irradiation, that is, splash.

The term "pore diameter" (the inner diameter of the pore) refers to, for example, the maximum value of the internal dimensions in the pores when the sectional portion of the vapor deposition material is observed by observation means, such as SEM or the like. As the evaluation method of the pores, measurement of porosity by a substitution method, measurement of porosity by microscopy, measurement of surface area and micropore distribution by gas absorption, measurement of surface area and micropore distribution by a mercury intrusion method, measurement of surface area by a gas permeation method, or measurement of micropore distribution by an X-ray small-angle scattering method may be used.

The pores are preferably rounded, and in terms of improvement in the evaporation speed, micropores are preferably formed at the surface of the pores. For the evaluation method of the pores, the surface area is preferably in a range of 5 to 40 $m^2/g$, and at least one peak of the micropore distribution is present within a range of 1 to 100 µm. Portions (frame portion) other than the pores are preferably substantially sintered. For example, the frame portion of the porous sintered body preferably has a density equal to or greater than 98%.

In the porous ZnO sintered body of this aspect, it is preferable that grains preferably have an average crystal grain size of 1 to 500 µm, and rounded pores of about 0.1 to 500 µm are provided in the sintered body. The porous ZnO sintered body has a fine crystal structure in which the average crystal grain size is within the above-described range, and the occurrence of defects in the boundary of crystal grains can be reduced. Thus, the formed ZnO film has excellent film characteristics, such as ZnO film density, thickness distribution, refractive index, sputtering resistance, discharge characteristics (discharge voltage, discharge responsiveness, and the like), insulation characteristics, and the like. If the average crystal grain size is smaller than 1 µm, the speed of film formation is lowered. If the average crystal grain size exceeds 500 µm, the deposition rate of the additive element is not uniform. The average crystal grain size is preferably in a range of 5 to 40 µm, and more preferably, in a range of 10 to 30 µm.

The ZnO vapor deposition material of this aspect is preferably molded in the form of disc-like or circular pellets. When the vapor deposition material has a circular shape, the diameter of the vapor deposition material is appropriately in a range of 5 to 30 mm, and preferably, in a range of 5 to 15 mm. This is because, if the diameter is excessively small and smaller than 5 mm, splash occurs, and if the diameter exceeds 30 mm, it is difficult to handle the vapor deposition material in an actual production process. When the vapor deposition material is disc-like, the diameter of the vapor deposition material is appropriately in a range of 5 to 20 mm, and preferably, in a range of 5 to 10 mm. The height of the vapor deposition material is in a range of 1 to 10 mm, and preferably, in a range of 2 to 5 mm. This is because, if the diameter is excessively small and smaller than 5 mm or the height is excessively small and smaller than 1 mm, splash occurs, and if the diameter exceeds 30 mm or the height exceeds 10 mm, it is difficult to handle the vapor deposition material in an actual production process.

Hereinafter, a process for producing a ZnO vapor deposition material according to this aspect will be described.

[Production Process]

The ZnO vapor deposition material according to this aspect can be produced by mixing ZnO powder having a purity equal to or greater than 98%, $CeO_2$ powder in such an amount that the Ce content in the ZnO vapor deposition material is in a range of 0.1 to 14.9% by mass, $Sc_2O_3$ powder in such an amount that the Sc content in the ZnO vapor deposition material is in a range of 0.1 to 10% by mass, a binder, and an organic solvent to prepare a slurry with a concentration of 30 to 75% by mass, spray-drying the slurry to obtain a granulation powder having an average grain size of 50 to 300 μm, molding the granulation powder to obtain a porous molded body, and sintering the molded body at a predetermined temperature to obtain a porous ZnO sintered body.

The ZnO powder preferably has purity equal to or greater than 98%, more preferably, equal to or greater than 98.4%, and still more preferably, equal to or greater than 99%. If the ZnO powder has purity equal to or greater than 98%, reduction of conductivity by the effect of impurities can be suppressed. The average grain size of the ZnO powder is in a range of 0.1 to 10 μm. When the average grain size of the ZnO powder is smaller than 0.1 μm, the powder is excessively fine and aggregated, so there is a tendency that the handling of the powder becomes worse, and it is difficult to prepare a high-concentration slurry. When the average grain size exceeds 10 μm, there is a tendency that it is difficult to control the microstructure, and a dense pellet is hard to obtain. If the average grain size of the ZnO powder is adjusted to the above-described range, a desired sintered body is also obtained without using a sintering auxiliary agent.

With regard to the $CeO_2$ powder, considering the prevention of maldistribution of the Ce powder, reactivity with the ZnO matrix, and the purity of the Ce compound, it is preferable to add cerium oxide grains whose primary grain size is of a nanometer scale. The $Sc_2O_3$ powder preferably has an average grain size of 0.01 to 1 μm, and still more preferably, the average grain size is in a range of 0.05 to 0.5 μm. If the $Sc_2O_3$ powder having this average grain size is used, it is beneficial in terms of the uniform dispersion of the $CeO_2$ powder.

For a binder, polyethylene glycol, polyvinyl butyral, or the like may be used. It is preferable to add the binder at 0.2 to 2.5% by mass. For an organic solvent, ethanol, propanol, or the like may be used.

The raw powder, the binder, and the organic solvent are mixed to prepare a slurry with a concentration of 30 to 75% by mass, and preferably, 40 to 65% by mass. If the slurry concentration exceeds 75% by mass, since the slurry is a non-aqueous system, stable granulation is difficult. If the slurry concentration is less than 30% by mass, it is difficult to obtain a dense ZnO sintered body having a uniform composition. If the slurry concentration is adjusted within the above-described range, the viscosity of the slurry is in a range of 200 to 1000 cps. Therefore, powder granulation using a spray drier can be performed stably. Further, the density of a molded body increases, such that a dense sintered body can be obtained.

Wet blending of raw powder, a binder, and an organic solvent, and in particular, wet blending of raw powder and an organic solvent as a dispersion medium is preferably performed by a wet ball mill or a stirring mill. In the case of using a $ZrO_2$ ball in the wet ball mill, wet blending is preferably performed using a large number of $ZrO_2$ balls having a diameter of 5 to 10 mm for 8 to 24 hours, and preferably, for 20 to 24 hours. If the diameter of the $ZrO_2$ ball is smaller than 5 mm, blending may be insufficient. If the diameter of the $ZrO_2$ ball exceeds 10 mm, impurities are increased. Even though the blending time is long, up to 24 hours, impurities are hardly generated due to milling. On the other hand, when a resin ball with a metal support is used in the wet ball mill, a ball having a diameter of 10 to 15 mm is preferably used.

In the stirring mill, wet blending is preferably performed using a $ZrO_2$ ball having a diameter of 1 to 3 mm for 0.5 to 1 hour. If the diameter of the $ZrO_2$, ball is smaller than 1 mm, blending is insufficient. If the diameter exceeds 3 mm, impurities are increased. If the blending time exceeds 1 hour, while raw materials are mixed, milling leads to the generation of impurities. Sufficient blending can be done within 1 hour. Blending/granulation of powder and additives may be performed by a general tumbling granulation method. In this case, it is not necessary to perform a separation operation from the balls or the like after the process, and thus the process is simplified.

In the production process of this aspect, as a first step for obtaining a porous sintered body, gas is blown and mixed into the slurry to prepare a gas-containing slurry. Gas blowing and mixing is preferably performed by blowing using a mechanical pump, gas pressure, or the like. As the gas, air, an insoluble gas, a non-aqueous gas, or the like may be used.

The gas-containing slurry is spray-dried. The spray drying is preferably performed at 150 to 250° C. for 3 hours by using a spray drier. Since gas is blown into the slurry, the granulation powder obtained by spray-drying the slurry is porous. Through the spray drying, a porous granulation powder having an average grain size of 50 to 300 μm can be obtained.

In the production process of this aspect, as a second step for obtaining a porous sintered body, a slurry is prepared in which a foaming agent is mixed. For the foaming agent, an organic foaming agent or an inorganic foaming agent may be used. For the organic foaming agent, azodicarboxylamide, dinitrosobenta methylene tetramine, or the like is used, and for the inorganic foaming agent, carbonate or the like is used. The foaming agent may be mixed with ZnO powder, $CeO_2$ powder, and $Sc_2O_3$ powder, or may be added upon slurry preparation.

The foaming agent-containing slurry is spray-dried. The spray drying is preferably performed at 150 to 250° C. for 3 hours by using a spray drier. The foaming agent contained in the slurry is foamed and dissolved upon this spray drying, such that resultant granulation powder is made porous. Through the spray drying, a porous granulation powder having an average grain size of 50 to 300 μm can be obtained.

In the production process of this aspect, as a third step for obtaining a porous sintered body, a slurry is prepared in which an additive, which will be volatized and dissolved upon sintering, is mixed. Examples of the additive include butyral capable of being dissolved in a solvent, and a cellulose-based additive, a polyvinyl-based additive, a polyester-based additive, a polyethylene-based additive, and the like capable of being dissolved in an alcohol-based solvent. Examples of the additive which will not be dissolved in the alcohol-based solvent include a starch-based additive and a polystyrene-based additive having an average grain size of about several μm to 500 μm. It is preferable that butyral is mixed in the slurry at about 20% by mass, or starch is mixed in the slurry at about 20% by mass.

If the slurry contains the additive, the additive is volatized and dissolved upon sintering to form pores, thereby obtaining a porous sintered body. The diameter and shape of the pores can be controlled by adjusting the kind and amount of the additive. For example, when a butyral-based additive is used, pores having a pore diameter of 0.1 μm to 10 μm order can be formed. When starch is used, pores having the same pore diameter as the grain size of starch and the same shape as starch can be formed. Thus, when starch is used, the pore diameter and shape of the pores can be more easily controlled.

Specifically, in the case of the ZnO vapor deposition material of this aspect, a vapor deposition material using a butyral-based additive can obtain a deposition speed about 1.3 times higher than the evaporation speed of the conventional ZnO vapor deposition material having relative density equal to or greater than about 98%, and a vapor deposition material using starch having an average grain size of 0.1 to 500 μm can obtain an evaporation speed about two times higher than the evaporation speed of the conventional ZnO vapor deposition material having relative density equal to or greater than about 98%. Therefore, a high speed of film formation can be obtained.

In the production process of this aspect, as a fourth step for obtaining a porous sintered body, a slurry using ZnO powder having a grain size distribution within a predetermined range is prepared. Specifically, ZnO powder having an average grain size of 10 to 500 μm and a grain size distribution within a range of ±10% of the average grain size is used. If the grain size distribution of ZnO powder is outside the range of ±10% of the average grain size, the porosity is lowered. More preferably, the grain size distribution is within a range of ±5% of the average grain size. The preferred grain size of $CeO_2$ powder and $Sc_2O_3$ powder is significantly smaller than that of ZnO powder, and the usage is smaller than that of ZnO powder, so $CeO_2$ powder and $Sc_2O_3$ powder may be outside the limitation of the grain size distribution.

The slurry using ZnO powder with a controlled grain size distribution is spray-dried. The spray drying is preferably performed at 150 to 250° C. for 3 hours by using a spray drier. In the slurry to be spray-dried, ZnO powder having an average grain size of 10 to 500 μm and a grain size distribution within a range of ±10% of the average grain size is used, and no fine ZnO powder is substantially contained. Thus, there are no cases where fine ZnO grains fill the gaps between ZnO grains, so the gaps between ZnO grains remain as pores, and granulation powder becomes porous. Through the spray drying, a porous granulation powder having an average grain size of 50 to 300 μm can be obtained.

After the slurry is spray-dried to obtain a granulation powder having an average grain size of 50 to 300 μm, the granulation powder is molded under a predetermined pressure. If the average grain size of the granulation powder is smaller than 50 μm, moldability deteriorates, and if the average grain size is larger than 300 μm, the density of the molded body is lowered, and the strength is likely to be insufficient.

For a pressing molding device, a uniaxial press device, a cold isostatic press (CIP) molding device, or other devices may be used. The molding pressure is appropriately in a range of 100 to 2000 kgf/cm² (9.8 to 196 MPa), and preferably, 100 to 1000 kgf/cm² (9.8 to 98 MPa). Molding is performed under pressure within the above-described range, such that the density of the molded body can be increased, deformation after sintering can be suppressed, and postprocessing is not required.

Next, the molded body is sintered. Before sintering, the molded body is preferably degreased at a temperature of 350 to 620° C. Through this degreasing, spots on the molded body after sintering can be suppressed. The degreasing is preferably performed for a sufficient time.

Sintering is performed in an atmosphere of air, an inactive gas, a vacuum, or a reductive gas at a temperature equal to or higher than 1000° C., and preferably, at a temperature of 1200 to 1400° C. for 1 to 10 hours, and preferably, for 2 to 5 hours. The sintering is performed under air pressure, but in the case of pressure sintering, such as hot press (HP) sintering or hot isostatic press (HIP) sintering, the sintering is preferably performed in an atmosphere of inactive gas, vacuum, or reductive gas at a temperature equal to or higher than 1000° C. for 1 to 5 hours.

A ZnO film is formed on the surface of the substrate by a vacuum film formation method with a ZnO vapor deposition material composed of the resultant porous sintered body as a target material. As the vacuum film formation method suitable for forming a film using the ZnO vapor deposition material of this aspect, an electron beam deposition method, an ion plating method, a sputtering method, or a plasma deposition method may be used. A ZnO film of this aspect formed by the film formation method uses the ZnO vapor deposition material of this aspect, so the ZnO film has high conductivity with specific resistance of 3 to $5 \times 10^{-4}$ Ω·cm and high permeability with visible light permeability equal to or greater than 90%, like ITO. Crystals distorted by Ce having an ion radius larger than Zn are recovered and aligned by adding Sc having a small ion radius, such that the durability of the film is improved.

According to the production process of this aspect, in any of the first step of mixing gas in the slurry, the second step of preparing the foaming agent-containing slurry, the third step of preparing the slurry containing the additive which will be volatized and dissolved upon sintering, and the fourth step of preparing the slurry using ZnO powder having a grain size distribution within a predetermined range, the porosity, pore diameter, and pore shape can be easily controlled. Therefore, a vapor deposition material having optimum pores can be produced. As a result, even when a large number of pore states are required by the production conditions or the like, an optimum vapor deposition material can be provided to cope with the requirements.

The ZnO vapor deposition material of this aspect is composed mainly of a porous sintered body having a porosity of 5 to 30% and a pore diameter of 0.1 to 500 μm, so when a ZnO transparent conductive film is formed by an electron beam deposition method or an ion plating method using the ZnO vapor deposition material, the evaporation speed can be improved. That is, when film formation is performed with the same electron beam energy, the speed of film formation increases, and the operation time is shortened, thereby increasing the number of products for a predetermined time. Further, when film formation is performed at the same film formation speed, electron beam energy is reduced, and the replacement timing of a filament of an electron gun or the like is delayed, such that the number of times of maintenance is reduced and productivity is improved. As a result, production costs can be reduced.

Next, another aspect of the present invention will be described.

[ZnO Vapor Deposition Material]

A ZnO vapor deposition material of this aspect is a ZnO vapor deposition material for formation of a transparent conductive film which is composed mainly of a porous ZnO sintered body containing Ce and B, wherein the Ce content is higher than the B content, the Ce content is in a range of 0.1 to 14.9% by mass, the B content is in a range of 0.1 to 10% by mass, and the sintered body has a porosity of 3 to 50%.

The inventors have investigated in detail the effect on conductivity due to additive species and its content in a ZnO vapor deposition material and a ZnO film formed by using the vapor deposition material, and have found that there is a significant level of influence due to the content ratio of the two elements of Ce and B as the additive elements in the porous ZnO sintered body. Based on the above-described knowledge, the ZnO vapor deposition material according to this aspect contains ZnO as a major component, and also contains both elements of Ce and B, such that excess electrons contributing to conduction are developed in large amounts and maintained, thereby forming a ZnO film having high conductivity.

As the ratio of the two elements of Ce and B in the porous ZnO sintered body increases within a predetermined range, the conductivity of the ZnO film becomes better, and if the ratio is outside the range, the conductivity adversely deteriorates. Specifically, the Ce content in the ZnO vapor deposition material is appropriately in a range of 0.1 to 14.9% by mass, and preferably, in a range of 3 to 6% by mass. If the Ce content is lower than the lower limit value, 0.1% by mass, the conductivity is significantly lowered. If the Ce content exceeds the upper limit value, 14.9% by mass, the permeability is significantly lowered.

The B content in the ZnO vapor deposition material is appropriately in a range of 0.1 to 10% by mass, and preferably, in a range of 1 to 3% by mass. If the B content is lower than the lower limit value, 0.1% by mass, the conductivity is significantly lowered. If the B content exceeds the upper limit value, 10% by mass, compositional shift at the time of deposition occurs.

The ZnO vapor deposition material of this aspect contains a larger amount of Ce than B, such that a dense crystal structure is maintained. If the Ce content is lower than the B content, the conductivity and permeability are lowered. The total content of Ce and B is preferably in a range of 0.2 to 15% by mass. If the total content of Ce and B exceeds this range, the specific resistance and permeability of the ZnO vapor deposition material are significantly lowered.

When a very small amount of Ce and B is contained in the ZnO vapor deposition material, Ce and B do not exist as granular precipitates in grain boundaries or grains in the ZnO matrix but are uniformly dispersed in the ZnO vapor deposition material. It is considered that, in the ZnO vapor deposition material, Ce is present as an oxide, such as $CeO_2$ or $Ce_2O_3$, and B is present as $B_2O_3$.

The ZnO vapor deposition material of this aspect contains Ce, which is a trivalent or quadrivalent rare earth element, as an additive element, and Ce causes excess carrier electrons to be generated with respect to divalent Zn, such that high conductivity can be ensured. When a rare earth element is added to the ZnO vapor deposition material, compositional shift at the time of deposition is unlikely to occur, and a desired composition ratio can be maintained when a film is formed.

According to the ZnO vapor deposition material of this aspect, the conductivity is obtained by oxygen defect as well as compulsive injection of carrier electrons. Usually, oxygen gas is introduced in a vapor deposition method, but generally oxygen in the film composition is insufficient. At the time of transparent conductive film formation, a technique is conventionally used in which resistance is lowered by generating oxygen defect. However, in the case of adding a rare earth element, it is easy to control because the element is excellent in evaporation performance. In addition to this advantage, since the ZnO vapor deposition material of this aspect contains B as an additive element, high conductivity like ITO can be obtained.

The ZnO vapor deposition material of this aspect is composed of a porous ZnO sintered body having a porosity of 3 to 50%. The porosity of the sintered body is appropriately in a range of 3 to 50%, preferably in a range of 5 to 30%, more preferably in a range of 10 to 30%, and still more preferably in a range of 20 to 30%. If the porosity is smaller than 3%, it is not preferable since, at the time of film formation by an electron beam deposition method or an ion plating method, the evaporation speed of the vapor deposition material does not increase, and as a result, the speed of film formation decreases, which results in an increase in production costs. If the porosity exceeds 50%, the strength of the porous sintered body is lowered, and it is difficult to obtain sufficient mechanical strength. If the porosity is equal to or greater than 10%, the evaporation speed can be improved. Further, if the porosity is equal to or greater than 20%, a vapor deposition material having an evaporation speed about two times higher than the conventional ZnO vapor deposition material can be obtained.

In the porous ZnO sintered body of this aspect, the pores preferably have an average pore diameter of 0.1 to 500 μm. If the average pore diameter of the pores is within the above-described range, the evaporation speed can be further increased. If the pore diameter is smaller than 0.1 μm, there is no merit in the pores. If the pore diameter exceeds 500 μm, it is not preferable because the strength of the sintered body is lowered, which causes damages due to EB (electron beam) irradiation, that is, splash.

The term "pore diameter" (the inner diameter of the pore) refers to, for example, the maximum value of the internal dimensions in the pores when the sectional portion of the vapor deposition material is observed by observation means, such as SEM or the like. As the evaluation method of the pores, measurement of porosity by a substitution method, measurement of porosity by microscopy, measurement of surface area and micropore distribution by gas absorption, measurement of surface area and micropore distribution by a mercury intrusion method, measurement of surface area by a gas permeation method, or measurement of micropore distribution by an X-ray small-angle scattering method may be used.

The pores are preferably rounded, and in terms of improvement in the evaporation speed, micropores are preferably formed at the surface of the pores. For the evaluation method of the pores, the surface area is preferably in a range of 5 to 40 $m^2/g$, and at least one peak of the micropore distribution is present within a range of 1 to 100 μm. Portions (frame portion) other than the pores are preferably substantially sintered. For example, the frame portion of the porous sintered body preferably has a density equal to or greater than 98%.

In the porous ZnO sintered body of this aspect, it is preferable that grains preferably have an average crystal grain size of 1 to 500 μm, and rounded pores of about 0.1 to 500 μm are provided in the sintered body. The porous ZnO sintered body has a fine crystal structure in which the average crystal grain size is within the above-described range, and the occurrence of defects in the boundary of crystal grains can be reduced. Thus, the formed ZnO film has excellent film characteristics, such as ZnO film density, thickness distribution, refractive index, sputtering resistance, discharge characteristics (discharge voltage, discharge responsiveness, and the like), insulation characteristics, and the like. If the average crystal grain size is smaller than 1 μm, the speed of film formation is lowered. If the average crystal grain size exceeds 500 μm, the deposition rate of the additive element is not uniform. The average crystal grain size is preferably in a range of 5 to 40 μm, and more preferably, in a range of 10 to 30 μm.

The ZnO vapor deposition material of this aspect is preferably molded in the form of disc-like or circular pellets. When the vapor deposition material has a circular shape, the diameter of the vapor deposition material is appropriately in a range of 5 to 30 mm, and preferably, in a range of 5 to 15 mm. This is because, if the diameter is excessively small and smaller than 5 mm, splash occurs, and if the diameter exceeds 30 mm, it is difficult to handle the vapor deposition material in an actual production process. When the vapor deposition material is disc-like, the diameter of the vapor deposition material is appropriately in a range of 5 to 20 mm, and preferably, in a range of 5 to 10 mm. The height of the vapor deposition material is in a range of 1 to 10 mm, and preferably, in a range of 2 to 5 mm. This is because, if the diameter is excessively small and smaller than 5 mm or the height is excessively small and smaller than 1 mm, splash occurs, and if the diameter exceeds 30 mm or the height exceeds 10 mm, it is difficult to handle the vapor deposition material in an actual production process.

Hereinafter, a process for producing a ZnO vapor deposition material according to this aspect will be described.
[Production Process]

The ZnO vapor deposition material according to this aspect can be produced by mixing ZnO powder having a purity equal to or greater than 98%, $CeO_2$ powder in such an amount that the Ce content in the ZnO vapor deposition material is in a range of 0.1 to 14.9% by mass, $B_2O_3$ powder in such an amount that the B content in the ZnO vapor deposition material is in a range of 0.1 to 10% by mass, a binder, and an organic solvent to prepare a slurry with a concentration of 30 to 75% by mass, spray-drying the slurry to obtain a granulation powder having an average grain size of 50 to 300 μm, molding the granulation powder to obtain a porous molded body, and sintering the molded body at a predetermined temperature to obtain a porous ZnO sintered body.

The ZnO powder preferably has purity equal to or greater than 98%, more preferably, equal to or greater than 98.4%, and still more preferably, equal to or greater than 99%. If the ZnO powder has purity equal to or greater than 98%, reduction of conductivity by the effect of impurities can be suppressed. The average grain size of the ZnO powder is in a range of 0.1 to 10 μm. When the average grain size of the ZnO powder is smaller than 0.1 μm, the powder is excessively fine and aggregated, so there is a tendency that the handling of the powder becomes worse, and it is difficult to prepare a high-concentration slurry. When the average grain size exceeds 10 μm, there is a tendency that it is difficult to control the microstructure, and a dense pellet is hard to obtain. If the average grain size of the ZnO powder is adjusted to the above-described range, a desired sintered body is also obtained without using a sintering auxiliary agent.

With regard to the $CeO_2$ powder, considering the prevention of maldistribution of the Ce powder, reactivity with the ZnO matrix, and the purity of the Ce compound, it is preferable to add cerium oxide grains whose primary grain size is of a nanometer scale. The $B_2O_3$ powder preferably has an average grain size of 0.01 to 1 μm, and still more preferably, the average grain size is in a range of 0.05 to 0.5 μm. If the $B_2O_3$ powder having this average grain size is used, it is beneficial in terms of the uniform dispersion of the $CeO_2$ powder.

For a binder, polyethylene glycol, polyvinyl butyral, or the like may be used. It is preferable to add the binder at 0.2 to 2.5% by mass. For an organic solvent, ethanol, propanol, or the like may be used.

The raw powder, the binder, and the organic solvent are mixed to prepare a slurry with a concentration of 30 to 75% by mass, and preferably, 40 to 65% by mass. If the slurry concentration exceeds 75% by mass, since the slurry is a non-aqueous system, stable granulation is difficult. If the slurry concentration is less than 30% by mass, it is difficult to obtain a dense ZnO sintered body having a uniform composition. If the slurry concentration is adjusted within the above-described range, the viscosity of the slurry is in a range of 200 to 1000 cps. Therefore, powder granulation using a spray drier can be performed stably. Further, the density of a molded body increases, such that a dense sintered body can be obtained.

Wet blending of raw powder, a binder, and an organic solvent, and in particular, wet blending of raw powder and an organic solvent as a dispersion medium is preferably performed by a wet ball mill or a stirring mill. In the case of using a $ZrO_2$ ball in the wet ball mill, wet blending is preferably performed using a large number of $ZrO_2$ balls having a diameter of 5 to 10 mm for 8 to 24 hours, and preferably, for 20 to 24 hours. If the diameter of the $ZrO_2$ ball is smaller than 5 mm, blending may be insufficient. If the diameter of the $ZrO_2$ ball exceeds 10 mm, impurities are increased. Even though the blending time is long, up to 24 hours, impurities are hardly generated due to milling. On the other hand, when a resin ball with a metal support is used in the wet ball mill, a ball having a diameter of 10 to 15 mm is preferably used.

In the stirring mill, wet blending is preferably performed using a $ZrO_2$ ball having a diameter of 1 to 3 mm for 0.5 to 1 hour. If the diameter of the $ZrO_2$ ball is smaller than 1 mm, blending is insufficient. If the diameter exceeds 3 mm, impurities are increased. If the blending time exceeds 1 hour, while raw materials are mixed, milling leads to the generation of impurities. Sufficient blending can be done within 1 hour. Blending/granulation of powder and additives may be performed by a general tumbling granulation method. In this case, it is not necessary to perform a separation operation from the balls or the like after the process, and thus the process is simplified.

In the production process of this aspect, as a first step for obtaining a porous sintered body, gas is blown and mixed into the slurry to prepare a gas-containing slurry. Gas blowing and mixing is preferably performed by blowing using a mechanical pump, gas pressure, or the like. As the gas, air, an insoluble gas, a non-aqueous gas, or the like may be used.

The gas-containing slurry is spray-dried. The spray drying is preferably performed at 150 to 250° C. for 3 hours by using a spray drier. Since gas is blown into the slurry, the granulation powder obtained by spray-drying the slurry is porous. Through the spray drying, a porous granulation powder having an average grain size of 50 to 300 μm can be obtained.

In the production process of this aspect, as a second step for obtaining a porous sintered body, a slurry is prepared in which a foaming agent is mixed. For the foaming agent, an organic foaming agent or an inorganic foaming agent may be used. For the organic foaming agent, azodicarboxylamide, dinitrosobenta methylene tetramine, or the like is used, and for the inorganic foaming agent, carbonate or the like is used. The foaming agent may be mixed with ZnO powder, $CeO_2$ powder, and $B_2O_3$ powder, or may be added upon slurry preparation.

The foaming agent-containing slurry is spray-dried. The spray drying is preferably performed at 150 to 250° C. for 3 hours by using a spray drier. The foaming agent contained in the slurry is foamed and dissolved upon this spray drying, such that resultant granulation powder is made porous. Through the spray drying, a porous granulation powder having an average grain size of 50 to 300 µm can be obtained.

In the production process of this aspect, as a third step for obtaining a porous sintered body, a slurry is prepared in which an additive, which will be volatized and dissolved upon sintering, is mixed. Examples of the additive include butyral capable of being dissolved in a solvent, and a cellulose-based additive, a polyvinyl-based additive, a polyester-based additive, a polyethylene-based additive, and the like capable of being dissolved in an alcohol-based solvent. Examples of the additive which will not be dissolved in the alcohol-based solvent include a starch-based additive and a polystyrene-based additive having an average grain size of about several µm to 500 µm. It is preferable that butyral is mixed in the slurry at about 20% by mass, or starch is mixed in the slurry at about 20% by mass.

If the slurry contains the additive, the additive is volatized and dissolved upon sintering to form pores, thereby obtaining a porous sintered body. The diameter and shape of the pores can be controlled by adjusting the kind and amount of the additive. For example, when a butyral-based additive is used, pores having a pore diameter of 0.1 µm to 10 µm order can be formed. When starch is used, pores having the same pore diameter as the grain size of starch and the same shape as starch can be formed. Thus, when starch is used, the pore diameter and shape of the pores can be more easily controlled.

Specifically, in the case of the ZnO vapor deposition material of this aspect, a vapor deposition material using a butyral-based additive can obtain a deposition speed about 1.3 times higher than the evaporation speed of the conventional ZnO vapor deposition material having relative density equal to or greater than about 98%, and a vapor deposition material using starch having an average grain size of 0.1 to 500 µm can obtain an evaporation speed about two times higher than the evaporation speed of the conventional ZnO vapor deposition material having relative density equal to or greater than about 98%. Therefore, a high speed of film formation can be obtained.

In the production process of this aspect, as a fourth step for obtaining a porous sintered body, a slurry using ZnO powder having a grain size distribution within a predetermined range is prepared. Specifically, ZnO powder having an average grain size of 10 to 500 µm and a grain size distribution within a range of ±10% of the average grain size is used. If the grain size distribution of ZnO powder is outside the range of ±10% of the average grain size, the porosity is lowered. More preferably, the grain size distribution is within a range of ±5% of the average grain size. The preferred grain size of $CeO_2$ powder and $B_2O_3$ powder is significantly smaller than that of ZnO powder, and the usage is smaller than that of ZnO powder, so $CeO_2$ powder and $B_2O_3$ powder may be outside the limitation of the grain size distribution.

The slurry using ZnO powder with a controlled grain size distribution is spray-dried. The spray drying is preferably performed at 150 to 250° C. for 3 hours by using a spray drier. In the slurry to be spray-dried, ZnO powder having an average grain size of 10 to 500 µm and a grain size distribution within a range of ±10% of the average grain size is used, and no fine ZnO powder is substantially contained. Thus, there are no cases where fine ZnO grains fill the gaps between ZnO grains, so the gaps between ZnO grains remain as pores, and granulation powder becomes porous. Through the spray drying, a porous granulation powder having an average grain size of 50 to 300 µm can be obtained.

After the slurry is spray-dried to obtain a granulation powder having an average grain size of 50 to 300 µm, the granulation powder is molded under a predetermined pressure. If the average grain size of the granulation powder is smaller than 50 µm, moldability deteriorates, and if the average grain size is larger than 300 µm, the density of the molded body is lowered, and the strength is likely to be insufficient.

For a pressing molding device, a uniaxial press device, a cold isostatic press (CIP) molding device, or other devices may be used. The molding pressure is appropriately in a range of 100 to 2000 kgf/cm$^2$ (9.8 to 196 MPa), and preferably, 100 to 1000 kgf/cm$^2$ (9.8 to 98 MPa). Molding is performed under pressure within the above-described range, such that the density of the molded body can be increased, deformation after sintering can be suppressed, and postprocessing is not required.

Next, the molded body is sintered. Before sintering, the molded body is preferably degreased at a temperature of 350 to 620° C. Through this degreasing, spots on the molded body after sintering can be suppressed. The degreasing is preferably performed for a sufficient time.

Sintering is performed in an atmosphere of air, an inactive gas, a vacuum, or a reductive gas at a temperature equal to or higher than 1000° C., and preferably, at a temperature of 1200 to 1400° C. for 1 to 10 hours, and preferably, for 2 to 5 hours. The sintering is performed under air pressure, but in the case of pressure sintering, such as hot press (HP) sintering or hot isostatic press (HIP) sintering, the sintering is preferably performed in an atmosphere of inactive gas, vacuum, or reductive gas at a temperature equal to or higher than 1000° C. for 1 to 5 hours.

A ZnO film is formed on the surface of the substrate by a vacuum film formation method with a ZnO vapor deposition material composed of the resultant porous sintered body as a target material. As the vacuum film formation method suitable for forming a film using the ZnO vapor deposition material of this aspect, an electron beam deposition method, an ion plating method, a sputtering method, or a plasma deposition method may be used. A ZnO film of this aspect formed by the film formation method uses the ZnO vapor deposition material of this aspect, so the ZnO film has high conductivity with specific resistance of 3 to $5 \times 10^{-4}$ Ω·cm and high permeability with visible light permeability equal to or greater than 90%, like ITO. Crystals distorted by Ce having an ion radius larger than Zn are recovered and aligned by adding B having a small ion radius, such that the durability of the film is improved.

According to the production process of this aspect, in any of the first step of mixing gas in the slurry, the second step of preparing the foaming agent-containing slurry, the third step of preparing the slurry containing the additive which will be volatized and dissolved upon sintering, and the fourth step of preparing the slurry using ZnO powder having a grain size distribution within a predetermined range, the porosity, pore diameter, and pore shape can be easily controlled. Therefore, a vapor deposition material having optimum pores can be produced. As a result, even when a large number of pore states are required by the production conditions or the like, an optimum vapor deposition material can be provided to cope with the requirements.

The ZnO vapor deposition material of this aspect is composed mainly of a porous sintered body having a porosity of 5 to 30% and a pore diameter of 0.1 to 500 µm, so when a ZnO transparent conductive film is formed by an electron beam deposition method or an ion plating method using the ZnO vapor deposition material, the evaporation speed can be improved. That is, when film formation is performed with the same electron beam energy, the speed of film formation increases, and the operation time is shortened, thereby increasing the number of products for a predetermined time. Further, when film formation is performed at the same film formation speed, electron beam energy is reduced, and the replacement timing of a filament of an electron gun or the like is delayed, such that the number of times of maintenance is reduced and productivity is improved. As a result, production costs can be reduced.

Next, another aspect of the present invention will be described.

[ZnO Vapor Deposition Material]

A ZnO vapor deposition material of this aspect is a ZnO vapor deposition material for formation of a transparent conductive film which is composed of a sintered body containing ZnO as a major component, wherein the sintered body contains La as a first additive element and a second additive element, the second additive element is one or more elements selected from the group consisting of B, Al, Ga, and Sc, the La content is in a range of 0.1 to 14.9% by mass, the content of the second additive element is in a range of 0.1 to 10% by mass, the La content is higher than the content of the second additive element, and the sintered body is a porous sintered body having a porosity of 3 to 50%.

The inventors have investigated in detail the effect on conductivity due to additive species and its content in a ZnO vapor deposition material and a ZnO film formed by using the vapor deposition material, and have found that there is a significant level of influence on conductivity due to the species and content of La as an additive element and B, Al, Ga, or Sc in the porous ZnO sintered body. Based on the above-described knowledge, the ZnO vapor deposition material according to this aspect contains ZnO as a major component, and also contains La as a first additive element and the second additive element, such that excess electrons contributing to conduction are developed in large amounts and maintained, thereby forming a ZnO film having high conductivity.

The ZnO vapor deposition material of this aspect contains La as a first additive element and the second additive element together, and the second additive element is one or more elements selected from B, Al, Ga, and Sc. Of the second additive elements, B, Al, and Ga have an ion radius smaller than La as a first additive element, so crystals distorted by the addition of La having an ion radius larger than Zn are recovered and aligned by adding B, Al, or Ga, or the crystal structure distorted by the addition of La is recovered and aligned by adding Sc having high reactivity as the second additive element. For this reason, a ZnO film having high permeability, excellent denseness, high conductivity, and excellent durability can be formed.

As the ratio of La as a first additive element and the second additive element in the porous ZnO sintered body increases within a predetermined range, the conductivity of the ZnO film becomes better, and if the ratio is outside the range, the conductivity adversely deteriorates. Specifically, the La content in the ZnO vapor deposition material is appropriately in a range of 0.1 to 14.9% by mass, and preferably, in a range of 3 to 6% by mass. If the La content is lower than the lower limit value, 0.1% by mass, the conductivity is significantly lowered. If the La content exceeds the upper limit value, 14.9% by mass, the permeability is significantly lowered.

The content of the second additive element in the ZnO vapor deposition material is appropriately in a range of 0.1 to 10% by mass, and preferably, in a range of 1 to 3% by mass. If the content of the second additive element is lower than the lower limit value, 0.1% by mass, the conductivity is significantly lowered. If the content of the second additive element exceeds the upper limit value, 10% by mass, compositional shift at the time of deposition occurs.

The ZnO vapor deposition material of this aspect contains a larger amount of La as a first additive element than the second additive element, such that a dense crystal structure is maintained. If the La content is lower than that of the second additive element, the conductivity and permeability are lowered. The total content of Ce as a first additive element and the second additive element is preferably in a range of 0.2 to 15% by mass. If the total content of La and the second additive element exceeds this range, the specific resistance and permeability of the ZnO vapor deposition material are significantly lowered.

When a very small amount of La as a first additive element and the second additive element is contained in the ZnO vapor deposition material, La as a first additive element and the second additive element do not exist as granular precipitates in grain boundaries or grains in the ZnO matrix but are uniformly dispersed in the ZnO vapor deposition material. It is considered that, in the ZnO vapor deposition material, the first additive element and the second additive element are present as oxides.

The ZnO vapor deposition material of this aspect contains La, which is a trivalent rare earth element, as a first additive element, and La causes excess carrier electrons to be generated with respect to divalent Zn, such that high conductivity can be ensured. When a rare earth element is added to the ZnO vapor deposition material, compositional shift at the time of deposition is unlikely to occur, and a desired composition ratio can be maintained when a film is formed.

According to the ZnO vapor deposition material of this aspect, the conductivity is obtained by oxygen defect as well as compulsive injection of carrier electrons. Usually, oxygen gas is introduced in a vapor deposition method, but generally oxygen in the film composition is insufficient. At the time of transparent conductive film formation, a technique is conventionally used in which resistance is lowered by generating oxygen defect. However, in the case of adding a rare earth element, it is easy to control because the element is excellent in evaporation performance. In addition to this advantage by the addition of La which is a rare earth element, since the ZnO vapor deposition material of this aspect contains the second additive element, high conductivity like ITO can be obtained.

The ZnO vapor deposition material of this aspect is composed of a porous ZnO sintered body having a porosity of 3 to 50%. The porosity of the sintered body is appropriately in a range of 3 to 50%, preferably in a range of 5 to 30%, more preferably in a range of 10 to 30%, and still more preferably in a range of 20 to 30%. If the porosity is smaller than 3%, it is not preferable since, at the time of film formation by an electron beam deposition method or an ion plating method, the evaporation speed of the vapor deposition material does not increase, and as a result, the speed of film formation decreases, which results in an increase in production costs. If the porosity exceeds 50%, the strength of the porous sintered body is lowered, and it is difficult to obtain sufficient mechanical strength. If the porosity is equal to or greater than 10%, the evaporation speed can be improved. Further, if the porosity is equal to or greater than 20%, a vapor deposition material having an evaporation speed about two times higher than the conventional ZnO vapor deposition material can be obtained.

In the porous ZnO sintered body of this aspect, the pores preferably have an average pore diameter of 0.1 to 500 μm. If the average pore diameter of the pores is within the above-described range, the evaporation speed can be further increased. If the pore diameter is smaller than 0.1 μm, there is no merit in the pores. If the pore diameter exceeds 500 μm, it is not preferable because the strength of the sintered body is lowered, which causes damages due to EB (electron beam) irradiation, that is, splash.

The term "pore diameter" (the inner diameter of the pore) refers to, for example, the maximum value of the internal dimensions in the pores when the sectional portion of the vapor deposition material is observed by observation means, such as SEM or the like. As the evaluation method of the pores, measurement of porosity by a substitution method, measurement of porosity by microscopy, measurement of surface area and micropore distribution by gas absorption, measurement of surface area and micropore distribution by a mercury intrusion method, measurement of surface area by a gas permeation method, or measurement of micropore distribution by an X-ray small-angle scattering method may be used.

The pores are preferably rounded, and in terms of improvement in the evaporation speed, micropores are preferably formed at the surface of the pores. For the evaluation method of the pores, the surface area is preferably in a range of 5 to 40 $m^2/g$, and at least one peak of the micropore distribution is present within a range of 1 to 100 μm. Portions (frame portion) other than the pores are preferably substantially sintered. For example, the frame portion of the porous sintered body preferably has a density equal to or greater than 98%.

In the porous ZnO sintered body of this aspect, it is preferable that grains preferably have an average crystal grain size of 1 to 500 μm, and rounded pores of about 0.1 to 500 μm are provided in the sintered body. The porous ZnO sintered body has a fine crystal structure in which the average crystal grain size is within the above-described range, and the occurrence of defects in the boundary of crystal grains can be reduced. Thus, the formed ZnO film has excellent film characteristics, such as ZnO film density, thickness distribution, refractive index, sputtering resistance, discharge characteristics (discharge voltage, discharge responsiveness, and the like), insulation characteristics, and the like. If the average crystal grain size is smaller than 1 μm, the speed of film formation is lowered. If the average crystal grain size exceeds 500 μm, the deposition rate of the additive element is not uniform. The average crystal grain size is preferably in a range of 5 to 40 μm, and more preferably, in a range of 10 to 30 μm.

The ZnO vapor deposition material of this aspect is preferably molded in the form of disc-like or circular pellets. When the vapor deposition material has a circular shape, the diameter of the vapor deposition material is appropriately in a range of 5 to 30 mm, and preferably, in a range of 5 to 15 mm. This is because, if the diameter is excessively small and smaller than 5 mm, splash occurs, and if the diameter exceeds 30 mm, it is difficult to handle the vapor deposition material in an actual production process. When the vapor deposition material is disc-like, the diameter of the vapor deposition material is appropriately in a range of 5 to 20 mm, and preferably, in a range of 5 to 10 mm. The height of the vapor deposition material is in a range of 1 to 10 mm, and preferably, in a range of 2 to 5 mm. This is because, if the diameter is excessively small and smaller than 5 mm or the height is excessively small and smaller than 1 mm, splash occurs, and if the diameter exceeds 30 mm or the height exceeds 10 mm, it is difficult to handle the vapor deposition material in an actual production process.

Hereinafter, a process for producing a ZnO vapor deposition material according to this aspect will be described.

[Production Process]

The ZnO vapor deposition material according to this aspect can be produced by mixing ZnO powder having a purity equal to or greater than 98%, $La_2O_3$ powder in such an amount that the La content in the ZnO vapor deposition material is in a range of 0.1 to 14.9% by mass, an oxide powder of a second additive element in such an amount that the content of the second additive element in the ZnO vapor deposition material is in a range of 0.1 to 10% by mass, a binder, and an organic solvent to prepare a slurry with a concentration of 30 to 75% by mass, blowing gas into the slurry to obtain a gas-containing slurry, spray-drying the gas-containing slurry to obtain a porous granulation powder having an average grain size of 50 to 300 μm, molding the porous granulation powder to obtain a porous molded body, and sintering the porous molded body at a predetermined temperature to obtain a porous ZnO sintered body.

The ZnO powder preferably has purity equal to or greater than 98%, more preferably, equal to or greater than 98.4%, and still more preferably, equal to or greater than 99%. If the ZnO powder has purity equal to or greater than 98%, reduction of conductivity by the effect of impurities can be suppressed. The average grain size of the ZnO powder is in a range of 0.1 to 10 μm. When the average grain size of the ZnO powder is smaller than 0.1 μm, the powder is excessively fine and aggregated, so there is a tendency that the handling of the powder becomes worse, and it is difficult to prepare a high-concentration slurry. When the average grain size exceeds 10 μm, there is a tendency that it is difficult to control the microstructure, and a dense pellet is hard to obtain. If the average grain size of the ZnO powder is adjusted to the above-described range, a desired sintered body is also obtained without using a sintering auxiliary agent.

With regard to the $La_2O_3$ powder, considering the prevention of maldistribution of the La powder, reactivity with a ZnO matrix, and the purity of a La compound, it is preferable to add La oxide grains whose primary grain size is of a nanometer scale. The oxide powder of the second additive element preferably has an average grain size of 0.01 to 1 μm, and still more preferably, the average grain size is in a range of 0.05 to 0.5 μm. If the oxide powder of the second additive element having this average grain size is used, it is beneficial in terms of the uniform dispersion of the oxide powder of the second additive element.

For a binder, polyethylene glycol, polyvinyl butyral, or the like may be used. It is preferable to add the binder at 0.2 to 2.5% by mass. For an organic solvent, ethanol, propanol, or the like may be used.

The raw powder, the binder, and the organic solvent are mixed to prepare a slurry with a concentration of 30 to 75% by mass, and preferably, 40 to 65% by mass. If the slurry concentration exceeds 75% by mass, since the slurry is a non-aqueous system, stable granulation is difficult. If the slurry concentration is less than 30% by mass, it is difficult to obtain a dense ZnO sintered body having a uniform composition. If the slurry concentration is adjusted within the above-described range, the viscosity of the slurry is in a range of 200 to 1000 cps. Therefore, powder granulation using a spray drier can be performed stably. Further, the density of a molded body increases, such that a dense sintered body can be obtained.

Wet blending of raw powder, a binder, and an organic solvent, and in particular, wet blending of raw powder and an organic solvent as a dispersion medium is preferably performed by a wet ball mill or a stirring mill. In the case of using a $ZrO_2$ ball in the wet ball mill, wet blending is preferably performed using a large number of $ZrO_2$ balls having a diameter of 5 to 10 mm for 8 to 24 hours, and preferably, for 20 to 24 hours. If the diameter of the $ZrO_2$ ball is smaller than 5 mm, blending may be insufficient. If the diameter of the $ZrO_2$ ball exceeds 10 mm, impurities are increased. Even though the blending time is long, up to 24 hours, impurities are hardly generated due to milling. On the other hand, when a resin ball with a metal support is used in the wet ball mill, a ball having a diameter of 10 to 15 mm is preferably used.

In the stirring mill, wet blending is preferably performed using a $ZrO_2$ ball having a diameter of 1 to 3 mm for 0.5 to 1 hour. If the diameter of the $ZrO_2$ ball is smaller than 1 mm, blending is insufficient. If the diameter exceeds 3 mm, impurities are increased. If the blending time exceeds 1 hour, while raw materials are mixed, milling leads to the generation of impurities. Sufficient blending can be done within 1 hour. Blending/granulation of powder and additives may be performed by a general tumbling granulation method. In this case, it is not necessary to perform a separation operation from the balls or the like after the process, and thus the process is simplified.

In the production process of this aspect, as a first step for obtaining a porous sintered body, gas is blown and mixed into the slurry to prepare a gas-containing slurry. Gas blowing and mixing is preferably performed by blowing using a mechanical pump, gas pressure, or the like. As the gas, air, an insoluble gas, a non-aqueous gas, or the like may be used.

The gas-containing slurry is spray-dried. The spray drying is preferably performed at 150 to 250° C. for 3 hours by using a spray drier. Since gas is blown into the slurry, the granulation powder obtained by spray-drying the slurry is porous. Through the spray drying, a porous granulation powder having an average grain size of 50 to 300 μm can be obtained.

In the production process of this aspect, as a second step for obtaining a porous sintered body, a slurry is prepared in which a foaming agent is mixed. For the foaming agent, an organic foaming agent or an inorganic foaming agent may be used. For the organic foaming agent, azodicarboxylamide, dinitrosobenta methylene tetramine, or the like is used, and for the inorganic foaming agent, carbonate or the like is used. The foaming agent may be mixed with ZnO powder, $LaO_2$ powder, and $Al_2O_3$ powder, or may be added upon slurry preparation.

The foaming agent-containing slurry is spray-dried. The spray drying is preferably performed at 150 to 250° C. for 3 hours by using a spray drier. The foaming agent contained in the slurry is foamed and dissolved upon this spray drying, such that resultant granulation powder is made porous. Through the spray drying, a porous granulation powder having an average grain size of 50 to 300 μm can be obtained.

In the production process of this aspect, as a third step for obtaining a porous sintered body, a slurry is prepared in which an additive, which will be volatized and dissolved upon sintering, is mixed. Examples of the additive include butyral capable of being dissolved in a solvent, and a cellulose-based additive, a polyvinyl-based additive, a polyester-based additive, a polyethylene-based additive, and the like capable of being dissolved in an alcohol-based solvent. Examples of the additive which will not be dissolved in the alcohol-based solvent include a starch-based additive and a polystyrene-based additive having an average grain size of about several μm to 500 μm. It is preferable that butyral is mixed in the slurry at about 20% by mass, or starch is mixed in the slurry at about 20% by mass.

If the slurry contains the additive, the additive is volatized and dissolved upon sintering to form pores, thereby obtaining a porous sintered body. The diameter and shape of the pores can be controlled by adjusting the kind and amount of the additive. For example, when a butyral-based additive is used, pores having a pore diameter of 0.1 μm to 10 μm order can be formed. When starch is used, pores having the same pore diameter as the grain size of starch and the same shape as starch can be formed. Thus, when starch is used, the pore diameter and shape of the pores can be more easily controlled.

Specifically, in the case of the ZnO vapor deposition material of this aspect, a vapor deposition material using a butyral-based additive can obtain a deposition speed about 1.3 times higher than the evaporation speed of the conventional ZnO vapor deposition material having relative density equal to or greater than about 98%, and a vapor deposition material using starch having an average grain size of 0.1 to 500 μm can obtain an evaporation speed about two times. Therefore, a high speed of film formation can be obtained.

In the production process of this aspect, as a fourth step for obtaining a porous sintered body, a slurry using ZnO powder having a grain size distribution within a predetermined range is prepared. Specifically, ZnO powder having an average grain size of 10 to 500 μm and a grain size distribution within a range of ±10% of the average grain size is used. If the grain size distribution of ZnO powder is outside the range of ±10% of the average grain size, the porosity is lowered. More preferably, the grain size distribution is within a range of ±5% of the average grain size. The preferred grain size of oxide powder of the first additive element and the second additive element is significantly smaller than that of ZnO powder, and the usage is smaller than that of ZnO powder, so oxide powder of the first additive element and the second additive element may be outside the limitation of the grain size distribution.

The slurry using ZnO powder with a controlled grain size distribution is spray-dried. The spray drying is preferably performed at 150 to 250° C. for 3 hours by using a spray drier. In the slurry to be spray-dried, ZnO powder having an average grain size of 10 to 500 μm and a grain size distribution within a range of ±10% of the average grain size is used, and no fine ZnO powder is substantially contained. Thus, there are no cases where fine ZnO grains fill the gaps between ZnO grains, so the gaps between ZnO grains remain as pores, and granulation powder becomes porous. Through the spray drying, a porous granulation powder having an average grain size of 50 to 300 μm can be obtained.

After the slurry is spray-dried to obtain a granulation powder having an average grain size of 50 to 300 μm, the granulation powder is molded under a predetermined pressure. If the average grain size of the granulation powder is smaller than 50 μm, moldability deteriorates, and if the average grain size is larger than 300 μm, the density of the molded body is lowered, and the strength is likely to be insufficient.

For a pressing molding device, a uniaxial press device, a cold isostatic press (CIP) molding device, or other devices may be used. The molding pressure is appropriately in a range of 100 to 2000 kgf/cm² (9.8 to 196 MPa), and preferably, 100 to 1000 kgf/cm² (9.8 to 98 MPa). Molding is performed under pressure within the above-described range, such that the density of the molded body can be increased, deformation after sintering can be suppressed, and postprocessing is not required.

Next, the molded body is sintered. Before sintering, the molded body is preferably degreased at a temperature of 350 to 620° C. Through this degreasing, spots on the molded body after sintering can be suppressed. The degreasing is preferably performed for a sufficient time.

Sintering is performed in an atmosphere of air, an inactive gas, a vacuum, or a reductive gas at a temperature equal to or higher than 1000° C., and preferably, at a temperature of 1200 to 1400° C. for 1 to 10 hours, and preferably, for 2 to 5 hours.

The sintering is performed under air pressure, but in the case of pressure sintering, such as hot press (HP) sintering or hot isostatic press (HIP) sintering, the sintering is preferably performed in an atmosphere of inactive gas, vacuum, or reductive gas at a temperature equal to or higher than 1000° C. for 1 to 5 hours.

A ZnO film is formed on the surface of the substrate by a vacuum film formation method with a ZnO vapor deposition material composed of the resultant porous sintered body as a target material. As the vacuum film formation method suitable for forming a film using the ZnO vapor deposition material of this aspect, an electron beam deposition method, an ion plating method, a sputtering method, or a plasma deposition method may be used. A ZnO film of this aspect formed by the film formation method uses the ZnO vapor deposition material of this aspect, so the ZnO film has high conductivity with specific resistance of 3 to $5\times10^{-4}$ $\Omega\cdot$cm and high permeability with visible light permeability equal to or greater than 90%, like ITO.

In the ZnO vapor deposition material of this aspect, the crystal structure distorted by the addition of La having an ion radius larger than Zn is recovered and aligned by addition of the second additive element having a small ion radius, such as B, Al, or Ga, or Sc having high reactivity is added to recover a film having a regulated crystal structure. Therefore, a dense film can be formed, and the durability of the film can also be improved.

According to the production process of this aspect, in any of the first step of mixing gas in the slurry, the second step of preparing the foaming agent-containing slurry, the third step of preparing the slurry containing the additive which will be volatized and dissolved upon sintering, and the fourth step of preparing the slurry using ZnO powder having a grain size distribution within a predetermined range, the porosity, pore diameter, and pore shape can be easily controlled. Therefore, a vapor deposition material having optimum pores can be produced. As a result, even when a large number of pore states are required by the production conditions or the like, an optimum vapor deposition material can be provided to cope with the requirements.

The ZnO vapor deposition material of this aspect is composed mainly of a porous sintered body having a porosity of 5 to 30% and a pore diameter of 0.1 to 500 µm, so when a ZnO transparent conductive film is formed by an electron beam deposition method or an ion plating method using the ZnO vapor deposition material, the evaporation speed can be improved. That is, when film formation is performed with the same electron beam energy, the speed of film formation increases, and the operation time is shortened, thereby increasing the number of products for a predetermined time. Further, when film formation is performed at the same film formation speed, electron beam energy is reduced, and the replacement timing of a filament of an electron gun or the like is delayed, such that the number of times of maintenance is reduced and productivity is improved. As a result, production costs can be reduced.

Next, another aspect of the present invention will be described.

[ZnO Vapor Deposition Material]

A ZnO vapor deposition material of this aspect is a ZnO vapor deposition material for formation of a transparent conductive film which is composed of a sintered body containing ZnO as a major component, wherein the sintered body contains Y as a first additive element and a second additive element, the second additive element is one or more elements selected from the group consisting of B, Al, Ga, and Sc, the Y content is in a range of 0.1 to 14.9% by mass, the content of the second additive element is in a range of 0.1 to 10% by mass, the Y content is higher than the content of the second additive element, and the sintered body is a porous sintered body having a porosity of 3 to 50%.

The inventors have investigated in detail the effect on conductivity due to additive species and the content in a ZnO vapor deposition material and a ZnO film formed by using the vapor deposition material, and have found that there is a significant level of influence on conductivity due to the species and content of Y as a first additive element and the second additive element, such as B, Al, Ga, or Sc, in the porous ZnO sintered body. Based on the above-described knowledge, the ZnO vapor deposition material according to this aspect contains ZnO as a major component, and also contains Y as a first additive element and the second additive element, such that excess electrons contributing to conduction are developed in large amounts and maintained, thereby forming a ZnO film having high conductivity.

The ZnO vapor deposition material of this aspect contains Y as a first additive element and the second additive element together, and the second additive element is one or more elements selected from B, Al, Ga, and Sc. Of the second additive elements, B, Al, and Ga have an ion radius smaller than Y as a first additive element, so crystals distorted by the addition of Y having an ion radius larger than Zn are recovered and aligned by adding B, Al, or Ga, or the crystal structure distorted by the addition of Y is recovered and aligned by adding Sc having high reactivity as the second additive element. For this reason, a ZnO film having high permeability, excellent denseness, high conductivity, and excellent durability can be formed.

As the ratio of Y as a first additive element and the second additive element in the porous ZnO sintered body increases within a predetermined range, the conductivity of the ZnO film becomes better, and if the ratio is outside the range, the conductivity adversely deteriorates. Specifically, the Y content in the ZnO vapor deposition material is appropriately in a range of 0.1 to 14.9% by mass, and preferably, in a range of 3 to 6% by mass. If the Y content is lower than the lower limit value, 0.1% by mass, the conductivity is significantly lowered. If the Y content exceeds the upper limit value, 14.9% by mass, the permeability is significantly lowered.

The content of the second additive element in the ZnO vapor deposition material is appropriately in a range of 0.1 to 10% by mass, and preferably, in a range of 1 to 3% by mass. If the content of the second additive element is lower than the lower limit value, 0.1% by mass, the conductivity is significantly lowered. If the content of the second additive element exceeds the upper limit value, 10% by mass, compositional shift at the time of deposition occurs.

The ZnO vapor deposition material of this aspect contains a larger amount of Y as a first additive element than the second additive element, such that a dense crystal structure is maintained. If the Y content is lower than that of the second additive element, the conductivity and permeability are lowered. The total content of Y as a first additive element and the second additive element is preferably in a range of 0.2 to 15% by mass. If the total content of Y and the second additive element exceeds this range, the specific resistance and permeability of the ZnO vapor deposition material are significantly lowered.

When a very small amount of Y as a first additive element and the second additive element is contained in the ZnO vapor deposition material, Y as a first additive element and the second additive element do not exist as granular precipitates in grain boundaries or grains in the ZnO matrix but are uniformly dispersed in the ZnO vapor deposition material. It is considered that, in the ZnO vapor deposition material, the first additive element and the second additive element are present as oxides.

The ZnO vapor deposition material of this aspect contains Y, which is a trivalent rare earth element, as a first additive element, and Y causes excess carrier electrons to be generated with respect to divalent Zn, such that high conductivity can be ensured. When a rare earth element is added to the ZnO vapor deposition material, compositional shift at the time of deposition is unlikely to occur, and a desired composition ratio can be maintained when a film is formed.

According to the ZnO vapor deposition material of this aspect, the conductivity is obtained by oxygen defect as well as compulsive injection of carrier electrons. Usually, oxygen gas is introduced in a vapor deposition method, but generally oxygen in the film composition is insufficient. At the time of transparent conductive film formation, a technique is conventionally used in which resistance is lowered by generating oxygen defect. However, in the case of adding a rare earth element, it is easy to control because the element is excellent in evaporation performance. In addition to this advantage by the addition of Y which is a rare earth element, since the ZnO vapor deposition material of this aspect contains the second additive element, high conductivity like ITO can be obtained.

The ZnO vapor deposition material of this aspect is composed of a porous ZnO sintered body having a porosity of 3 to 50%. The porosity of the sintered body is appropriately in a range of 3 to 50%, preferably in a range of 5 to 30%, more preferably in a range of 10 to 30%, and still more preferably in a range of 20 to 30%. If the porosity is smaller than 3%, it is not preferable since, at the time of film formation by an electron beam deposition method or an ion plating method, the evaporation speed of the vapor deposition material does not increase, and as a result, the speed of film formation decreases, which results in an increase in production costs. If the porosity exceeds 50%, the strength of the porous sintered body is lowered, and it is difficult to obtain sufficient mechanical strength. If the porosity is equal to or greater than 10%, the evaporation speed can be improved. Further, if the porosity is equal to or greater than 20%, a vapor deposition material having an evaporation speed about two times higher than the conventional ZnO vapor deposition material can be obtained.

In the porous ZnO sintered body of this aspect, the pores preferably have an average pore diameter of 0.1 to 500 µm. If the average pore diameter of the pores is within the above-described range, the evaporation speed can be further increased. If the pore diameter is smaller than 0.1 µm, there is no merit in the pores. If the pore diameter exceeds 500 µm, it is not preferable because the strength of the sintered body is lowered, which causes damages due to EB (electron beam) irradiation, that is, splash.

The term "pore diameter" (the inner diameter of the pore) refers to, for example, the maximum value of the internal dimensions in the pores when the sectional portion of the vapor deposition material is observed by observation means, such as SEM or the like. As the evaluation method of the pores, measurement of porosity by a substitution method, measurement of porosity by microscopy, measurement of surface area and micropore distribution by gas absorption, measurement of surface area and micropore distribution by a mercury intrusion method, measurement of surface area by a gas permeation method, or measurement of micropore distribution by an X-ray small-angle scattering method may be used.

The pores are preferably rounded, and in terms of improvement in the evaporation speed, micropores are preferably formed at the surface of the pores. For the evaluation method of the pores, the surface area is preferably in a range of 5 to 40 $m^2/g$, and at least one peak of the micropore distribution is present within a range of 1 to 100 µm. Portions (frame portion) other than the pores are preferably substantially sintered. For example, the frame portion of the porous sintered body preferably has a density equal to or greater than 98%.

In the porous ZnO sintered body of this aspect, it is preferable that grains preferably have an average crystal grain size of 1 to 500 µm, and rounded pores of about 0.1 to 500 µm are provided in the sintered body. The porous ZnO sintered body has a fine crystal structure in which the average crystal grain size is within the above-described range, and the occurrence of defects in the boundary of crystal grains can be reduced. Thus, the formed ZnO film has excellent film characteristics, such as ZnO film density, thickness distribution, refractive index, sputtering resistance, discharge characteristics (discharge voltage, discharge responsiveness, and the like), insulation characteristics, and the like. If the average crystal grain size is smaller than 1 µm, the speed of film formation is lowered. If the average crystal grain size exceeds 500 µm, the deposition rate of the additive element is not uniform. The average crystal grain size is preferably in a range of 5 to 40 µm, and more preferably, in a range of 10 to 30 µm.

The ZnO vapor deposition material of this aspect is preferably molded in the form of disc-like or circular pellets. When the vapor deposition material has a circular shape, the diameter of the vapor deposition material is appropriately in a range of 5 to 30 mm, and preferably, in a range of 5 to 15 mm. This is because, if the diameter is excessively small and smaller than 5 mm, splash occurs, and if the diameter exceeds 30 mm, it is difficult to handle the vapor deposition material in an actual production process. When the vapor deposition material is disc-like, the diameter of the vapor deposition material is appropriately in a range of 5 to 20 mm, and preferably, in a range of 5 to 10 mm. The height of the vapor deposition material is in a range of 1 to 10 mm, and preferably, in a range of 2 to 5 mm. This is because, if the diameter is excessively small and smaller than 5 mm or the height is excessively small and smaller than 1 mm, splash occurs, and if the diameter exceeds 30 mm or the height exceeds 10 mm, it is difficult to handle the vapor deposition material in an actual production process.

Hereinafter, a process for producing a ZnO vapor deposition material according to this aspect will be described.

[Production Process]

The ZnO vapor deposition material according to this aspect can be produced by mixing ZnO powder having a purity equal to or greater than 98%, $Y_2O_3$ powder in such an amount that the Y content in the ZnO vapor deposition material is in a range of 0.1 to 14.9% by mass, an oxide powder of a second additive element in such an amount that the content of the second additive element in the ZnO vapor deposition material is in a range of 0.1 to 10% by mass, a binder, and an organic solvent to prepare a slurry with a concentration of 30 to 75% by mass, blowing gas into the slurry to obtain a gas-containing slurry, spray-drying the gas-containing slurry to obtain a porous granulation powder having an average grain size of 50 to 300 µm, molding the porous granulation powder to obtain a porous molded body, and sintering the porous molded body at a predetermined temperature to obtain a porous ZnO sintered body.

The ZnO powder preferably has purity equal to or greater than 98%, more preferably, equal to or greater than 98.4%, and still more preferably, equal to or greater than 99%. If the ZnO powder has purity equal to or greater than 98%, reduction of conductivity by the effect of impurities can be suppressed. The average grain size of the ZnO powder is in a range of 0.1 to 10 μm. When the average grain size of the ZnO powder is smaller than 0.1 μm, the powder is excessively fine and aggregated, so there is a tendency that the handling of the powder becomes worse, and it is difficult to prepare a high-concentration slurry. When the average grain size exceeds 10 μm, there is a tendency that it is difficult to control the microstructure, and a dense pellet is hard to obtain. If the average grain size of the ZnO powder is adjusted to the above-described range, a desired sintered body is also obtained without using a sintering auxiliary agent.

With regard to the $Y_2O_3$ powder, considering the prevention of maldistribution of the Y powder, reactivity with a ZnO matrix, and the purity of a Y compound, it is preferable to add Y oxide grains whose primary grain size is of a nanometer scale. The oxide powder of the second additive element preferably has an average grain size of 0.01 to 1 μm, and still more preferably, the average grain size is in a range of 0.05 to 0.5 μm. If the oxide powder of the second additive element having this average grain size is used, it is beneficial in terms of the uniform dispersion of the oxide powder of the second additive element.

For a binder, polyethylene glycol, polyvinyl butyral, or the like may be used. It is preferable to add the binder at 0.2 to 2.5% by mass. For an organic solvent, ethanol, propanol, or the like may be used.

The raw powder, the binder, and the organic solvent are mixed to prepare a slurry with a concentration of 30 to 75% by mass, and preferably, 40 to 65% by mass. If the slurry concentration exceeds 75% by mass, since the slurry is a non-aqueous system, stable granulation is difficult. If the slurry concentration is less than 30% by mass, it is difficult to obtain a dense ZnO sintered body having a uniform composition. If the slurry concentration is adjusted within the above-described range, the viscosity of the slurry is in a range of 200 to 1000 cps. Therefore, powder granulation using a spray drier can be performed stably. Further, the density of a molded body increases, such that a dense sintered body can be obtained.

Wet blending of raw powder, a binder, and an organic solvent, and in particular, wet blending of raw powder and an organic solvent as a dispersion medium is preferably performed by a wet ball mill or a stirring mill. In the case of using a $ZrO_2$ ball in the wet ball mill, wet blending is preferably performed using a large number of $ZrO_2$ balls having a diameter of 5 to 10 mm for 8 to 24 hours, and preferably, for 20 to 24 hours. If the diameter of the $ZrO_2$ ball is smaller than 5 mm, blending may be insufficient. If the diameter of the $ZrO_2$ ball exceeds 10 mm, impurities are increased. Even though the blending time is long, up to 24 hours, impurities are hardly generated due to milling. On the other hand, when a resin ball with a metal support is used in the wet ball mill, a ball having a diameter of 10 to 15 mm is preferably used.

In the stirring mill, wet blending is preferably performed using a $ZrO_2$ ball having a diameter of 1 to 3 mm for 0.5 to 1 hour. If the diameter of the $ZrO_2$ ball is smaller than 1 mm, blending is insufficient. If the diameter exceeds 3 mm, impurities are increased. If the blending time exceeds 1 hour, while raw materials are mixed, milling leads to the generation of impurities. Sufficient blending can be done within 1 hour. Blending/granulation of powder and additives may be performed by a general tumbling granulation method. In this case, it is not necessary to perform a separation operation from the balls or the like after the process, and thus the process is simplified.

In the production process of this aspect, as a first step for obtaining a porous sintered body, gas is blown and mixed into the slurry to prepare a gas-containing slurry. Gas blowing and mixing is preferably performed by blowing using a mechanical pump, gas pressure, or the like. As the gas, air, an insoluble gas, a non-aqueous gas, or the like may be used.

The gas-containing slurry is spray-dried. The spray drying is preferably performed at 150 to 250° C. for 3 hours by using a spray drier. Since gas is blown into the slurry, the granulation powder obtained by spray-drying the slurry is porous. Through the spray drying, a porous granulation powder having an average grain size of 50 to 300 μm can be obtained.

In the production process of this aspect, as a second step for obtaining a porous sintered body, a slurry is prepared in which a foaming agent is mixed. For the foaming agent, an organic foaming agent or an inorganic foaming agent may be used. For the organic foaming agent, azodicarboxylamide, dinitrosobenta methylene tetramine, or the like is used, and for the inorganic foaming agent, carbonate or the like is used. The foaming agent may be mixed with ZnO powder, $YO_2$ powder, and $Al_2O_3$ powder, or may be added upon slurry preparation.

The foaming agent-containing slurry is spray-dried. The spray drying is preferably performed at 150 to 250° C. for 3 hours by using a spray drier. The foaming agent contained in the slurry is foamed and dissolved upon this spray drying, such that resultant granulation powder is made porous. Through the spray drying, a porous granulation powder having an average grain size of 50 to 300 μm can be obtained.

In the production process of this aspect, as a third step for obtaining a porous sintered body, a slurry is prepared in which an additive, which will be volatized and dissolved upon sintering, is mixed. Examples of the additive include butyral capable of being dissolved in a solvent, and a cellulose-based additive, a polyvinyl-based additive, a polyester-based additive, a polyethylene-based additive, and the like capable of being dissolved in an alcohol-based solvent. Examples of the additive which will not be dissolved in the alcohol-based solvent include a starch-based additive and a polystyrene-based additive having an average grain size of about several μm to 500 μm. It is preferable that butyral is mixed in the slurry at about 20% by mass, or starch is mixed in the slurry at about 20% by mass.

If the slurry contains the additive, the additive is volatized and dissolved upon sintering to form pores, thereby obtaining a porous sintered body. The diameter and shape of the pores can be controlled by adjusting the kind and amount of the additive. For example, when a butyral-based additive is used, pores having a pore diameter of 0.1 μm to 10 μm order can be formed. When starch is used, pores having the same pore diameter as the grain size of starch and the same shape as starch can be formed. Thus, when starch is used, the pore diameter and shape of the pores can be more easily controlled.

Specifically, in the case of the ZnO vapor deposition material of this aspect, a vapor deposition material using a butyral-based additive can obtain a deposition speed about 1.3 times higher than the evaporation speed of the conventional ZnO vapor deposition material having relative density equal to or greater than about 98%, and a vapor deposition material using starch having an average grain size of 0.1 to 500 μm can obtain an evaporation speed about two times. Therefore, a high speed of film formation can be obtained.

In the production process of this aspect, as a fourth step for obtaining a porous sintered body, a slurry using ZnO powder having a grain size distribution within a predetermined range is prepared. Specifically, ZnO powder having an average grain size of 10 to 500 μm and a grain size distribution within a range of ±10% of the average grain size is used. If the grain size distribution of ZnO powder is outside the range of ±10% of the average grain size, the porosity is lowered. More preferably, the grain size distribution is within a range of ±5% of the average grain size. The preferred grain size of oxide powder of the first additive element and the second additive element is significantly smaller than that of ZnO powder, and the usage is smaller than that of ZnO powder, so oxide powder of the first additive element and the second additive element may be outside the limitation of the grain size distribution.

The slurry using ZnO powder with a controlled grain size distribution is spray-dried. The spray drying is preferably performed at 150 to 250° C. for 3 hours by using a spray drier. In the slurry to be spray-dried, ZnO powder having an average grain size of 10 to 500 μm and a grain size distribution within a range of ±10% of the average grain size is used, and no fine ZnO powder is substantially contained. Thus, there are no cases where fine ZnO grains fill the gaps between ZnO grains, so the gaps between ZnO grains remain as pores, and granulation powder becomes porous. Through the spray drying, a porous granulation powder having an average grain size of 50 to 300 μm can be obtained.

After the slurry is spray-dried to obtain a granulation powder having an average grain size of 50 to 300 μm, the granulation powder is molded under a predetermined pressure. If the average grain size of the granulation powder is smaller than 50 μm, moldability deteriorates, and if the average grain size is larger than 300 μm, the density of the molded body is lowered, and the strength is likely to be insufficient.

For a pressing molding device, a uniaxial press device, a cold isostatic press (CIP) molding device, or other devices may be used. The molding pressure is appropriately in a range of 100 to 2000 kgf/cm² (9.8 to 196 MPa), and preferably, 100 to 1000 kgf/cm² (9.8 to 98 MPa). Molding is performed under pressure within the above-described range, such that the density of the molded body can be increased, deformation after sintering can be suppressed, and postprocessing is not required.

Next, the molded body is sintered. Before sintering, the molded body is preferably degreased at a temperature of 350 to 620° C. Through this degreasing, spots on the molded body after sintering can be suppressed. The degreasing is preferably performed for a sufficient time.

Sintering is performed in an atmosphere of air, an inactive gas, a vacuum, or a reductive gas at a temperature equal to or higher than 1000° C., and preferably, at a temperature of 1200 to 1400° C. for 1 to 10 hours, and preferably, for 2 to 5 hours. The sintering is performed under air pressure, but in the case of pressure sintering, such as hot press (HP) sintering or hot isostatic press (HIP) sintering, the sintering is preferably performed in an atmosphere of inactive gas, vacuum, or reductive gas at a temperature equal to or higher than 1000° C. for 1 to 5 hours.

A ZnO film is formed on the surface of the substrate by a vacuum film formation method with a ZnO vapor deposition material composed of the resultant porous sintered body as a target material. As the vacuum film formation method suitable for forming a film using the ZnO vapor deposition material of this aspect, an electron beam deposition method, an ion plating method, a sputtering method, or a plasma deposition method may be used. A ZnO film of this aspect formed by the film formation method uses the ZnO vapor deposition material of this aspect, so the ZnO film has high conductivity with specific resistance of 3 to $5 \times 10^{-4}$ Ω·cm and high permeability with visible light permeability equal to or greater than 90%, like ITO.

In the ZnO vapor deposition material of this aspect, the crystal structure distorted by the addition of Y having an ion radius larger than Zn is recovered and aligned by addition of the second additive element having a small ion radius, such as B, Al, or Ga, or Sc having high reactivity is added to recover a film having a regulated crystal structure. Therefore, a dense film can be formed, and the durability of the film can also be improved.

According to the production process of this aspect, in any of the first step of mixing gas in the slurry, the second step of preparing the foaming agent-containing slurry, the third step of preparing the slurry containing the additive which will be volatized and dissolved upon sintering, and the fourth step of preparing the slurry using ZnO powder having a grain size distribution within a predetermined range, the porosity, pore diameter, and pore shape can be easily controlled. Therefore, a vapor deposition material having optimum pores can be produced. As a result, even when a large number of pore states are required by the production conditions or the like, an optimum vapor deposition material can be provided to cope with the requirements.

The ZnO vapor deposition material of this aspect is composed mainly of a porous sintered body having a porosity of 5 to 30% and a pore diameter of 0.1 to 500 μm, so when a ZnO transparent conductive film is formed by an electron beam deposition method or an ion plating method using the ZnO vapor deposition material, the evaporation speed can be improved. That is, when film formation is performed with the same electron beam energy, the speed of film formation increases, and the operation time is shortened, thereby increasing the number of products for a predetermined time. Further, when film formation is performed at the same film formation speed, electron beam energy is reduced, and the replacement timing of a filament of an electron gun or the like is delayed, such that the number of times of maintenance is reduced and productivity is improved. As a result, production costs can be reduced.

Next, another aspect of the present invention will be described.

[ZnO Vapor Deposition Material]

A ZnO vapor deposition material of this aspect is a ZnO vapor deposition material for formation of a transparent conductive film which is composed of a sintered body containing ZnO as a major component, wherein the sintered body contains a first additive element and a second additive element, the first additive element is one or more elements selected from the group consisting of Pr, Nd, Pm, and Sm, the second additive element is one or more elements selected from the group consisting of B, Al, Ga, and Sc, the content of the first additive element is in a range of 0.1 to 14.9% by mass, the content of the second additive element is in a range of 0.1 to 10% by mass, the content of the first additive element is higher than the content of the second additive element, and the sintered body is a porous sintered body having a porosity of 3 to 50%.

The inventors have investigated in detail the effect on conductivity due to additive species and the content in a ZnO vapor deposition material and a ZnO film formed by using the vapor deposition material, and have found that there is a significant level of influence on conductivity due to the species and content of one or more first additive elements selected from the group consisting of Pr, Nd, Pm, and Sm and one or more second additive elements selected from the group consisting of B, Al, Ga, and Sc in the porous ZnO sintered body. Based on the above-described knowledge, the ZnO vapor deposition material according to this aspect contains ZnO as a major component, and also contains the first additive elements and the second additive elements, such that excess electrons contributing to conduction are developed in large amounts and maintained, thereby forming a ZnO film having high conductivity.

The ZnO vapor deposition material of this aspect contains the first additive element and the second additive element together, the first additive element is one or more rare earth elements selected from the group consisting of Pr, Nd, Pm, and Sm, and the second additive element is one or more elements selected from B, Al, Ga, and Sc. Of the second additive elements, B, Al, and Ga have an ion radius smaller than the first additive element (rare earth element), so crystals distorted by the addition of the first additive element having an ion radius larger than Zn are recovered and aligned by adding the second additive element, such as B, Al, or Ga, or the crystal structure distorted by the addition of the first additive element is recovered and aligned by adding Sc having high reactivity as the second additive element. For this reason, a ZnO film having high permeability, excellent denseness, high conductivity, and excellent durability can be formed.

As the ratio of the first additive element and the second additive element in the porous ZnO sintered body increases within a predetermined range, the conductivity of the ZnO film becomes better, and if the ratio is outside the range, the conductivity adversely deteriorates. Specifically, the content of the first additive element in the ZnO vapor deposition material is appropriately in a range of 0.1 to 14.9% by mass, and preferably, in a range of 3 to 6% by mass. If the content of the first additive element is lower than the lower limit value, 0.1% by mass, the conductivity is significantly lowered. If the content of the first additive element exceeds the upper limit value, 14.9% by mass, the permeability is significantly lowered.

The content of the second additive element in the ZnO vapor deposition material is appropriately in a range of 0.1 to 10% by mass, and preferably, in a range of 1 to 3% by mass. If the content of the second additive element is lower than the lower limit value, 0.1% by mass, the conductivity is significantly lowered. If the content of the second additive element exceeds the upper limit value, 10% by mass, compositional shift at the time of deposition occurs.

The ZnO vapor deposition material of this aspect contains a larger amount of the first additive element than the second additive element, such that a dense crystal structure is maintained. If the content of the first additive element is lower than that of the second additive element, the conductivity and permeability are lowered. The total content of the first additive element and the second additive element is preferably in a range of 0.2 to 15% by mass. If the total content of the first additive element and the second additive element exceeds this range, the specific resistance and permeability of the ZnO vapor deposition material are significantly lowered.

When a very small amount of the first additive element and the second additive element is contained in the ZnO vapor deposition material, the first additive element and the second additive element do not exist as granular precipitates in grain boundaries or grains in the ZnO matrix but are uniformly dispersed in the ZnO vapor deposition material. It is considered that, in the ZnO vapor deposition material, the first additive element and the second additive element are present as oxides.

The ZnO vapor deposition material of this aspect contains the first additive element, which is a trivalent or quadrivalent rare earth element, and the first additive element causes excess carrier electrons to be generated with respect to divalent Zn, such that high conductivity can be ensured. When a rare earth element is added to the ZnO vapor deposition material, compositional shift at the time of deposition is unlikely to occur, and a desired composition ratio can be maintained when a film is formed.

According to the ZnO vapor deposition material of this aspect, the conductivity is obtained by oxygen defect as well as compulsive injection of carrier electrons. Usually, oxygen gas is introduced in a vapor deposition method, but generally oxygen in the film composition is insufficient. At the time of transparent conductive film formation, a technique is conventionally used in which resistance is lowered by generating oxygen defect. However, in the case of adding a rare earth element, it is easy to control because the element is excellent in evaporation performance. In addition to this advantage by the addition of the first additive element which is a rare earth element, since the ZnO vapor deposition material of this aspect contains the second additive element, high conductivity like ITO can be obtained.

The ZnO vapor deposition material of this aspect is composed of a porous ZnO sintered body having a porosity of 3 to 50%. The porosity of the sintered body is appropriately in a range of 3 to 50%, preferably in a range of 5 to 30%, more preferably in a range of 10 to 30%, and still more preferably in a range of 20 to 30%. If the porosity is smaller than 3%, it is not preferable since, at the time of film formation by an electron beam deposition method or an ion plating method, the evaporation speed of the vapor deposition material does not increase, and as a result, the speed of film formation decreases, which results in an increase in production costs. If the porosity exceeds 50%, the strength of the porous sintered body is lowered, and it is difficult to obtain sufficient mechanical strength. If the porosity is equal to or greater than 10%, the evaporation speed can be improved. Further, if the porosity is equal to or greater than 20%, a vapor deposition material having an evaporation speed about two times higher than the conventional ZnO vapor deposition material can be obtained.

In the porous ZnO sintered body of this aspect, the pores preferably have an average pore diameter of 0.1 to 500 μm. If the average pore diameter of the pores is within the above-described range, the evaporation speed can be further increased. If the pore diameter is smaller than 0.1 μm, there is no merit in the pores. If the pore diameter exceeds 500 μm, it is not preferable because the strength of the sintered body is lowered, which causes damages due to EB (electron beam) irradiation, that is, splash.

The term "pore diameter" (the inner diameter of the pore) refers to, for example, the maximum value of the internal dimensions in the pores when the sectional portion of the vapor deposition material is observed by observation means, such as SEM or the like. As the evaluation method of the pores, measurement of porosity by a substitution method, measurement of porosity by microscopy, measurement of surface area and micropore distribution by gas absorption, measurement of surface area and micropore distribution by a mercury intrusion method, measurement of surface area by a gas permeation method, or measurement of micropore distribution by an X-ray small-angle scattering method may be used.

The pores are preferably rounded, and in terms of improvement in the evaporation speed, micropores are preferably formed at the surface of the pores. For the evaluation method of the pores, the surface area is preferably in a range of 5 to 40 m$^2$/g, and at least one peak of the micropore distribution is present within a range of 1 to 100 μm. Portions (frame portion) other than the pores are preferably substantially sintered. For example, the frame portion of the porous sintered body preferably has a density equal to or greater than 98%.

In the porous ZnO sintered body of this aspect, it is preferable that grains preferably have an average crystal grain size of 1 to 500 μm, and rounded pores of about 0.1 to 500 μm are provided in the sintered body. The porous ZnO sintered body has a fine crystal structure in which the average crystal grain size is within the above-described range, and the occurrence of defects in the boundary of crystal grains can be reduced. Thus, the formed ZnO film has excellent film characteristics, such as ZnO film density, thickness distribution, refractive index, sputtering resistance, discharge characteristics (discharge voltage, discharge responsiveness, and the like), insulation characteristics, and the like. If the average crystal grain size is smaller than 1 μm, the speed of film formation is lowered. If the average crystal grain size exceeds 500 the deposition rate of the additive element is not uniform. The average crystal grain size is preferably in a range of 5 to 40 and more preferably, in a range of 10 to 30 μm.

The ZnO vapor deposition material of this aspect is preferably molded in the form of disc-like or circular pellets. When the vapor deposition material has a circular shape, the diameter of the vapor deposition material is appropriately in a range of 5 to 30 mm, and preferably, in a range of 5 to 15 mm. This is because, if the diameter is excessively small and smaller than 5 mm, splash occurs, and if the diameter exceeds 30 mm, it is difficult to handle the vapor deposition material in an actual production process. When the vapor deposition material is disc-like, the diameter of the vapor deposition material is appropriately in a range of 5 to 20 mm, and preferably, in a range of 5 to 10 mm. The height of the vapor deposition material is in a range of 1 to 10 mm, and preferably, in a range of 2 to 5 mm. This is because, if the diameter is excessively small and smaller than 5 mm or the height is excessively small and smaller than 1 mm, splash occurs, and if the diameter exceeds 30 mm or the height exceeds 10 mm, it is difficult to handle the vapor deposition material in an actual production process.

Hereinafter, a process for producing a ZnO vapor deposition material according to this aspect will be described.

[Production Process]

The ZnO vapor deposition material according to this aspect can be produced by mixing ZnO powder having a purity equal to or greater than 98%, an oxide powder of a first additive element in such an amount that the content of the first additive element in the ZnO vapor deposition material is in a range of 0.1 to 14.9% by mass, an oxide powder of a second additive element in such an amount that the content of the second additive element in the ZnO vapor deposition material is in a range of 0.1 to 10% by mass, a binder, and an organic solvent to prepare a slurry with a concentration of 30 to 75% by mass, blowing gas into the slurry to obtain a gas-containing slurry, spray-drying the gas-containing slurry to obtain a porous granulation powder having an average grain size of 50 to 300 μm, molding the porous granulation powder to obtain a porous molded body, and sintering the porous molded body at a predetermined temperature to obtain a porous ZnO sintered body.

The ZnO powder preferably has purity equal to or greater than 98%, more preferably, equal to or greater than 98.4%, and still more preferably, equal to or greater than 99%. If the ZnO powder has purity equal to or greater than 98%, reduction of conductivity by the effect of impurities can be suppressed. The average grain size of the ZnO powder is in a range of 0.1 to 10 μm. When the average grain size of the ZnO powder is smaller than 0.1 μm, the powder is excessively fine and aggregated, so there is a tendency that the handling of the powder becomes worse, and it is difficult to prepare a high-concentration slurry. When the average grain size exceeds 10 μm, there is a tendency that it is difficult to control the microstructure, and a dense pellet is hard to obtain. If the average grain size of the ZnO powder is adjusted to the above-described range, a desired sintered body is also obtained without using a sintering auxiliary agent.

With regard to the oxide powder of the first additive element, considering the prevention of maldistribution of powder of the first additive element, reactivity with a ZnO matrix, and the purity of a compound of the first additive element, it is preferable to add oxide grains whose primary grain size is of a nanometer scale. The oxide powder of the second additive element preferably has an average grain size of 0.01 to 1 μm, and still more preferably, the average grain size is in a range of 0.05 to 0.5 μm. If the oxide powder of the second additive element having this average grain size is used, it is beneficial in terms of the uniform dispersion of the oxide powder of the second additive element.

For a binder, polyethylene glycol, polyvinyl butyral, or the like may be used. It is preferable to add the binder at 0.2 to 2.5% by mass. For an organic solvent, ethanol, propanol, or the like may be used.

The raw powder, the binder, and the organic solvent are mixed to prepare a slurry with a concentration of 30 to 75% by mass, and preferably, 40 to 65% by mass. If the slurry concentration exceeds 75% by mass, since the slurry is a non-aqueous system, stable granulation is difficult. If the slurry concentration is less than 30% by mass, it is difficult to obtain a dense ZnO sintered body having a uniform composition. If the slurry concentration is adjusted within the above-described range, the viscosity of the slurry is in a range of 200 to 1000 cps. Therefore, powder granulation using a spray drier can be performed stably. Further, the density of a molded body increases, such that a dense sintered body can be obtained.

Wet blending of raw powder, a binder, and an organic solvent, and in particular, wet blending of raw powder and an organic solvent as a dispersion medium is preferably performed by a wet ball mill or a stirring mill. In the case of using a $ZrO_2$ ball in the wet ball mill, wet blending is preferably performed using a large number of $ZrO_2$ balls having a diameter of 5 to 10 mm for 8 to 24 hours, and preferably, for 20 to 24 hours. If the diameter of the $ZrO_2$ ball is smaller than 5 mm, blending may be insufficient. If the diameter of the $ZrO_2$ ball exceeds 10 mm, impurities are increased. Even though the blending time is long, up to 24 hours, impurities are hardly generated due to milling. On the other hand, when a resin ball with a metal support is used in the wet ball mill, a ball having a diameter of 10 to 15 mm is preferably used.

In the stirring mill, wet blending is preferably performed using a $ZrO_2$ ball having a diameter of 1 to 3 mm for 0.5 to 1 hour. If the diameter of the $ZrO_2$ ball is smaller than 1 mm, blending is insufficient. If the diameter exceeds 3 mm, impurities are increased. If the blending time exceeds 1 hour, while raw materials are mixed, milling leads to the generation of impurities. Sufficient blending can be done within 1 hour. Blending/granulation of powder and additives may be performed by a general tumbling granulation method. In this case, it is not necessary to perform a separation operation from the balls or the like after the process, and thus the process is simplified.

In the production process of this aspect, as a first step for obtaining a porous sintered body, gas is blown and mixed into the slurry to prepare a gas-containing slurry. Gas blowing and mixing is preferably performed by blowing using a mechanical pump, gas pressure, or the like. As the gas, air, an insoluble gas, a non-aqueous gas, or the like may be used.

The gas-containing slurry is spray-dried. The spray drying is preferably performed at 150 to 250° C. for 3 hours by using a spray drier. Since gas is blown into the slurry, the granulation powder obtained by spray-drying the slurry is porous.

Through the spray drying, a porous granulation powder having an average grain size of 50 to 300 μm can be obtained.

In the production process of this aspect, as a second step for obtaining a porous sintered body, a slurry is prepared in which a foaming agent is mixed. For the foaming agent, an organic foaming agent or an inorganic foaming agent may be used. For the organic foaming agent, azodicarboxylamide, dinitrosobenta methylene tetramine, or the like is used, and for the inorganic foaming agent, carbonate or the like is used. The foaming agent may be mixed with ZnO powder, oxide powder of the first additive element, and $Al_2O_3$ powder, or may be added upon slurry preparation.

The foaming agent-containing slurry is spray-dried. The spray drying is preferably performed at 150 to 250° C. for 3 hours by using a spray drier. The foaming agent contained in the slurry is foamed and dissolved upon this spray drying, such that resultant granulation powder is made porous. Through the spray drying, a porous granulation powder having an average grain size of 50 to 300 μm can be obtained.

In the production process of this aspect, as a third step for obtaining a porous sintered body, a slurry is prepared in which an additive, which will be volatized and dissolved upon sintering, is mixed. Examples of the additive include butyral capable of being dissolved in a solvent, and a cellulose-based additive, a polyvinyl-based additive, a polyester-based additive, a polyethylene-based additive, and the like capable of being dissolved in an alcohol-based solvent. Examples of the additive which will not be dissolved in the alcohol-based solvent include a starch-based additive and a polystyrene-based additive having an average grain size of about several μm to 500 μm. It is preferable that butyral is mixed in the slurry at about 20% by mass, or starch is mixed in the slurry at about 20% by mass.

If the slurry contains the additive, the additive is volatized and dissolved upon sintering to form pores, thereby obtaining a porous sintered body. The diameter and shape of the pores can be controlled by adjusting the kind and amount of the additive. For example, when a butyral-based additive is used, pores having a pore diameter of 0.1 μm to 10 μm order can be formed. When starch is used, pores having the same pore diameter as the grain size of starch and the same shape as starch can be formed. Thus, when starch is used, the pore diameter and shape of the pores can be more easily controlled.

Specifically, in the case of the ZnO vapor deposition material of this aspect, a vapor deposition material using a butyral-based additive can obtain a deposition speed about 1.3 times higher than the evaporation speed of the conventional ZnO vapor deposition material having relative density equal to or greater than about 98%, and a vapor deposition material using starch having an average grain size of 0.1 to 500 μm can obtain an evaporation speed about 2.5 times higher than the evaporation speed of the conventional ZnO vapor deposition material having relative density equal to or greater than about 98%. Therefore, a high speed of film formation can be obtained.

In the production process of this aspect, as a fourth step for obtaining a porous sintered body, a slurry using ZnO powder having a grain size distribution within a predetermined range is prepared. Specifically, ZnO powder having an average grain size of 10 to 500 μm and a grain size distribution within a range of ±10% of the average grain size is used. If the grain size distribution of ZnO powder is outside the range of ±10% of the average grain size, the porosity is lowered. More preferably, the grain size distribution is within a range of ±5% of the average grain size. The preferred grain size of oxide powder of the first additive element and $Al_2O_3$ powder is significantly smaller than that of ZnO powder, and the usage is smaller than that of ZnO powder, so oxide powder of the first additive element and $Al_2O_3$ powder may be outside the limitation of the grain size distribution.

The slurry using ZnO powder with a controlled grain size distribution is spray-dried. The spray drying is preferably performed at 150 to 250° C. for 3 hours by using a spray drier. In the slurry to be spray-dried, ZnO powder having an average grain size of 10 to 500 μm and a grain size distribution within a range of ±10% of the average grain size is used, and no fine ZnO powder is substantially contained. Thus, there are no cases where fine ZnO grains fill the gaps between ZnO grains, so the gaps between ZnO grains remain as pores, and granulation powder becomes porous. Through the spray drying, a porous granulation powder having an average grain size of 50 to 300 μm can be obtained.

After the slurry is spray-dried to obtain a granulation powder having an average grain size of 50 to 300 μm, the granulation powder is molded under a predetermined pressure. If the average grain size of the granulation powder is smaller than 50 μm, moldability deteriorates, and if the average grain size is larger than 300 μm, the density of the molded body is lowered, and the strength is likely to be insufficient.

For a pressing molding device, a uniaxial press device, a cold isostatic press (CIP) molding device, or other devices may be used. The molding pressure is appropriately in a range of 100 to 2000 kgf/cm$^2$ (9.8 to 196 MPa), and preferably, 100 to 1000 kgf/cm$^2$ (9.8 to 98 MPa). Molding is performed under pressure within the above-described range, such that the density of the molded body can be increased, deformation after sintering can be suppressed, and postprocessing is not required.

Next, the molded body is sintered. Before sintering, the molded body is preferably degreased at a temperature of 350 to 620° C. Through this degreasing, spots on the molded body after sintering can be suppressed. The degreasing is preferably performed for a sufficient time.

Sintering is performed in an atmosphere of air, an inactive gas, a vacuum, or a reductive gas at a temperature equal to or higher than 1000° C., and preferably, at a temperature of 1200 to 1400° C. for 1 to 10 hours, and preferably, for 2 to 5 hours. The sintering is performed under air pressure, but in the case of pressure sintering, such as hot press (HP) sintering or hot isostatic press (HIP) sintering, the sintering is preferably performed in an atmosphere of inactive gas, vacuum, or reductive gas at a temperature equal to or higher than 1000° C. for 1 to 5 hours.

A ZnO film is formed on the surface of the substrate by a vacuum film formation method with a ZnO vapor deposition material composed of the resultant porous sintered body as a target material. As the vacuum film formation method suitable for forming a film using the ZnO vapor deposition material of this aspect, an electron beam deposition method, an ion plating method, a sputtering method, or a plasma deposition method may be used. A ZnO film of this aspect formed by the film formation method uses the ZnO vapor deposition material of this aspect, so the ZnO film has high conductivity with specific resistance of 3 to 5×10$^{-4}$ Ω·cm and high permeability with visible light permeability equal to or greater than 90%, like ITO.

In the ZnO vapor deposition material of this aspect, the crystal structure distorted by the addition of the first additive element (rare earth element) having an ion radius larger than Zn is recovered and aligned by addition of the second additive element having a small ion radius, such as B, Al, or Ga, or Sc having high reactivity is added to recover a film having a regulated crystal structure. Therefore, a dense film can be formed, and the durability of the film can also be improved.

According to the production process of this aspect, in any of the first step of mixing gas in the slurry, the second step of preparing the foaming agent-containing slurry, the third step of preparing the slurry containing the additive which will be volatized and dissolved upon sintering, and the fourth step of preparing the slurry using ZnO powder having a grain size distribution within a predetermined range, the porosity, pore diameter, and pore shape can be easily controlled. Therefore, a vapor deposition material having optimum pores can be produced. As a result, even when a large number of pore states are required by the production conditions or the like, an optimum vapor deposition material can be provided to cope with the requirements.

The ZnO vapor deposition material of this aspect is composed mainly of a porous sintered body having a porosity of 5 to 30% and a pore diameter of 0.1 to 500 µm, so when a ZnO transparent conductive film is formed by an electron beam deposition method or an ion plating method using the ZnO vapor deposition material, the evaporation speed can be improved. That is, when film formation is performed with the same electron beam energy, the speed of film formation increases, and the operation time is shortened, thereby increasing the number of products for a predetermined time. Further, when film formation is performed at the same film formation speed, electron beam energy is reduced, and the replacement timing of a filament of an electron gun or the like is delayed, such that the number of times of maintenance is reduced and productivity is improved. As a result, production costs can be reduced.

Next, another aspect of the present invention will be described.

[ZnO Vapor Deposition Material]

A ZnO vapor deposition material of this aspect is a ZnO vapor deposition material for formation of a transparent conductive film which is composed of a ZnO sintered body having a ZnO purity equal to or greater than 98%, wherein the sintered body contains one or more additive elements selected from the group consisting of Y, La, Sc, Ce, Pr, Nd, Pm, and Sm, and the sintered body is a porous sintered body having a porosity of 3 to 50%.

The inventors have investigated in detail the effect on conductivity due to additive species and the content in a ZnO vapor deposition material and a ZnO film formed by using the vapor deposition material, and have found that there is a significant level of influence on conductivity due to the species and content of one or more additive elements selected from the group consisting of Y, La, Sc, Ce, Pr, Nd, Pm, and Sm in the porous ZnO sintered body. Based on the above-described knowledge, the ZnO vapor deposition material according to this aspect contains ZnO as a major component, and also contains the additive elements, such that excess electrons contributing to conduction are developed in large amounts and maintained, thereby forming a ZnO film having high conductivity.

The ZnO vapor deposition material of this aspect is composed of a ZnO sintered body having a ZnO purity equal to or greater than 98%, preferably equal to or greater than 98.4%, and more preferably equal to or greater than 99%. If the ZnO purity is smaller than 98%, the conductivity is lowered by the effect of impurities. The ZnO sintered body may be monocrystal or polycrystal.

The ZnO sintered body contains one or more additive elements selected from the group consisting of Y, La, Sc, Ce, Pr, Nd, Pm, and Sm. The additive element includes a misch metal (also indicated by Mm) which is a mixture with La, Ce, or Nd as a major component.

As the concentration of the additive elements in the porous ZnO sintered body increases, the conductivity of the ZnO film becomes better, and if the concentration further increases, the conductivity adversely deteriorates. Thus, there is an optimum concentration range for obtaining a ZnO film having high conductivity. Specifically, the content of the additive elements is appropriately in a range of 2 to 20% by mass, and preferably, in a range of 3 to 6% by mass. If the content of the additive elements is lower than 2% by mass, the conductivity is not improved. If the content of the additive elements exceeds 20% by mass, the conductivity is lowered and the permeability is deteriorated.

Since a very small amount of the additive elements is contained, the additive elements do not exist as granular precipitates in grain boundaries or grains in the ZnO matrix but are uniformly dispersed in the ZnO sintered body. The additive elements exist in the ZnO vapor deposition material as oxide. For example, Y is present as $Y_2O_3$, and La is present as $La_2O_3$. Sc is present as $Sc_2O_3$, and Ce is present as $CeO_2$ or $Ce_2O_3$. Pr is present as $Pr_6O_{11}$, and Nd is present as $Nd_2O_3$. Pm is present as $Pm_2O_3$, and Sm is present as $Sm_2O_3$.

The ZnO vapor deposition material of this aspect contains a tri- or quadri- or more valent rare earth element, and the rare earth element can cause excess carrier electrons to be generated with respect to divalent Zn. When a rare earth element is added to the ZnO vapor deposition material, compositional shift at the time of deposition is unlikely to occur, and a desired composition ratio can be maintained when a film is formed.

In general, as a mechanism for obtaining the conductivity, oxygen defect is used, as well as compulsive injection of carrier electrons. Usually, oxygen gas is introduced in a vapor deposition method, but generally oxygen in the film composition is insufficient. At the time of transparent conductive film formation, a technique is conventionally used in which resistance is lowered by generating oxygen defect. However, in the case of adding a rare earth element, it is easy to control because the element is excellent in evaporation performance. With this advantage, the present invention uses an additive element other than Al or Ga, thereby obtaining conductivity like ITO.

The ZnO vapor deposition material of this aspect is composed of a porous ZnO sintered body having a porosity of 3 to 50%. The porosity of the sintered body is appropriately in a range of 3 to 50%, preferably in a range of 5 to 30%, more preferably in a range of 10 to 30%, and still more preferably in a range of 20 to 30%. If the porosity is smaller than 3%, it is not preferable since, at the time of film formation by an electron beam deposition method or an ion plating method, the evaporation speed of the vapor deposition material does not increase, and as a result, the speed of film formation decreases, which results in an increase in production costs. If the porosity exceeds 50%, the strength of the porous sintered body is lowered, and it is difficult to obtain sufficient mechanical strength. If the porosity is equal to or greater than 10%, the evaporation speed can be improved. Further, if the porosity is equal to or greater than 20%, a vapor deposition material having an evaporation speed about two times higher than the conventional ZnO vapor deposition material can be obtained.

In the porous ZnO sintered body of this aspect, the pores preferably have an average pore diameter of 0.1 to 500 µm. If the average pore diameter of the pores is within the above-described range, the evaporation speed can be further increased. If the pore diameter is smaller than 0.1 µm, there is no merit in the pores. If the pore diameter exceeds 500 µm, it is not preferable because the strength of the sintered body is lowered, which causes damages due to EB (electron beam) irradiation, that is, splash.

The term "pore diameter" (the inner diameter of the pore) refers to, for example, the maximum value of the internal dimensions in the pores when the sectional portion of the vapor deposition material is observed by observation means, such as SEM or the like. As the evaluation method of the pores, measurement of porosity by a substitution method, measurement of porosity by microscopy, measurement of surface area and micropore distribution by gas absorption, measurement of surface area and micropore distribution by a mercury intrusion method, measurement of surface area by a gas permeation method, or measurement of micropore distribution by an X-ray small-angle scattering method may be used.

The pores are preferably rounded, and in terms of improvement in the evaporation speed, micropores are preferably formed at the surface of the pores. For the evaluation method of the pores, the surface area is preferably in a range of 5 to 40 $m^2/g$, and at least one peak of the micropore distribution is present within a range of 1 to 100 µm. Portions (frame portion) other than the pores are preferably substantially sintered. For example, the frame portion of the porous sintered body preferably has a density equal to or greater than 98%.

In the porous ZnO sintered body of this aspect, it is preferable that grains preferably have an average crystal grain size of 1 to 500 µm, and rounded pores of about 0.1 to 500 µm are provided in the sintered body. The porous ZnO sintered body has a fine crystal structure in which the average crystal grain size is within the above-described range, and the occurrence of defects in the boundary of crystal grains can be reduced. Thus, the formed ZnO film has excellent film characteristics, such as ZnO film density, thickness distribution, refractive index, sputtering resistance, discharge characteristics (discharge voltage, discharge responsiveness, and the like), insulation characteristics, and the like. If the average crystal grain size is smaller than 1 µm, the speed of film formation is lowered. If the average crystal grain size exceeds 500 µm, the deposition rate of the additive element is not uniform. The average crystal grain size is preferably in a range of 5 to 40 µm, and more preferably, in a range of 10 to 30 µm.

The ZnO vapor deposition material of this aspect is preferably molded in the form of disc-like or circular pellets. When the vapor deposition material has a circular shape, the diameter of the vapor deposition material is appropriately in a range of 5 to 30 mm, and preferably, in a range of 5 to 15 mm. This is because, if the diameter is excessively small and smaller than 5 mm, splash occurs, and if the diameter exceeds 30 mm, it is difficult to handle the vapor deposition material in an actual production process. When the vapor deposition material is disk-like, the diameter of the vapor deposition material is appropriately in a range of 5 to 50 mm, and preferably, in a range of 5 to 10 mm. The height of the vapor deposition material is in a range of 1 to 30 mm, and preferably, in a range of 2 to 5 mm. This is because, if the diameter is excessively small and smaller than 5 mm or the height is excessively small and smaller than 1 mm, splash occurs, and if the diameter exceeds 50 mm or the height exceeds 30 mm, upon deposition, a uniform film is not formed and the film formation speed is lowered due to the decrease in the filling ratio to a hearth (vapor deposition material crucible).

Hereinafter, a process for producing a ZnO vapor deposition material according to this aspect will be described.

[Production Process]

The ZnO vapor deposition material according to this aspect can be produced by mixing ZnO powder having a purity equal to or greater than 98%, an oxide powder of additive elements, a binder, and an organic solvent to prepare a slurry with a concentration of 30 to 75% by mass, blowing gas into the slurry to obtain a gas-containing slurry, spray-drying the gas-containing slurry to obtain a porous granulation powder having an average grain size of 50 to 300 µm, molding the porous granulation powder to obtain a porous molded body, and sintering the porous molded body at a predetermined temperature to obtain a porous ZnO sintered body.

The ZnO powder preferably has purity equal to or greater than 98%, more preferably, equal to or greater than 98.4%, and still more preferably, equal to or greater than 99%. If the ZnO powder has purity equal to or greater than 98%, reduction of conductivity by the effect of impurities can be suppressed. The average grain size of the ZnO powder is in a range of 0.1 to 10 µm. When the average grain size of the ZnO powder is smaller than 0.1 µm, the powder is excessively fine and aggregated, so there is a tendency that the handling of the powder becomes worse, and it is difficult to prepare a high-concentration slurry. When the average grain size exceeds 10 µm, there is a tendency that it is difficult to control the microstructure, and a dense pellet is hard to obtain. If the average grain size of the ZnO powder is adjusted to the above-described range, a desired sintered body is also obtained without using a sintering auxiliary agent.

With regard to the oxide powder of the additive element, considering the prevention of maldistribution of the powder, reactivity with a ZnO matrix, and the purity of a compound of the additive element, it is preferable to add oxide grains whose primary grain size is of a nanometer scale. The oxide powder of the additive element preferably has an average grain size of 0.01 to 1 µm, and still more preferably, the average grain size is in a range of 0.05 to 0.5 µm. If the oxide powder of the additive element having this average grain size is used, it is beneficial in terms of the uniform dispersion of the oxide powder of the additive element.

Oxide powder is used in such an amount that the content of the additive elements in the ZnO sintered body is in a range of 2 to 20% by mass, and preferably, in a range of 3 to 6% by mass, and oxide powder of the additive elements are mixed in ZnO powder to prepare raw powder.

For a binder, polyethylene glycol, polyvinyl butyral, or the like may be used. It is preferable to add the binder at 0.2 to 2.5% by mass. For an organic solvent, ethanol, propanol, or the like may be used.

The raw powder, the binder, and the organic solvent are mixed to prepare a slurry with a concentration of 30 to 75% by mass, and preferably, 40 to 65% by mass. If the slurry concentration exceeds 75% by mass, since the slurry is a non-aqueous system, stable granulation is difficult. If the slurry concentration is less than 30% by mass, it is difficult to obtain a dense ZnO sintered body having a uniform composition. If the slurry concentration is adjusted within the above-described range, the viscosity of the slurry is in a range of 200 to 1000 cps. Therefore, powder granulation using a spray drier can be performed stably. Further, the density of a molded body increases, such that a dense sintered body can be obtained.

Wet blending of raw powder, a binder, and an organic solvent, and in particular, wet blending of raw powder and an organic solvent as a dispersion medium is preferably performed by a wet ball mill or a stirring mill. In the case of using a $ZrO_2$ ball in the wet ball mill, wet blending is preferably performed using a large number of $ZrO_2$ balls having a diameter of 5 to 10 mm for 8 to 24 hours, and preferably, for 20 to 24 hours. If the diameter of the $ZrO_2$ ball is smaller than 5 mm, blending may be insufficient. If the diameter of the $ZrO_2$ ball exceeds 10 mm, impurities are increased. Even though the blending time is long, up to 24 hours, impurities are hardly generated due to milling. On the other hand, when a resin ball with a metal support is used in the wet ball mill, a ball having a diameter of 10 to 15 mm is preferably used.

In the stirring mill, wet blending is preferably performed using a $ZrO_2$ ball having a diameter of 1 to 3 mm for 0.5 to 1 hour. If the diameter of the $ZrO_2$ ball is smaller than 1 mm, blending is insufficient. If the diameter exceeds 3 mm, impurities are increased. If the blending time exceeds 1 hour, while raw materials are mixed, milling leads to the generation of impurities. Sufficient blending can be done within 1 hour. Blending/granulation of powder and additives may be performed by a general tumbling granulation method. In this case, it is not necessary to perform a separation operation from the balls or the like after the process, and thus the process is simplified.

In the production process of this aspect, as a first step for obtaining a porous sintered body, gas is blown and mixed into the slurry to prepare a gas-containing slurry. Gas blowing and mixing is preferably performed by blowing using a mechanical pump, gas pressure, or the like. As the gas, air, an insoluble gas, a non-aqueous gas, or the like may be used.

The gas-containing slurry is spray-dried. The spray drying is preferably performed at 150 to 250° C. for 3 hours by using a spray drier. Since gas is blown into the slurry, the granulation powder obtained by spray-drying the slurry is porous. Through the spray drying, a porous granulation powder having an average grain size of 50 to 300 μm can be obtained.

In the production process of this aspect, as a second step for obtaining a porous sintered body, a slurry is prepared in which a foaming agent is mixed. For the foaming agent, an organic foaming agent or an inorganic foaming agent may be used. For the organic foaming agent, azodicarboxylamide, dinitrosobenta methylene tetramine, or the like is used, and for the inorganic foaming agent, carbonate or the like is used. The foaming agent may be mixed with ZnO powder, oxide powder of the first additive element, and $Al_2O_3$ powder, or may be added upon slurry preparation.

The foaming agent-containing slurry is spray-dried. The spray drying is preferably performed at 150 to 250° C. for 3 hours by using a spray drier. The foaming agent contained in the slurry is foamed and dissolved upon this spray drying, such that resultant granulation powder is made porous. Through the spray drying, a porous granulation powder having an average grain size of 50 to 300 μm can be obtained.

In the production process of this aspect, as a third step for obtaining a porous sintered body, a slurry is prepared in which an additive, which will be volatized and dissolved upon sintering, is mixed. Examples of the additive include butyral capable of being dissolved in a solvent, and a cellulose-based additive, a polyvinyl-based additive, a polyester-based additive, a polyethylene-based additive, and the like capable of being dissolved in an alcohol-based solvent. Examples of the additive which will not be dissolved in the alcohol-based solvent include a starch-based additive and a polystyrene-based additive having an average grain size of about several μm to 500 μm. It is preferable that butyral is mixed in the slurry at about 20% by mass, or starch is mixed in the slurry at about 20% by mass.

If the slurry contains the additive, the additive is volatized and dissolved upon sintering to form pores, thereby obtaining a porous sintered body. The diameter and shape of the pores can be controlled by adjusting the kind and amount of the additive. For example, when a butyral-based additive is used, pores having a pore diameter of 0.1 μm to 10 μm order can be formed. When starch is used, pores having the same pore diameter as the grain size of starch and the same shape as starch can be formed. Thus, when starch is used, the pore diameter and shape of the pores can be more easily controlled.

Specifically, in the case of the ZnO vapor deposition material of this aspect, a vapor deposition material using a butyral-based additive can obtain a deposition speed about 1.3 times higher than the evaporation speed of the conventional ZnO vapor deposition material having relative density equal to or greater than about 98%, and a vapor deposition material using starch having an average grain size of 0.1 to 500 μm can obtain an evaporation speed about 2.5 times higher than the evaporation speed of the conventional ZnO vapor deposition material having relative density equal to or greater than about 98%. Therefore, a high speed of film formation can be obtained.

In the production process of this aspect, as a fourth step for obtaining a porous sintered body, a slurry using ZnO powder having a grain size distribution within a predetermined range is prepared. Specifically, ZnO powder having an average grain size of 10 to 500 μm and a grain size distribution within a range of ±10% of the average grain size is used. If the grain size distribution of ZnO powder is outside the range of ±10% of the average grain size, the porosity is lowered. More preferably, the grain size distribution is within a range of ±5% of the average grain size. The preferred grain size of oxide powder of the first additive element and $Al_2O_3$ powder is significantly smaller than that of ZnO powder, and the usage is smaller than that of ZnO powder, so oxide powder of the first additive element and $Al_2O_3$ powder may be outside the limitation of the grain size distribution.

The slurry using ZnO powder with a controlled grain size distribution is spray-dried. The spray drying is preferably performed at 150 to 250° C. for 3 hours by using a spray drier. In the slurry to be spray-dried, ZnO powder having an average grain size of 10 to 500 μm and a grain size distribution within a range of ±10% of the average grain size is used, and no fine ZnO powder is substantially contained. Thus, there are no cases where fine ZnO grains fill the gaps between ZnO grains, so the gaps between ZnO grains remain as pores, and granulation powder becomes porous. Through the spray drying, a porous granulation powder having an average grain size of 50 to 300 μm can be obtained.

After the slurry is spray-dried to obtain a granulation powder having an average grain size of 50 to 300 μm, the granulation powder is molded under a predetermined pressure. If the average grain size of the granulation powder is smaller than 50 μm, moldability deteriorates, and if the average grain size is larger than 300 μm, the density of the molded body is lowered, and the strength is likely to be insufficient.

For a pressing molding device, a uniaxial press device, a cold isostatic press (CIP) molding device, or other devices may be used. The molding pressure is appropriately in a range of 100 to 2000 kgf/cm² (9.8 to 196 MPa), and preferably, 100 to 1000 kgf/cm² (9.8 to 98 MPa). Molding is performed under pressure within the above-described range, such that the density of the molded body can be increased, deformation after sintering can be suppressed, and postprocessing is not required.

Next, the molded body is sintered. Before sintering, the molded body is preferably degreased at a temperature of 350 to 620° C. Through this degreasing, spots on the molded body after sintering can be suppressed. The degreasing is preferably performed for a sufficient time.

Sintering is performed in an atmosphere of air, an inactive gas, a vacuum, or a reductive gas at a temperature equal to or higher than 1000° C., and preferably, at a temperature of 1200 to 1400° C. for 1 to 10 hours, and preferably, for 2 to 5 hours.

The sintering is performed under air pressure, but in the case of pressure sintering, such as hot press (HP) sintering or hot isostatic press (HIP) sintering, the sintering is preferably performed in an atmosphere of inactive gas, vacuum, or reductive gas at a temperature equal to or higher than 1000° C. for 1 to 5 hours.

A ZnO film is formed on the surface of the substrate by a vacuum film formation method with a ZnO vapor deposition material composed of the resultant porous sintered body as a target material. As the vacuum film formation method suitable for forming a film using the ZnO vapor deposition material of this aspect, an electron beam deposition method, an ion plating method, a sputtering method, or a plasma deposition method may be used. A ZnO film of this aspect formed by the film formation method uses the ZnO vapor deposition material containing the additive elements, so the ZnO film having high conductivity and visible light permeability is obtained.

According to the production process of this aspect, in any of the first step of mixing gas in the slurry, the second step of preparing the foaming agent-containing slurry, the third step of preparing the slurry containing the additive which will be volatized and dissolved upon sintering, and the fourth step of preparing the slurry using ZnO powder having a grain size distribution within a predetermined range, the porosity, pore diameter, and pore shape can be easily controlled. Therefore, a vapor deposition material having optimum pores can be produced. As a result, even when a large number of pore states are required by the production conditions or the like, an optimum vapor deposition material can be provided to cope with the requirements.

The ZnO vapor deposition material of this aspect is composed mainly of a porous sintered body having a porosity of 5 to 30% and a pore diameter of 0.1 to 500 μm, so when a ZnO transparent conductive film is formed by an electron beam deposition method or an ion plating method using the ZnO vapor deposition material, the evaporation speed can be improved. That is, when film formation is performed with the same electron beam energy, the speed of film formation increases, and the operation time is shortened, thereby increasing the number of products for a predetermined time. Further, when film formation is performed at the same film formation speed, electron beam energy is reduced, and the replacement timing of a filament of an electron gun or the like is delayed, such that the number of times of maintenance is reduced and productivity is improved. As a result, production costs can be reduced.

EXAMPLES

Hereinafter, Example A Group of the present invention will be described together with Comparative Example A Group. In Example A and Comparative Example A, commercially available ZnO powder (having a purity equal to or greater than 99% and an average grain size of 0.3 $CeO_2$ powder (having a purity equal to or greater than 99% and an average grain size of 0.3 μm), and $Al_2O_3$ powder (having a purity equal to or greater than 99% and an average grain size of 0.3 μm) were used. In any case, a slurry was prepared by using a ball mill (with a nylon-coated steel ball having a diameter of 5 to 20 mm), and wet blending was performed for 24 hours. In any case, a uniaxial molding press device was used as the molding device, and molded bodies having an outer diameter of 6.7 mmφ and a thickness of 2.0 mm were molded under pressure of 100 kgf/cm² (9.8 MPa). The molded bodies were put in an electric furnace and calcinated under air pressure at 1300° C. for 3 hours, thereby obtaining sintered body pellets.

In Example A and Comparative Example A, the porosity was measured by a substitution method. The measurement of the average pore diameter and the crystal grain size was performed by SEM (Scanning Electron Microscopy). The evaporation speed was measured by a quartz crystal thickness monitor provided obliquely above the hearth. The specific resistance was measured by a four-terminal four-probe method with the application of a constant current at 25° C. in an atmosphere by using Loresta (trademark) from Mitsubishi Chemical Corporation (HP MCP-T410, probe in series, 1.5 mm pitch) as the measuring instrument. The visible light permeability was measured by placing the substrate after film formation vertically to measurement light for a visible wavelength band (380 to 780 nm) by using a spectrophotometer U-4000 manufactured by Hitachi, Ltd. as the measuring instrument.

Example A1

1% by mass of polyvinyl butyral as a binder was added to 100 g of a raw powder containing 91 g of ZnO powder, 6.2 g of $CeO_2$ powder, and 2.8 g of $Al_2O_3$ powder, and methylated alcohol as a dispersion medium was further added, thereby obtaining a slurry with a concentration of 30% by mass. Next, the slurry was put in a ball mill, air was blown into the slurry, and wet blending was performed, thereby obtaining a gas-containing slurry. The slurry was dry-comminuted after the dispersion medium in the slurry was vaporized by a vacuum drier at 80° C., thereby obtaining porous granulation powder having an average grain size of 200 μm. The granulation powder was molded under a predetermined pressure, and a molded body was calcinated, thereby producing porous sintered body pellets (ZnO vapor deposition material). The porosity, average pore diameter, and average crystal grain size of the sintered body are shown in Table 1.

Example A2

An organic foaming agent and an inorganic foaming agent were added to 100 g of the same raw powder as in Example A1, 1% by mass of polyvinyl butyral as a binder was added, and methylated alcohol was further added as a dispersion medium, thereby obtaining a slurry (viscosity 200 to 4000 cps) with a concentration of 30% by mass. For the organic foaming agent, azodicarboxylamide and dinitrosobenta methylene tetramine were used, and for the inorganic foaming agent, carbonate was used. The foaming agent-containing slurry was put in a ball mill, wet blending was performed, then, the slurry was dry-comminuted after the dispersion medium in the slurry was vaporized by a vacuum drier at 80° C., thereby obtaining porous granulation powder having an average grain size of 200 μm. The granulation powder was molded under a predetermined pressure and calcinated, thereby producing porous sintered body pellets (ZnO vapor deposition material). The porosity, average pore diameter, and average crystal grain size of the sintered body are shown in Table 1.

Example A3

An additive which will be volatized and dissolved upon calcination was added to 100 g of the same raw powder as in Example A1, 1% by mass of polyvinyl butyral was added as a binder, and methylated alcohol was further added as a dispersion medium, thereby obtaining a slurry (viscosity 200 to 4000 cps) with a concentration of 30% by mass. For the additive which will be volatized and dissolved upon calcination, 20% by mass of polyvinyl butyral was used. The additive-containing slurry was put in a ball mill, wet blending was performed, then, the slurry was dry-comminuted after the dispersion medium in the slurry was vaporized by a vacuum drier at 80° C., thereby obtaining granulation powder having an average grain size of 200 μm. The granulation powder was molded under a predetermined pressure, and the molded bodies were calcinated such that the additive was volatized and dissolved, thereby producing porous sintered body pellets (ZnO vapor deposition material). The porosity, average pore diameter, and average crystal grain size of the sintered body are shown in Table 1.

Example A4

A porous sintered body pellet (ZnO vapor deposition material) was produced in the same manner as in Example A3 except that, for the additive which will be volatized and dissolved upon calcination, 20% by mass of starch having a grain size of 50 μm was used. The porosity, average pore diameter, and average crystal grain size of the sintered body are shown in Table 1.

Example A5

The same raw powder as in Example A1 was used, and ZnO powder was filtered such that ZnO powder having an average grain size of 60 μm and a grain size distribution within a range of 55 to 65 μm was obtained. 1% by mass of polyvinyl butyral as a binder and also 30% by mass of methylated alcohol as an organic solvent were added to raw powder containing the ZnO powder and then mixed, thereby preparing a slurry in which the concentration of ZnO powder was 30% by mass. Next, the slurry was spray-dried, thereby obtaining porous granulation powder having an average grain size of 200 μm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 1.

Comparative Example A1

The same raw powder as in Example A1 was used, a slurry was prepared in the same manner as in Example A1 except that introduction of air into the slurry, addition of a foaming agent, and use of an additive which will be volatized and dissolved upon calcination were not performed, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 1.

Comparative Example A2

A slurry was prepared in the same manner as in Comparative Example A1 except that 100 g of ZnO powder containing no $CeO_2$ powder and $Al_2O_3$ powder was used, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 1.

[Deposition Test A]

A deposition test A was carried out using the ZnO vapor deposition materials of Examples A1 to A5 and the ZnO vapor deposition materials of Comparative Examples A1 and A2. A vapor deposition material as a sample was put in the hearth (diameter 50 mm, depth 25 mm) of the electron beam deposition device, adjustment was done in an atmosphere of an ultimate vacuum $2.66 \times 10^{-4}$ Pa ($2.0 \times 10^{-6}$ Torr) and $O_2$ partial pressure $1.33 \times 10^{-2}$ Pa ($1.0 \times 10^{-4}$ Torr), and an electron beam with an acceleration voltage of 10 kV and a beam scan area of about 40 mmφ was irradiated to heat the ZnO vapor deposition material, thereby forming a ZnO film. The evaporation speed was measured by a quartz crystal thickness monitor provided obliquely above the hearth. The results are shown in Table 1. As shown in Table 1, in Examples A1 to A5, the deposition speed is about 1.1 to 2 times higher than in Comparative Examples A1 and A2, and the evaporation speed is higher.

[Moisture Resistance Test A]

For the samples of Examples A1 to A5 and Comparative Examples A1 and A2, a moisture resistance test A was performed. In the moisture resistance test A, the resistance value of a film was measured hourly for 2000 hours in an atmosphere of humidity 60% and temperature 90° C. The results are shown in Table 2. As shown in Table 2, with regard to the moisture resistance of a ZnO film formed of a ZnO vapor deposition material containing Ce and Al, the deterioration rate of specific resistance is several times lower than a ZnO film containing no Ce and Al. This indicates that a ZnO film containing Ce and Al is several times more stable.

Examples A6 to A8

A porous sintered body pellet (ZnO vapor deposition material) was produced in the same manner as in Example A1 except that adjustment was done such that the Ce content was 0.2% by mass, the Al content was 0.1% by mass, and the porosity was in a range of 8 to 31%.

Examples A9 to A11

A porous sintered body pellet (ZnO vapor deposition material) was produced in the same manner as in Example A1 except that adjustment was done such that the Ce content was 14.9% by mass, the Al content was 10% by mass, and the porosity was in a range of 9 to 30%.

Comparative Example A3

A porous sintered body pellet (ZnO vapor deposition material) was produced in the same manner as in Examples A6 to A8 except that adjustment was done such that the porosity was 2%.

Comparative Example A4

A porous sintered body pellet (ZnO vapor deposition material) was produced in the same manner as in Examples A9 to A11 except that adjustment was done such that the porosity was 2%.

Comparative Examples A5 to A8

A porous sintered body pellet (ZnO vapor deposition material) was produced in the same manner as in Example A1 except that adjustment was done such that the Ce content was 20% by mass, the Al content was 15% by mass, and the porosity was in a range of 2 to 29%.

For the samples of Examples A6 to A11 and Comparative Examples A3 to A8, the deposition test A was performed. The results are shown in Table 3. As shown in Table 3, similar to Table 1, in Examples A6 to A11, the ZnO vapor deposition material has a high evaporation speed and excellent specific resistance, as compared with Comparative Example A Group. On the other hand, in Comparative Examples A2, A3, A4, and A8 having a small porosity, the evaporation speed is considerably low at 13.0 to 14.7. In Comparative Examples A5 to A8 in which the Ce content and the Al content are high, the ZnO film has very large specific resistance and considerably low permeability.

TABLE 1

Deposition test A results using ZnO vapor deposition material containing
CeO$_2$: 6.2% (Ce: 5.1%), Al$_2$O$_3$: 2.8% (Al: 1.5%)

| | ZnO Vapor Deposition Material | | | Evaporation Speed | | | ZnO Film | | |
|---|---|---|---|---|---|---|---|---|---|
| | Porosity | Pore Diameter | Crystal Grain size | 20 mA | 60 mA | 100 mA | Specific Resistance | Permeability | Remarks |
| Example A1 | 18 | 24 | 60 | 6.4 | 18.3 | 31.2 | $3.8 \times 10^{-4}$ | 88 | Air Blow |
| Example A2 | 24 | 30 | 48 | 8.3 | 24.7 | 36.9 | $4.0 \times 10^{-4}$ | 89 | Foaming Agent |
| Example A3 | 27 | 35 | 41 | 8.5 | 25.8 | 43.5 | $4.1 \times 10^{-4}$ | 88 | Volatized Upon |
| Example A4 | 30 | 46 | 37 | 9.1 | 26.4 | 46.3 | $4.1 \times 10^{-4}$ | 87 | Calcination |
| Example A5 | 9 | 10 | 62 | 5.9 | 18.1 | 25.9 | $3.8 \times 10^{-4}$ | 88 | |
| Comparative Example A1 | 2.0 | 3.5 | 86 | 5.3 | 15.0 | 23.7 | $3.7 \times 10^{-4}$ | 89 | |
| Comparative Example A2 | 1.8 | 3.2 | 103 | 5.2 | 14.7 | 23.5 | $3.7 \times 10^{-2}$ | 89 | No Ce and Al Added |

(Note)
Porosity is %, pore diameter is average pore diameter μm, crystal grain size is average crystal grain size μm, evaporation speed is Å/sec, specific resistance is Ω·cm, and permeability is visible light permeability %

TABLE 2

Moisture Resistance Test A Result

| | Specific Resistance After Film Formation (0 hr) | Specific Resistance Deterioration Rate | | |
|---|---|---|---|---|
| | | After 500 hr | After 100 hr | After 2000 hr |
| Example A1 | 1 | 1.01 | 1.03 | 1.05 |
| Example A2 | 1 | 1.00 | 1.02 | 1.04 |
| Example A3 | 1 | 1.03 | 1.04 | 1.07 |
| Example A4 | 1 | 1.02 | 1.05 | 1.06 |
| Example A5 | 1 | 1.02 | 1.01 | 1.03 |
| Comparative Example A1 | 1 | 1.01 | 1.00 | 1.01 |
| Comparative Example A2 | 1 | 1.22 | 1.38 | 1.49 |

(Note)
Deterioration rate of specific resistance represents change rate with setting 1 for after film formation.

TABLE 3

| | ZnO Vapor Deposition Material | | | Evaporation | ZnO Film | |
|---|---|---|---|---|---|---|
| | Ce | Al | Porosity | Speed 60 mA | Specific Resistance | Permeability |
| Example A6 | 0.2 | 0.1 | 8 | 17.5 | $8.3 \times 10^{-4}$ | 89 |
| Example A7 | | | 17 | 20.8 | $8.3 \times 10^{-4}$ | 88 |
| Example A8 | | | 31 | 26.6 | $8.4 \times 10^{-4}$ | 89 |
| Comparative Example A3 | | | 2 | 14.1 | $8.7 \times 10^{-4}$ | 88 |
| Example A9 | 14.9 | 10 | 9 | 17.0 | $7.3 \times 10^{-4}$ | 86 |
| Example A10 | | | 16 | 19.4 | $7.2 \times 10^{-4}$ | 86 |
| Example A11 | | | 30 | 25.3 | $7.4 \times 10^{-4}$ | 85 |
| Comparative Example A4 | | | 2 | 13.2 | $7.9 \times 10^{-4}$ | 86 |
| Comparative Example A5 | 20 | 15 | 8 | 16.1 | $9.2 \times 10^{-3}$ | 82 |
| Comparative Example A6 | | | 14 | 18.9 | $9.7 \times 10^{-3}$ | 82 |
| Comparative Example A7 | | | 29 | 23.7 | $9.4 \times 10^{-3}$ | 81 |
| Comparative Example A8 | | | 2 | 13.0 | $9.3 \times 10^{-3}$ | 82 |
| Comparative Example A2 | 0 | 0 | 1.8 | 14.7 | $3.7 \times 10^{-2}$ | 89 |

(Note)
Porosity is %, pore diameter is average pore diameter μm, crystal grain size is average crystal grain size μm, evaporation speed is Å/sec, specific resistance is Ω·cm, and permeability is visible light permeability %

Example B

Hereinafter, Example B Group of this aspect will be described together with Comparative Example B Group. In Example B and Comparative Example B, commercially available ZnO powder (having a purity equal to or greater than 99% and an average grain size of 0.3 μm), CeO$_2$ powder (having a purity equal to or greater than 99% and an average grain size of 0.3 μm), and Ga$_2$O$_3$ powder (having a purity equal to or greater than 99% and an average grain size of 0.3 μm) were used. In any case, a slurry was prepared by using a ball mill (with a nylon-coated steel ball having a diameter of 5 to 20 mm), and wet blending was performed for 24 hours. In any case, a uniaxial molding press device was used as the molding device, and molded bodies having an outer diameter of 6.7 mmφ and a thickness of 2.0 mm were molded under pressure of 100 kgf/cm$^2$ (9.8 MPa). The molded bodies were put in an electric furnace and calcinated under air pressure at 1300° C. for 3 hours, thereby obtaining sintered body pellets.

In Example B and Comparative Example B, the porosity was measured by a substitution method. The measurement of the average pore diameter and the crystal grain size was performed by SEM (Scanning Electron Microscopy). The evaporation speed was measured by a quartz crystal thickness monitor provided obliquely above the hearth. The specific resistance was measured by a four-terminal four-probe method with the application of a constant current at 25° C. in an atmosphere by using Loresta (trademark) from Mitsubishi Chemical Corporation (HP MCP-T410, probe in series, 1.5 mm pitch) as the measuring instrument. The visible light permeability was measured by placing the substrate after film formation vertically to measurement light for a visible wavelength band (380 to 780 nm) by using a spectrophotometer U-4000 manufactured by Hitachi, Ltd. as the measuring instrument.

Example B1

1% by mass of polyvinyl butyral as a binder was added to 100 g of a raw powder containing 91 g of ZnO powder, 6.2 g of $CeO_2$ powder, and 2.8 g of $Ga_2O_3$ powder, and methylated alcohol as a dispersion medium was further added, thereby obtaining a slurry with a concentration of 30% by mass. Next, the slurry was put in a ball mill, air was blown into the slurry, and wet blending was performed, thereby obtaining a gas-containing slurry. The slurry was dry-comminuted after the dispersion medium in the slurry was vaporized by a vacuum drier at 80° C., thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 4.

Example B2

An organic foaming agent and an inorganic foaming agent were added to 100 g of the same raw powder as in Example B1, 1% by mass of polyvinyl butyral as a binder was added, and methylated alcohol was further added as a dispersion medium, thereby obtaining a slurry (viscosity 200 to 4000 cps) with a concentration of 30% by mass. For the organic foaming agent, azodicarboxylamide and dinitrosobenta methylene tetramine were used, and for the inorganic foaming agent, carbonate was used. The foaming agent-containing slurry was put in a ball mill, wet blending was performed, then, the slurry was dry-comminuted after the dispersion medium in the slurry was vaporized by a vacuum drier at 80° C., thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 4.

Example B3

An additive which will be volatized and dissolved upon calcination was added to 100 g of the same raw powder as in Example B1, 1% by mass of polyvinyl butyral was added as a binder, and methylated alcohol was further added as a dispersion medium, thereby obtaining a slurry (viscosity 200 to 4000 cps) with a concentration of 30% by mass. For the additive which will be volatized and dissolved upon calcination, 20% by mass of polyvinyl butyral was used. The additive-containing slurry was put in a ball mill, wet blending was performed, then, the slurry was dry-comminuted after the dispersion medium in the slurry was vaporized by a vacuum drier at 80° C., thereby obtaining granulation powder having an average grain size of 200 µm. The granulation powder was molded under a predetermined pressure, and the molded bodies were calcinated such that the additive was volatized and dissolved, thereby producing porous sintered body pellets (ZnO vapor deposition material). The porosity, average pore diameter, and average crystal grain size of the sintered body are shown in Table 4.

Example B4

A porous sintered body pellet (ZnO vapor deposition material) was produced in the same manner as in Example B3 except that, for the additive which will be volatized and dissolved upon calcination, 20% by mass of starch having a grain size of 50 µm was used. The porosity, average pore diameter, and average crystal grain size of the sintered body are shown in Table 4.

Example B5

The same raw powder as in Example B1 was used, and ZnO powder was filtered such that ZnO powder having an average grain size of 60 µm and a grain size distribution within a range of 55 to 65 µm was obtained. 1% by mass of polyvinyl butyral as a binder and also 30% by mass of methylated alcohol as an organic solvent were added to raw powder containing the ZnO powder and then mixed, thereby preparing a slurry in which the concentration of ZnO powder was 30% by mass. Next, the slurry was spray-dried, thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 4.

Comparative Example B1

The same raw powder as in Example B1 was used, a slurry was prepared in the same manner as in Example B1 except that introduction of air into the slurry, addition of a foaming agent, and use of an additive which will be volatized and dissolved upon calcination were not performed, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 4.

Comparative Example B2

A slurry was prepared in the same manner as in Comparative Example B1 except that raw powder was used in which 6.2 g of $CeO_2$ powder was added to 93.8 g of ZnO powder, and no $Ga_2O_3$ powder was added, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 4.

Comparative Example B3

A slurry was prepared in the same manner as in Comparative Example B1 except that 100 g of ZnO powder containing no $CeO_2$ powder and $Ga_2O_3$ powder was used, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 4.

[Deposition Test B]

A deposition test B was carried out using the ZnO vapor deposition materials of Examples B1 to B5 and the ZnO vapor deposition materials of Comparative Examples B1 to B3. A vapor deposition material as a sample was put in the hearth (diameter 50 mm, depth 25 mm) of the electron beam deposition device, adjustment was done in an atmosphere of an ultimate vacuum $2.66 \times 10^{-4}$ Pa ($2.0 \times 10^{-6}$ Torr) and $O_2$ partial pressure $1.33 \times 10^{-2}$ Pa ($1.0 \times 10^{-4}$ Torr), and an electron beam with an acceleration voltage of 10 kV and a beam scan area of about 40 mm$\phi$ was irradiated to heat the ZnO vapor deposition material, thereby forming a ZnO film. The evaporation speed was measured by a quartz crystal thickness monitor provided obliquely above the hearth. The results are shown in Table 5.

As shown in Tables 4 and 5, in Examples B1 to B5, the evaporation speed is high, as compared with Comparative Example B1. In Comparative Examples B2 to B3, the evaporation speed is the same as in Example B5, but the specific resistance is large and the conductivity is low.

[Moisture Resistance Test B]

For the samples of Examples B1 to B5 and Comparative Examples B1 and B3, a moisture resistance test B was performed. The moisture resistance test B was performed for 2000 hours in an atmosphere of humidity 60% and temperature 90° C. The specific resistance of a film was measured hourly. The results are shown in Table 6.

As shown in Table 6, with regard to the moisture resistance of a ZnO film formed of a ZnO vapor deposition material containing Ce and Ga, the deterioration rate of specific resistance is several times lower than a ZnO film containing no Ce and Ga. This indicates that a ZnO film containing Ce and Ga is several times more stable.

Examples B6 to B8

A porous sintered body pellet (ZnO vapor deposition material) was produced in the same manner as in Example B1 except that adjustment was done such that the Ce content was 0.2% by mass, the Ga content was 0.1% by mass, and the porosity was in a range of 8 to 30%.

Examples B9 to B11

A porous sintered body pellet (ZnO vapor deposition material) was produced in the same manner as in Example B1 except that adjustment was done such that the Ce content was 14.9% by mass, the Ga content was 10% by mass, and the porosity was in a range of 10 to 32%.

Comparative Example B4

A porous sintered body pellet (ZnO vapor deposition material) was produced in the same manner as in Examples B6 to B8 except that adjustment was done such that the porosity was 2%.

Comparative Example B5

A porous sintered body pellet (ZnO vapor deposition material) was produced in the same manner as in Examples B9 to B11 except that adjustment was done such that the porosity was 2%.

Comparative Examples B6 to B9

A porous sintered body pellet (ZnO vapor deposition material) was produced in the same manner as in Example B1 except that adjustment was done such that the Ce content was 20% by mass, the Ga content was 15% by mass, and the porosity was in a range of 2 to 31%.

For the samples of Examples B6 to B11 and Comparative Examples B4 to B9, a deposition test B was performed. The results are shown in Table 7. As shown in Table 7, similar to Table 4, in Examples B6 to B11, the ZnO vapor deposition material has a high evaporation speed and excellent specific resistance, as compared with Comparative Example B. On the other hand, in Comparative Examples B4, B5, and B9 having a small porosity, the evaporation speed is considerably low at 13.0 to 14.1. In Comparative Examples B6 to B9 in which the Ce content and the Ga content are high, the ZnO film has very large specific resistance and considerably low permeability.

TABLE 4

Deposition test B results using ZnO vapor deposition material containing $CeO_2$: 6.2% (Ce: 5.1%) and $Ga_2O_3$: 2.8% (Ga: 2.3%)

| | Raw Powder (% by mass) | Slurry | ZnO Vapor Deposition Material | | |
|---|---|---|---|---|---|
| | | | Porosity | Porosity | Crystal Grain size |
| Example B1 | ZnO: 91% | Gas-Containing Slurry | 18.4% | 24 | 56 |
| Example B2 | $CeO_2$: 6.2% | Foaming Agent-Containing Slurry | 25.9% | 31 | 46 |
| Example B3 | (Ce: 5.1%) | Additive-Containing Slurry | 28.4% | 37 | 42 |
| Example B4 | $Ga_2O_3$: 2.8% | Additive-Containing Slurry | 31.3% | 50 | 35 |
| Example B5 | (Ga: 2.3%) | Slurry with Adjustment of Grain Size Distribution | 10.3% | 11 | 59 |
| Comparative Example B1 | Same as Above | Slurry with No Adjustment | 1.9% | 3.8 | 90 |
| Comparative Example B2 | ZnO: 93.8% $CeO_2$: 6.2% | Gas-Containing Slurry | 17.9% | 22 | 45 |
| Comparative Example B3 | ZnO Alone No Ce and Ga Added | Gas-Containing Slurry | 17.2% | 23 | 43 |

(Note)
Porosity is %, pore diameter is average pore diameter μm, and crystal grain size is average crystal grain size μm

TABLE 5

| | Evaporation Speed | | | Ratio of | ZnO Film | |
|---|---|---|---|---|---|---|
| | 20 mA | 60 mA | 100 mA | Evaporation Speed | Specific Resistance | Visible Light Permeability |
| Example B1 | 6.4 | 18.3 | 31.2 | 1.4 | $3.3 \times 10^{-4}$ | 89 |
| Example B2 | 8.3 | 24.7 | 36.9 | 1.6 | $3.4 \times 10^{-4}$ | 88 |
| Example B3 | 8.5 | 25.8 | 43.5 | 1.9 | $3.5 \times 10^{-4}$ | 87 |
| Example B4 | 9.1 | 26.4 | 46.3 | 2.0 | $3.5 \times 10^{-4}$ | 87 |
| Example B5 | 5.9 | 18.1 | 25.9 | 1.1 | $3.4 \times 10^{-4}$ | 88 |
| Comparative Example B1 | 5.3 | 14.8 | 22.9 | 1 | $3.3 \times 10^{-4}$ | 89 |
| Comparative Example B2 | 6.2 | 17.1 | 28.4 | 1.2 | $8.1 \times 10^{-4}$ | 89 |
| Comparative Example B3 | 6.0 | 17.0 | 28.3 | 1.2 | $2.3 \times 10^{-2}$ | 92 |

(Note)
Evaporation speed is A/sec, specific resistance is Ω · cm, and permeability is visible light permeability %
Ratio of evaporation speed is ratio to evaporation speed of Comparative Example B1 at 100 mA

TABLE 6

| | Moisture Resistance Test B Result | | | |
|---|---|---|---|---|
| | Specific Resistance After Film | Specific Resistance Deterioration Rate | | |
| | Formation (0 hr) | 500 hr | 100 hr | 2000 hr |
| Example B1 | 1 | 1.01 | 1.02 | 1.04 |
| Example B2 | 1 | 1.02 | 1.04 | 1.07 |
| Example B3 | 1 | 1.04 | 1.05 | 1.08 |
| Example B4 | 1 | 1.01 | 1.03 | 1.05 |
| Example B5 | 1 | 1.02 | 1.04 | 1..07 |
| Comparative Example B1 | 1 | 1.02 | 1.03 | 1.06 |
| Comparative Example B3 | 1 | 1.30 | 1.39 | 1.53 |

(Note)
Deterioration rate of specific resistance represents change rate with setting 1 for after film formation.

TABLE 7

| | ZnO Vapor Deposition Material | | | Evaporation Speed | ZnO Film | |
|---|---|---|---|---|---|---|
| | Ce | Ga | Porosity | 60 mA | Specific Resistance | Permeability |
| Example B6 | 0.2 | 0.1 | 8 | 17.5 | $5.5 \times 10^{-4}$ | 88 |
| Example B7 | | | 16 | 20.8 | $5.5 \times 10^{-4}$ | 88 |
| Example B8 | | | 30 | 26.6 | $5.6 \times 10^{-4}$ | 89 |
| Comparative Example B4 | | | 2 | 14.1 | $5.9 \times 10^{-4}$ | 89 |
| Example B9 | 14.9 | 10 | 10 | 17.0 | $6.2 \times 10^{-4}$ | 88 |
| Example B10 | | | 15 | 19.4 | $6.5 \times 10^{-4}$ | 86 |
| Example B11 | | | 32 | 25.3 | $6.5 \times 10^{-4}$ | 87 |
| Comparative Example B5 | | | 2 | 13.2 | $6.4 \times 10^{-4}$ | 87 |
| Comparative Example B6 | 20 | 15 | 7 | 16.1 | $7.7 \times 10^{-3}$ | 84 |
| Comparative Example B7 | | | 17 | 18.9 | $7.3 \times 10^{-3}$ | 82 |
| Comparative Example B8 | | | 31 | 23.7 | $7.4 \times 10^{-3}$ | 83 |
| Comparative Example B9 | | | 2 | 13.0 | $7.6 \times 10^{-3}$ | 84 |
| Comparative Example B3 | 0 | 0 | 1.8 | 14.5 | $2.4 \times 10^{-2}$ | 90 |

(Note)
Porosity is %, pore diameter is average pore diameter μm, crystal grain size is average crystal grain size μm, evaporation speed is A/sec, specific resistance is Ω · cm, and permeability is visible light permeability %

Example C

Hereinafter, Example C Group of this aspect will be described together with Comparative Example C Group. In Example C and Comparative Example C, commercially available ZnO powder (having a purity equal to or greater than 99% and an average grain size of 0.3 μm), CeO₂ powder (having a purity equal to or greater than 99% and an average grain size of 0.3 μm), and Sc₂O₃ powder (having a purity equal to or greater than 99% and an average grain size of 0.3 μm) were used. In any case, a slurry was prepared by using a ball mill (with a nylon-coated steel ball having a diameter of 5 to 20 mm), and wet blending was performed for 24 hours. In any case, a uniaxial molding press device was used as the molding device, and molded bodies having an outer diameter of 6.7 mmϕ and a thickness of 2.0 mm were molded under pressure of 100 kgf/cm² (9.8 MPa). The molded bodies were put in an electric furnace and calcinated under air pressure at 1300° C. for 3 hours, thereby obtaining sintered body pellets.

In Example C and Comparative Example C, the porosity was measured by a substitution method. The measurement of the average pore diameter and the crystal grain size was performed by SEM (Scanning Electron Microscopy). The evaporation speed was measured by a quartz crystal thickness monitor provided obliquely above the hearth. The specific resistance was measured by a four-terminal four-probe method with the application of a constant current at 25° C. in an atmosphere by using Loresta (trademark) from Mitsubishi Chemical Corporation (HP MCP-T410, probe in series, 1.5 mm pitch) as the measuring instrument. The visible light permeability was measured by placing the substrate after film formation vertically to measurement light for a visible wavelength band (380 to 780 nm) by using a spectrophotometer U-4000 manufactured by Hitachi, Ltd. as the measuring instrument.

Example C1

1% by mass of polyvinyl butyral as a binder was added to 100 g of a raw powder containing 90.8 g of ZnO powder, 6.2 g of $CeO_2$ powder, and 3.0 g of $Sc_2O_3$ powder, and methylated alcohol as a dispersion medium was further added, thereby obtaining a slurry with a concentration of 30% by mass. Next, the slurry was put in a ball mill, air was blown into the slurry, and wet blending was performed, thereby obtaining a gas-containing slurry. The slurry was dry-comminuted after the dispersion medium in the slurry was vaporized by a vacuum drier at 80° C., thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 8.

Example C2

An organic foaming agent and an inorganic foaming agent were added to 100 g of the same raw powder as in Example C1, 1% by mass of polyvinyl butyral as a binder was added, and methylated alcohol was further added as a dispersion medium, thereby obtaining a slurry (viscosity 200 to 4000 cps) with a concentration of 30% by mass. For the organic foaming agent, azodicarboxylamide and dinitrosobenta methylene tetramine were used, and for the inorganic foaming agent, carbonate was used. The foaming agent-containing slurry was put in a ball mill, wet blending was performed, then, the slurry was dry-comminuted after the dispersion medium in the slurry was vaporized by a vacuum drier at 80° C., thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 8.

Example C3

An additive which will be volatized and dissolved upon calcination was added to 100 g of the same raw powder as in Example C1, 1% by mass of polyvinyl butyral was added as a binder, and methylated alcohol was further added as a dispersion medium, thereby obtaining a slurry (viscosity 200 to 4000 cps) with a concentration of 30% by mass. For the additive which will be volatized and dissolved upon calcination, 20% by mass of polyvinyl butyral was used. The additive-containing slurry was put in a ball mill, wet blending was performed, then, the slurry was dry-comminuted after the dispersion medium in the slurry was vaporized by a vacuum drier at 80° C., thereby obtaining granulation powder having an average grain size of 200 µm. The granulation powder was molded under a predetermined pressure, and the molded bodies were calcinated such that the additive was volatized and dissolved, thereby producing porous sintered body pellets (ZnO vapor deposition material). The porosity, average pore diameter, and average crystal grain size of the sintered body are shown in Table 8.

Example C4

A porous sintered body pellet (ZnO vapor deposition material) was produced in the same manner as in Example C3 except that, for the additive which will be volatized and dissolved upon calcination, 20% by mass of starch having a grain size of 50 µm was used. The porosity, average pore diameter, and average crystal grain size of the sintered body are shown in Table 8.

Example C5

The same raw powder as in Example C1 was used, and ZnO powder was filtered such that ZnO powder having an average grain size of 60 µm and a grain size distribution within a range of 55 to 65 µm was obtained. 1% by mass of polyvinyl butyral as a binder and also 30% by mass of methylated alcohol as an organic solvent were added to raw powder containing the ZnO powder and then mixed, thereby preparing a slurry in which the concentration of ZnO powder was 30% by mass. Next, the slurry was spray-dried, thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 8.

Comparative Example C1

The same raw powder as in Example C1 was used, a slurry was prepared in the same manner as in Example C1 except that introduction of air into the slurry, addition of a foaming agent, and use of an additive which will be volatized and dissolved upon calcination were not performed, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 8.

Comparative Example C2

A slurry was prepared in the same manner as in Example C1 except that raw powder was used in which 6.2 g of $CeO_2$ powder was added to 93.8 g of ZnO powder and no $Sc_2O_3$ powder was added, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 8.

Comparative Example C3

A slurry was prepared in the same manner as in Example C1 except that 100 g of ZnO powder containing no $CeO_2$ powder and $Sc_2O_3$ powder was used, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 8.

[Deposition Test C]

A deposition test C was carried out using the ZnO vapor deposition materials of Examples C1 to C5 and the ZnO vapor deposition materials of Comparative Examples C1 to C3. A vapor deposition material as a sample was put in the hearth (diameter 50 mm, depth 25 mm) of the electron beam deposition device, adjustment was done in an atmosphere of an ultimate vacuum $2.66\times10^{-4}$ Pa($2.0\times10^{-6}$ Torr) and $O_2$ partial pressure $1.33\times10^{-2}$ Pa($1.0\times10^{-6}$ Torr), and an electron beam with an acceleration voltage of 10 kV and a beam scan area of about 40 mmφ was irradiated to heat the ZnO vapor deposition material, thereby forming a ZnO film. The evaporation speed was measured by a quartz crystal thickness monitor provided obliquely above the hearth. The results are shown in Table 9.

As shown in Tables 8 and 9, in Examples C1 to C5, the evaporation speed is higher than in Comparative Example C1. In Comparative Examples C2 and C3, the evaporation speed is the same as in Example C5, but the specific resistance is large and the conductivity is low.

[Moisture Resistance Test C]

For the samples of Examples C1 to C5 and Comparative Examples C1 and C3, a moisture resistance test C was performed. The moisture resistance test C was performed for 2000 hours in an atmosphere of humidity 60% and temperature 90° C. The specific resistance of a film was measured hourly. The results are shown in Table 10.

As shown in Table 10, with regard to the moisture resistance of a ZnO film formed of a ZnO vapor deposition material containing Ce and Sc, the deterioration rate of specific resistance is several times lower than a ZnO film containing no Ce and Sc. This indicates that a ZnO film containing Ce and Sc is several times more stable.

Examples C6 to C8

A porous sintered body pellet (ZnO vapor deposition material) was produced in the same manner as in Example C1 except that adjustment was done such that the Ce content was 0.2% by mass, the Sc content was 0.1% by mass, and the porosity was in a range of 78 to 28%.

Examples C9 to C11

A porous sintered body pellet (ZnO vapor deposition material) was produced in the same manner as in Example C1 except that adjustment was done such that the Ce content was 14.9% by mass, the Sc content was 10% by mass, and the porosity was in a range of 9 to 30%.

Comparative Example C4

A porous sintered body pellet (ZnO vapor deposition material) was produced in the same manner as in Examples C6 to C8 except that adjustment was done such that the porosity was 2%.

Comparative Example C5

A porous sintered body pellet (ZnO vapor deposition material) was produced in the same manner as in Examples C9 to C11 except that adjustment was done such that the porosity was 2%.

Comparative Examples C6 to C9

A porous sintered body pellet (ZnO vapor deposition material) was produced in the same manner as in Example C1 except that adjustment was done such that the Ce content was 20% by mass, the Sc content was 15% by mass, and the porosity was in a range of 2 to 28%.

For the samples of Examples C6 to C11 and Comparative Examples C4 to C9, a deposition test C was performed. The results are shown in Table 11. As shown in Table 11, similar to Table 8, in Examples C6 to C11, the ZnO vapor deposition material has a high evaporation speed and excellent specific resistance, as compared with Comparative Example C. On the other hand, in Comparative Examples C4, C5, and C9 having a small porosity, the evaporation speed is considerably low at 13.8 to 14.9. In Comparative Examples C6 to C9 in which the Ce content and the Sc content are high, a ZnO film has very large specific resistance and considerably low permeability.

TABLE 8

Deposition test C results using ZnO vapor deposition material containing
$CeO_2$: 6.2% (Ce: 5.1%) and $Sc_2O_3$: 2.8% (Sc: 2.3%)

| | Raw Powder (% by mass) | Slurry | ZnO Vapor Deposition Material | | |
|---|---|---|---|---|---|
| | | | Porosity | Pore Diameter | Crystal Grain size |
| Example C1 | ZnO: 90.8% | Gas-Containing Slurry | 18.2% | 25 | 61 |
| Example C2 | $CeO_2$: 6.2% | Foaming Agent-Containing Slurry | 25.3% | 30 | 49 |
| Example C3 | (Ce: 5.1%) | Additive-Containing Slurry | 27.9% | 38 | 43 |
| Example C4 | $Sc_2O_3$: 3.0% | Additive-Containing Slurry | 30.1% | 48 | 32 |
| Example C5 | (Sc: 2.0%) | Slurry with Adjustment of Grain Size Distribution | 9.8% | 12 | 56 |
| Comparative Example C1 | Same as Above | Slurry with No Adjustment | 1.8% | 4 | 104 |
| Comparative Example C2 | ZnO: 93.8% $CeO_2$: 6.2% | Gas-Containing Slurry | 17.9% | 22 | 45 |
| Comparative Example C3 | ZnO Alone No Ce and Sc Added | Gas-Containing Slurry | 17.2% | 23 | 43 |

(Note)
Porosity is %, pore diameter is average pore diameter μm, and crystal grain size is average crystal grain size μm

TABLE 9

| | Evaporation Speed | | | Ratio of | ZnO Film | |
| | 20 mA | 60 mA | 100 mA | Evaporation Speed | Specific Resistance | Visible Light Permeability |
|---|---|---|---|---|---|---|
| Example C1 | 6.5 | 18.5 | 32.9 | 1.3 | $3.9 \times 10^{-4}$ | 89 |
| Example C2 | 8.5 | 25.2 | 37.5 | 1.5 | $3.9 \times 10^{-4}$ | 89 |
| Example C3 | 8.9 | 25.9 | 44.8 | 1.8 | $3.9 \times 10^{-4}$ | 88 |
| Example C4 | 9.4 | 27.8 | 48.1 | 2.0 | $3.9 \times 10^{-4}$ | 88 |
| Example C5 | 6.2 | 19.0 | 26.8 | 1.1 | $3.9 \times 10^{-4}$ | 89 |
| Comparative Example C1 | 5.5 | 15.8 | 24.5 | 1 | $3.9 \times 10^{-4}$ | 89 |
| Comparative Example C2 | 6.2 | 17.1 | 28.4 | 1.2 | $8.1 \times 10^{-4}$ | 89 |
| Comparative Example C3 | 6.0 | 17.0 | 28.3 | 1.2 | $2.3 \times 10^{-2}$ | 92 |

(Note)
Evaporation speed is A/sec, specific resistance is Ω · cm, and visible light permeability is %
Ratio of evaporation speed is ratio to evaporation speed of Comparative Example C1 at 100 mA

TABLE 10

Moisture Resistance Test C Result

| | Specific Resistance After Film Formation (0 hr) | Specific Resistance Deterioration Rate | | |
| | | After 500 hr | After 100 hr | After 2000 hr |
|---|---|---|---|---|
| Example C1 | 1 | 1.02 | 1.03 | 1.05 |
| Example C2 | 1 | 1.02 | 1.04 | 1.06 |
| Example C3 | 1 | 1.03 | 1.06 | 1.09 |
| Example C4 | 1 | 1.02 | 1.03 | 1.06 |
| Example C5 | 1 | 1.03 | 1.04 | 1.06 |
| Comparative Example C1 | 1 | 1.01 | 1.03 | 1.04 |
| Comparative Example C3 | 1 | 1.29 | 1.38 | 1.49 |

(Note)
Deterioration rate of specific resistance represents change rate with setting 1 for after film formation.

TABLE 11

| | ZnO Vapor Deposition Material | | | Evaporation | ZnO Film | |
| | Ce | Sc | Porosity | Speed 60 mA | Specific Resistance | Permeability |
|---|---|---|---|---|---|---|
| Example C6 | 0.2 | 0.1 | 7 | 18.2 | $6.3 \times 10^{-4}$ | 89 |
| Example C7 | | | 14 | 19.8 | $6.2 \times 10^{-4}$ | 89 |
| Example C8 | | | 28 | 27.3 | $6.4 \times 10^{-4}$ | 89 |
| Comparative Example C4 | | | 2 | 14.9 | $6.7 \times 10^{-4}$ | 88 |
| Example C9 | 14.9 | 10 | 9 | 18.2 | $9.3 \times 10^{-4}$ | 87 |
| Example C10 | | | 15 | 19.7 | $9.5 \times 10^{-4}$ | 86 |
| Example C11 | | | 30 | 25.0 | $9.7 \times 10^{-4}$ | 86 |
| Comparative Example C5 | | | 2 | 14.1 | $9.6 \times 10^{-4}$ | 86 |
| Comparative Example C6 | 20 | 15 | 6 | 15.0 | $1.1 \times 10^{-2}$ | 83 |
| Comparative Example C7 | | | 16 | 18.2 | $1.2 \times 10^{-2}$ | 81 |
| Comparative Example C8 | | | 28 | 22.6 | $1.2 \times 10^{-2}$ | 82 |
| Comparative Example C9 | | | 2 | 13.8 | $1.3 \times 10^{-2}$ | 83 |
| Comparative Example C3 | 0 | 0 | 1.8 | 14.5 | $2.4 \times 10^{-2}$ | 90 |

(Note)
Porosity is %, pore diameter is average pore diameter μm, crystal grain size is average crystal grain size μm, evaporation speed is A/sec, specific resistance is Ω · cm, and permeability is visible light permeability %

Example D

Hereinafter, Example D Group of this aspect will be described together with Comparative Example D Group. In Example D and Comparative Example D, commercially available ZnO powder (having a purity equal to or greater than 99% and average grain size of 0.3 μm), CeO₂ powder (having a purity equal to or greater than 99% and an average grain size of 0.3 μm), and B₂O₃ powder (having a purity equal to or greater than 99% and an average grain size of 0.3 μm) were used. In any case, a slurry was prepared by using a ball mill (with a nylon-coated steel ball having a diameter of 5 to 20 mm), and wet blending was performed for 24 hours. In any case, a uniaxial molding press device was used as the molding device, and molded bodies having an outer diameter of 6.7 mmφ and a thickness of 2.0 mm were molded under pressure of 100 kgf/cm² (9.8 MPa). The molded bodies were put in an electric furnace and calcinated under air pressure at 1300° C. for 3 hours, thereby obtaining sintered body pellets.

In Example D and Comparative Example D, the porosity was measured by a substitution method. The measurement of the average pore diameter and the crystal grain size was performed by SEM (Scanning Electron Microscopy). The evaporation speed was measured by a quartz crystal thickness monitor provided obliquely above the hearth. The specific resistance was measured by a four-terminal four-probe method with the application of a constant current at 25° C. in an atmosphere by using Loresta (trademark) from Mitsubishi Chemical Corporation (HP MCP-T410, probe in series, 1.5 mm pitch) as the measuring instrument. The visible light permeability was measured by placing the substrate after film formation vertically to measurement light for a visible wavelength band (380 to 780 nm) by using a spectrophotometer U-4000 manufactured by Hitachi, Ltd. as the measuring instrument.

Example D1

1% by mass of polyvinyl butyral as a binder was added to 100 g of a raw powder containing 90 g of ZnO powder, 6.2 g of $CeO_2$ powder, and 3.8 g of $B_2O_3$ powder, and methylated alcohol as a dispersion medium was further added, thereby obtaining a slurry with a concentration of 30% by mass. Next, the slurry was put in a ball mill, air was blown into the slurry, and wet blending was performed, thereby obtaining a gas-containing slurry. The slurry was dry-comminuted after the dispersion medium in the slurry was vaporized by a vacuum drier at 80° C., thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 12.

Example D2

An organic foaming agent and an inorganic foaming agent were added to 100 g of the same raw powder as in Example D1, 1% by mass of polyvinyl butyral as a binder was added, and methylated alcohol was further added as a dispersion medium, thereby obtaining a slurry (viscosity 200 to 4000 cps) with a concentration of 30% by mass. For the organic foaming agent, azodicarboxylamide and dinitrosobenta methylene tetramine were used, and for the inorganic foaming agent, carbonate was used. The foaming agent-containing slurry was put in a ball mill, wet blending was performed, then, the slurry was dry-comminuted after the dispersion medium in the slurry was vaporized by a vacuum drier at 80° C., thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 12.

Example D3

An additive which will be volatized and dissolved upon calcination was added to 100 g of the same raw powder as in Example D1, 1% by mass of polyvinyl butyral was added as a binder, and methylated alcohol was further added as a dispersion medium, thereby obtaining a slurry (viscosity 200 to 4000 cps) with a concentration of 30% by mass. For the additive which will be volatized and dissolved upon calcination, 20% by mass of polyvinyl butyral was used. The additive-containing slurry was put in a ball mill, wet blending was performed, then, the slurry was dry-comminuted after the dispersion medium in the slurry was vaporized by a vacuum drier at 80° C., thereby obtaining granulation powder having an average grain size of 200 µm. The granulation powder was molded under a predetermined pressure, and the molded bodies were calcinated such that the additive was volatized and dissolved, thereby producing porous sintered body pellets (ZnO vapor deposition material). The porosity, average pore diameter, and average crystal grain size of the sintered body are shown in Table 12.

Example D4

A porous sintered body pellet (ZnO vapor deposition material) was produced in the same manner as in Example D3 except that, for the additive which will be volatized and dissolved upon calcination, 20% by mass of starch having a grain size of 50 µm was used. The porosity, average pore diameter, and average crystal grain size of the sintered body are shown in Table 12.

Example D5

The same raw powder as in Example D1 was used, and ZnO powder was filtered such that ZnO powder having an average grain size of 60 µm and a grain size distribution within a range of 55 to 65 µm was obtained. 1% by mass of polyvinyl butyral as a binder and also 30% by mass of methylated alcohol as an organic solvent were added to raw powder containing the ZnO powder and then mixed, thereby preparing a slurry in which the concentration of ZnO powder was 30% by mass. Next, the slurry was spray-dried, thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 12.

Comparative Example D1

The same raw powder as in Example D1 was used, a slurry was prepared in the same manner as in Example D1 except that introduction of air into the slurry, addition of a foaming agent, and use of an additive which will be volatized and dissolved upon calcination were not performed, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 12.

Comparative Example D2

A slurry was prepared in the same manner as in Example D1 except that raw powder was used in which 6.2 g of $CeO_2$ powder was added to 93.8 g of ZnO powder and no $B_2O_3$ powder was added, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 12.

Comparative Example D3

A slurry was prepared in the same manner as in Example D1 except that 100 g of ZnO powder containing no $CeO_2$ powder and $B_2O_3$ powder was used, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 12.

[Deposition Test D]

A deposition test D was carried out using the ZnO vapor deposition materials of Examples D1 to D5 and the ZnO vapor deposition materials of Comparative Examples D1 to D3. A vapor deposition material as a sample was put in the hearth (diameter 50 mm, depth 25 mm) of the electron beam deposition device, adjustment was done in an atmosphere of an ultimate vacuum $2.66 \times 10^{-4}$ Pa ($2.0 \times 10^{-6}$ Torr) and $O_2$ partial pressure $1.33 \times 10^{-2}$ Pa ($1.0 \times 10$ Torr), and an electron beam with an acceleration voltage of 10 kV and a beam scan area of about 40 mmφ was irradiated to heat the ZnO vapor deposition material, thereby forming a ZnO film. The evaporation speed was measured by a quartz crystal thickness monitor provided obliquely above the hearth. The results are shown in Table 13.

As shown in Tables 12 and 13, in Examples D1 to D5, the evaporation speed is higher than in Comparative Example D1. In Comparative Examples D2 and D3, the evaporation speed is the same as in Example D5, but the specific resistance is large and the conductivity is low.

[Moisture Resistance Test D]

For the samples of Examples D1 to D5 and Comparative Examples D1 and D3, a moisture resistance test D was performed. The moisture resistance test D was performed for 2000 hours in an atmosphere of humidity 60% and temperature 90° C. The specific resistance of a film was measured hourly. The results are shown in Table 14.

As shown in Table 14, with regard to the moisture resistance of a ZnO film formed of a ZnO vapor deposition material containing Ce and B, the deterioration rate of specific resistance is several times lower than a ZnO film containing no Ce and B. This indicates that a ZnO film containing Ce and B is several times more stable.

Examples D6 to D8

A porous sintered body pellet (ZnO vapor deposition material) was produced in the same manner as in Example D1 except that adjustment was done such that the Ce content was 0.2% by mass, the B content was 0.1% by mass, and the porosity was in a range of 9 to 30%.

Examples D9 to D11

A porous sintered body pellet (ZnO vapor deposition material) was produced in the same manner as in Example D1 except that adjustment was done such that the Ce content was 14.9% by mass, the B content was 10% by mass, and the porosity was in a range of 10 to 33%.

Comparative Example D4

A porous sintered body pellet (ZnO vapor deposition material) was produced in the same manner as in Examples D6 to D8 except that adjustment wad done such that the porosity was 2%.

Comparative Example D5

A porous sintered body pellet (ZnO vapor deposition material) was produced in the same manner as in Examples D9 to D11 except that adjustment was done such that the porosity was 2%.

Comparative Examples D6 to D9

A porous sintered body pellet (ZnO vapor deposition material) was produced in the same manner as in Example D1 except that adjustment was done such that the Ce content was 20% by mass, the B content was 15% by mass, and porosity was in a range of 2 to 31%.

For the samples of Examples D6 to D11 and Comparative Examples D4 to D9, a deposition test D was performed. The results are shown in Table 15. As shown in Table 15, similar to Table 12, in Examples D6 to D11, a ZnO vapor deposition material has high evaporation speed and excellent specific resistance, as compared with Comparative Example D. On the other hand, in Comparative Examples D4, D5, and D9 having a small porosity, the evaporation speed is considerably low at 14.0 to 14.5. In Comparative Examples D6 to D9 in which the Ce content and the B content are high, a ZnO film has very large specific resistance and considerably low permeability.

TABLE 12

Deposition test D results using ZnO vapor deposition material containing $CeO_2$: 6.2% (Ce: 5.1%) and $B_2O_3$: 2.8% (B: 1.0%)

| | Raw Powder (% by mass) | Slurry | ZnO Vapor Deposition Material | | |
|---|---|---|---|---|---|
| | | | Porosity | Pore Diameter | Crystal Grain size |
| Example D1 | ZnO: 90% | Gas-Containing Slurry | 17.9% | 25 | 53 |
| Example D2 | $CeO_2$: 6.2% | Foaming Agent-Containing Slurry | 24.7% | 32 | 49 |
| Example D3 | (Ce: 5.1%) | Additive-Containing Slurry | 28.1% | 39 | 42 |
| Example D4 | $B_2O_3$: 3.8% | Additive-Containing Slurry | 30.4% | 54 | 37 |
| Example D5 | (B: 1.0%) | Slurry with Adjustment of Grain Size Distribution | 10.9% | 15 | 60 |
| Comparative Example D1 | Same as Above | Slurry with No Adjustment | 1.8% | 5 | 118 |
| Comparative Example D2 | ZnO: 93.8% $CeO_2$: 6.2% | Gas-Containing Slurry | 17.9% | 22 | 45 |
| Comparative Example D3 | ZnO Alone No Ce and B Added | Gas-Containing Slurry | 17.2% | 23 | 43 |

(Note)
Porosity is %, pore diameter is average pore diameter μm, and crystal grain size is average crystal grain size μm

TABLE 13

| | Evaporation Speed | | | Ratio of Evaporation Speed | ZnO Film | |
| --- | --- | --- | --- | --- | --- | --- |
| | 20 mA | 60 mA | 100 mA | | Specific Resistance | Visible Light Permeability |
| Example D1 | 6.7 | 17.5 | 32.1 | 1.3 | $4.5 \times 10^{-4}$ | 88 |
| Example D2 | 8.3 | 24.1 | 37.7 | 1.5 | $4.4 \times 10^{-4}$ | 88 |
| Example D3 | 8.2 | 24.9 | 45.7 | 1.9 | $4.5 \times 10^{-4}$ | 87 |
| Example D4 | 9.8 | 26.8 | 48.1 | 2.0 | $4.7 \times 10^{-4}$ | 87 |
| Example D5 | 5.4 | 18.3 | 26.7 | 1.1 | $4.9 \times 10^{-4}$ | 88 |
| Comparative Example D1 | 5.4 | 15.4 | 24.5 | 1 | $4.6 \times 10^{-4}$ | 87 |
| Comparative Example D2 | 6.2 | 17.1 | 28.4 | 1.2 | $8.1 \times 10^{-4}$ | 89 |
| Comparative Example D3 | 6.0 | 17.0 | 28.3 | 1.2 | $2.3 \times 10^{-2}$ | 92 |

(Note)
Evaporation speed is A/sec, specific resistance is Ω · cm, and visible light permeability is %
Ratio of evaporation speed is ratio to evaporation speed of Comparative Example D1 at 100 mA

TABLE 14

Moisture Resistance Test D Result

| | Specific Resistance After Film Formation (0 hr) | Specific Resistance Deterioration Rate | | |
| --- | --- | --- | --- | --- |
| | | After 500 hr | After 100 hr | After 2000 hr |
| Example D1 | 1 | 1.01 | 1.02 | 1.04 |
| Example D2 | 1 | 1.03 | 1.03 | 1.04 |
| Example D3 | 1 | 1.02 | 1.06 | 1.08 |
| Example D4 | 1 | 1.02 | 1.04 | 1.06 |
| Example D5 | 1 | 1.02 | 1.03 | 1.05 |
| Comparative Example D1 | 1 | 1.02 | 1.03 | 1.05 |
| Comparative Example D3 | 1 | 1.29 | 1.38 | 1.49 |

(Note)
Deterioration rate of specific resistance represents change rate with setting 1 for after film formation.

TABLE 15

| | ZnO Vapor Deposition Material | | | Evaporation Speed | ZnO Film | |
| --- | --- | --- | --- | --- | --- | --- |
| | Ce | B | Porosity | 60 mA | Specific Resistance | Permeability |
| Example D6 | 0.2 | 0.1 | 9 | 19.2 | $6.0 \times 10^{-4}$ | 89 |
| Example D7 | | | 16 | 19.5 | $6.1 \times 10^{-4}$ | 88 |
| Example D8 | | | 30 | 28.1 | $6.3 \times 10^{-4}$ | 89 |
| Comparative Example D4 | | | 2 | 14.5 | $6.4 \times 10^{-4}$ | 88 |
| Example D9 | 14.9 | 10 | 10 | 17.8 | $8.3 \times 10^{-4}$ | 84 |
| Example D10 | | | 17 | 18.2 | $8.2 \times 10^{-4}$ | 85 |
| Example D11 | | | 33 | 24.3 | $8.6 \times 10^{-4}$ | 85 |
| Comparative Example D5 | | | 2 | 14.0 | $8.9 \times 10^{-4}$ | 84 |
| Comparative Example D6 | 20 | 15 | 7 | 15.9 | $1.3 \times 10^{-2}$ | 82 |
| Comparative Example D7 | | | 16 | 17.7 | $1.6 \times 10^{-2}$ | 82 |
| Comparative Example D8 | | | 31 | 21.8 | $1.4 \times 10^{-2}$ | 82 |
| Comparative Example D9 | | | 2 | 14.5 | $1.8 \times 10^{-2}$ | 81 |
| Comparative Example D3 | 0 | 0 | 1.8 | 14.5 | $2.4 \times 10^{-2}$ | 90 |

(Note)
Porosity is %, pore diameter is average pore diameter μm, crystal grain size is average crystal grain size μm, evaporation speed is A/sec, specific resistance is Ω · cm, and permeability is visible light permeability %

Example E

Hereinafter, Example E Group of this aspect will be described together with Comparative Example E Group. In Example E and Comparative Example E, commercially available ZnO powder, $La_2O_3$ powder, $B_2O_3$ powder, $Al_2O_3$ powder, $Ga_2O_3$ powder, and $Sc_2O_3$ powder were used. Any powder has purity equal to or greater than 99% and an average grain size of 0.3 μm.

In any case, a slurry was prepared by using a ball mill (with a nylon-coated steel ball having a diameter of 5 to 20 mm), and wet blending was performed for 24 hours. In any case, a uniaxial molding press device was used as the molding device, and molded bodies having an outer diameter of 6.7 mmφ and a thickness of 2.0 mm were molded under pressure of 100 kgf/cm² (9.8 MPa). The molded bodies were put in an electric furnace and calcinated under air pressure at 1300° C. for 3 hours, thereby obtaining sintered body pellets.

In Example E and Comparative Example E, the porosity was measured by a substitution method. The measurement of the average pore diameter and the crystal grain size was performed by SEM (Scanning Electron Microscopy). The evaporation speed was measured by a quartz crystal thickness monitor provided obliquely above the hearth. The specific resistance was measured by a four-terminal four-probe method with the application of a constant current at 25° C. in an atmosphere by using Loresta (trademark) from Mitsubishi Chemical Corporation (HP MCP-T410, probe in series, 1.5 mm pitch) as the measuring instrument. The visible light permeability was measured by placing the substrate after film formation vertically to measurement light for a visible wavelength band (380 to 780 nm) by using a spectrophotometer U-4000 manufactured by Hitachi, Ltd. as the measuring instrument.

Example E1

1% by mass of polyvinyl butyral as a binder was added to 100 g of a raw powder containing 90.4 g of ZnO powder, 5.8 g of $La_2O_3$ powder, and 3.8 g of $B_2O_3$ powder, and methylated alcohol as a dispersion medium was further added, thereby obtaining a slurry with a concentration of 30% by mass. Next, the slurry was put in a ball mill, air was blown into the slurry, and wet blending was performed, thereby obtaining a gas-containing slurry. The slurry was dry-comminuted after the dispersion medium in the slurry was vaporized by a vacuum drier at 80° C., thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 16.

Example E2

An organic foaming agent and an inorganic foaming agent were added to 100 g of a raw powder containing 91.4 g of ZnO powder, 5.8 g of $La_2O_3$ powder, and 2.8 g of $Al_2O_3$ powder, 1% by mass of polyvinyl butyral as a binder was added, and methylated alcohol was further added as a dispersion medium, thereby obtaining a slurry (viscosity 200 to 4000 cps) with a concentration of 30% by mass. For the organic foaming agent, azodicarboxylamide and dinitrosobenta methylene tetramine were used, and for the inorganic foaming agent, carbonate was used. The foaming agent-containing slurry was put in a ball mill, wet blending was performed, then, the slurry was dry-comminuted after the dispersion medium in the slurry was vaporized by a vacuum drier at 80° C., thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 16.

Example E3

An additive which will be volatized and dissolved upon calcination was added to 100 g of a raw powder containing 91.4 g of ZnO powder, 5.8 g of $La_2O_3$ powder, and 2.8 g of $Ga_2O_3$ powder, 1% by mass of polyvinyl butyral was added as a binder, and methylated alcohol was further added as a dispersion medium, thereby obtaining a slurry (viscosity 200 to 4000 cps) with a concentration of 30% by mass. For the additive which will be volatized and dissolved upon calcination, 20% by mass of polyvinyl butyral was used. The additive-containing slurry was put in a ball mill, wet blending was performed, then, the slurry was dry-comminuted after the dispersion medium in the slurry was vaporized by a vacuum drier at 80° C., thereby obtaining granulation powder having an average grain size of 200 µm. The granulation powder was molded under a predetermined pressure, and the molded bodies were calcinated such that the additive was volatized and dissolved, thereby producing porous sintered body pellets (ZnO vapor deposition material). The porosity, average pore diameter, and average crystal grain size of the sintered body are shown in Table 16.

Example E4

A porous sintered body pellet (ZnO vapor deposition material) was produced in the same manner as in Example E3 except that 100 g of a raw powder containing 91.2 g of ZnO powder, 5.8 g of $La_2O_3$ powder, and 3.0 g of $Sc_2O_3$ powder was used and, for the additive which will be volatized and dissolved upon calcination, 20% by mass of starch having a grain size of 50 µm was used. The porosity, average pore diameter, and average crystal grain size of the sintered body are shown in Table 16.

Example E5

The same raw powder as in Example E1 was used, and ZnO powder was filtered such that ZnO powder having an average grain size of 60 µm and a grain size distribution within a range of 55 to 65 µm was obtained. 1% by mass of polyvinyl butyral as a binder and also 30% by mass of methylated alcohol as an organic solvent were added to raw powder containing the ZnO powder and then mixed, thereby preparing a slurry in which the concentration of ZnO powder was 30% by mass. Next, the slurry was spray-dried, thereby obtaining porous granulation powder having an average grain size of 200 µm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 16.

Comparative Example E1

The same raw powder as in Example E1 was used, a slurry was prepared in the same manner as in Example E1 except that introduction of air into the slurry, addition of a foaming agent, and use of an additive which will be volatized and dissolved upon calcination were not performed, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 16.

Comparative Example E2

A slurry was prepared in the same manner as in Example E1 except that raw powder was used in which 5.8 g of $La_2O_3$ powder was added to 95.2 g of ZnO powder and no oxide powder of the second additive element was added, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 16.

Comparative Example E3

A slurry was prepared in the same manner as in Example E1 except that 100 g of ZnO powder containing no $LaO_2$ powder as a first additive element and no oxide powder of the second additive element was used, and the slurry was spray-dried, thereby obtaining granulation powder having an average grain size of 200 µm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 16.

[Deposition Test E]

A deposition test E was carried out using the ZnO vapor deposition materials of Examples E1 to E5 and the ZnO vapor deposition materials of Comparative Examples E1 to E3. A vapor deposition material as a sample was put in the hearth (diameter 50 mm, depth 25 mm) of the electron beam deposition device, adjustment was done in an atmosphere of an ultimate vacuum $2.66 \times 10^{-4}$ Pa ($2.0 \times 10^{-6}$ Torr) and $O_2$ partial pressure $1.33 \times 10^{-2}$ Pa ($1.0 \times 10^{-4}$ Torr), and an electron beam with an acceleration voltage of 10 kV and a beam scan area of about 40 mm$\phi$ was irradiated to heat the ZnO vapor deposition material, thereby forming a ZnO film. The evaporation speed was measured by a quartz crystal thickness monitor provided obliquely above the hearth. The results are shown in Table 17.

As shown in Tables 16 and 17, in Examples E1 to E5, the evaporation speed is higher than in Comparative Example E1. In Comparative Examples E2 and E3, the evaporation speed is the same as in Example E5, but the specific resistance is large and the conductivity is low.

[Moisture Resistance Test E]

For the samples of Examples E1 to E5 and Comparative Examples E1 and E3, a moisture resistance test E was performed. The moisture resistance test E was performed for 2000 hours in an atmosphere of humidity 60% and temperature 90° C. The specific resistance of a film was measured hourly. The results are shown in Table 18.

As shown in Table 18, with regard to the moisture resistance of a ZnO film formed of a ZnO vapor deposition material containing La and B, Al, Ga, or Sc, the deterioration rate of specific resistance is several times lower than a ZnO film containing no elements described above. This indicates that a ZnO film containing La and B, Al, Ga, or Sc is several times more stable.

Examples E6 to E8

A porous sintered body pellet (ZnO vapor deposition material) was produced in the same manner as in Example E1 except that adjustment was done such that the La content was 0.2% by mass, the B content was 0.1% by mass, and the porosity was in a range of 10 to 28%.

Examples E9 to E11

A porous sintered body pellet (ZnO vapor deposition material) was produced in the same manner as in Example E1 except that adjustment was done such that the La content was 14.9% by mass, the Al content was 10% by mass, and the porosity was in a range of 8 to 32%.

Comparative Example E4

A porous sintered body pellet (ZnO vapor deposition material) was produced in the same manner as in Examples E6 to E8 except that adjustment was done such that the porosity was 2%.

Comparative Example E5

A porous sintered body pellet (ZnO vapor deposition material) was produced in the same manner as in Examples E9 to E11 except that adjustment was done such that the porosity was 2%.

Comparative Examples E6 to E9

A porous sintered body pellet (ZnO vapor deposition material) was produced in the same manner as in Example E1 except that adjustment was done such that the La content was 20% by mass, the Ga content was 15% by mass, and the porosity was in a range of 2 to 30%.

For the samples of Examples E6 to E11 and Comparative Examples E4 to E9, a deposition test E was performed. The results are shown in Table 19. As shown in Table 19, similar to Table 16, in Examples E6 to E11, the ZnO vapor deposition material has a high evaporation speed and excellent specific resistance, as compared with Comparative Example E. On the other hand, in Comparative Examples E4, E5, and E9 having a small porosity, the evaporation speed is considerably low at 13.0 to 14.1. In Comparative Examples E6 to E9 in which the La content and the Ga content are high, a ZnO film has very large specific resistance and considerably low permeability.

TABLE 16

|  | Raw Powder (% by mass) | Slurry | ZnO Vapor Deposition Material | | |
|---|---|---|---|---|---|
|  |  |  | Porosity | Pore Diameter | Crystal Grain size |
| Example E1 | ZnO 90.4%, $La_2O_3$ 5.8%, $B_2O_3$ 3.8% (La: 4.9%), (B: 1.2%) | Gas-Containing Slurry | 16.3% | 23 | 60 |
| Example E2 | ZnO 91.4%, $La_2O_3$ 5.8%, $Al_2O_3$ 2.8% (La: 4.9%), (Al: 1.5%) | Foaming Agent-Containing Slurry | 26.7% | 34 | 52 |
| Example E3 | ZnO 91.4%, $La_2O_3$ 5.8%, $Ga_2O_3$ 2.8% (La: 4.9%), (Ga: 2.3%) | Additive-Containing Slurry | 30.9% | 45 | 51 |
| Example E4 | ZnO 91.2%, $La_2O_3$ 5.8%, $Sc_2O_3$ 3.0% (La: 4.9%), (Sc: 2.0%) | Additive-Containing Slurry | 31.6% | 64 | 45 |
| Example E5 | ZnO 90.4%, $La_2O_3$ 5.8%, $B_2O_3$ 3.8% (La: 4.9%), (B: 1.2%) | Slurry with Adjustment of Grain Size Distribution | 9.8% | 23 | 57 |
| Comparative Example E1 | ZnO 90.4%, $La_2O_3$ 5.8%, $B_2O_3$ 3.8% (La: 4.9%), (B: 1.2%) | Slurry with No Adjustment | 2.2% | 5 | 89 |
| Comparative Example E2 | ZnO 95.2%, $La_2O_3$ 5.8% (La: 4.9%) | Gas-Containing Slurry | 18.6% | 21 | 50 |
| Comparative Example E3 | ZnO Alone No Second Additive Element Added | Gas-Containing Slurry | 17.2% | 23 | 43 |

(Note)
Porosity is %, pore diameter is average pore diameter μm, and crystal grain size is average crystal grain size μm

TABLE 17

| | Evaporation Speed | | | Ratio of Evaporation | ZnO Film | |
| --- | --- | --- | --- | --- | --- | --- |
| | 20 mA | 60 mA | 100 mA | Speed | Specific Resistance | Visible Light Permeability |
| Example E1 | 6.2 | 17.9 | 31.0 | 1.4 | $8.2 \times 10^{-4}$ | 90 |
| Example E2 | 8.5 | 24.3 | 36.6 | 1.7 | $7.4 \times 10^{-4}$ | 90 |
| Example E3 | 8.7 | 24.8 | 43.1 | 2.0 | $7.2 \times 10^{-4}$ | 89 |
| Example E4 | 9.2 | 25.3 | 45.9 | 2.1 | $6.8 \times 10^{-4}$ | 89 |
| Example E5 | 5.4 | 17.7 | 24.8 | 1.1 | $8.1 \times 10^{-4}$ | 90 |
| Comparative Example E1 | 4.8 | 12.8 | 21.8 | 1 | | 90 |
| Comparative Example E2 | 6.1 | 17.2 | 28.5 | 1.3 | $8.4 \times 10^{-4}$ | 91 |
| Comparative Example E3 | 6.0 | 17.0 | 28.3 | 1.3 | $2.3 \times 10^{-2}$ | 92 |

(Note)
Evaporation speed is Å/sec, specific resistance is Ω · cm, and visible light permeability is %
Ratio of evaporation speed is ratio to evaporation speed of Comparative Example E1 at 100 mA

TABLE 18

Moisture Resistance Test E Result

| | Specific Resistance After Film Formation (0 hr) | Specific Resistance Deterioration Rate | | |
| --- | --- | --- | --- | --- |
| | | After 500 hr | After 100 hr | After 2000 hr |
| Example E1 | 1 | 1.03 | 1.05 | 1.08 |
| Example E2 | 1 | 1.03 | 1.05 | 1.07 |
| Example E3 | 1 | 1.04 | 1.07 | 1.09 |
| Example E4 | 1 | 1.03 | 1.06 | 1.08 |
| Example E5 | 1 | 1.04 | 1.05 | 1.07 |
| Comparative Example E1 | 1 | 1.03 | 1.05 | 1.09 |
| Comparative Example E3 | 1 | 1.29 | 1.38 | 1.49 |

(Note)
Deterioration rate of specific resistance represents change rate with setting 1 for after film formation.

TABLE 19

| | ZnO Vapor Deposition Material | | | Evaporation Speed | ZnO Film | |
| --- | --- | --- | --- | --- | --- | --- |
| | La | | Porosity | 60 mA | Specific Resistance | Permeability |
| Example E6 | 0.2 | B | 10 | 19.1 | $7.4 \times 10^{-4}$ | 89 |
| Example E7 | | 0.1 | 15 | 19.3 | $7.6 \times 10^{-4}$ | 88 |
| Example E8 | | | 28 | 27.4 | $7.9 \times 10^{-4}$ | 88 |
| Comparative Example E4 | | | 2 | 14.1 | $7.7 \times 10^{-4}$ | 88 |
| Example E9 | 14.9 | Al | 8 | 16.9 | $9.9 \times 10^{-4}$ | 86 |
| Example E10 | | 10 | 14 | 17.4 | $9.5 \times 10^{-4}$ | 85 |
| Example E11 | | | 32 | 23.1 | $9.3 \times 10^{-4}$ | 86 |
| Comparative Example E5 | | | 2 | 14.2 | $8.9 \times 10^{-4}$ | 85 |
| Comparative Example E6 | 20 | Ga | 5 | 16.2 | $1.4 \times 10^{-2}$ | 83 |
| Comparative Example E7 | | 15 | 16 | 17.3 | $1.5 \times 10^{-2}$ | 84 |
| Comparative Example E8 | | | 30 | 22.1 | $1.8 \times 10^{-2}$ | 83 |
| Comparative Example E9 | | | 2 | 14.7 | $1.9 \times 10^{-2}$ | 82 |
| Comparative Example E3 | 0 | 0 | 1.8 | 14.5 | $2.4 \times 10^{-2}$ | 90 |

(Note)
Porosity is %, pore diameter is average pore diameter μm, crystal grain size is average crystal grain size μm, evaporation speed is Å/sec, specific resistance is Ω · cm, and permeability is visible light permeability %

Example F

Hereinafter, Example F Group of this aspect will be described together with Comparative Example F Group. In Example F and Comparative Example F, commercially available ZnO powder, $Y_2O_3$ powder, $B_2O_3$ powder, $Al_2O_3$ powder, $Ga_2O_3$ powder, and $Sc_2O_3$ powder were used. Any powder has purity equal to or greater than 99% and an average grain size of 0.3 μm.

In any case, a slurry was prepared by using a ball mill (with a nylon-coated steel ball having a diameter of 5 to 20 mm), and wet blending was performed for 24 hours.

In any case, a uniaxial molding press device was used as the molding device, and molded bodies having an outer diameter of 6.7 mmϕ and a thickness of 2.0 mm were molded under pressure of 100 kgf/cm² (9.8 MPa). The molded bodies were put in an electric furnace and calcinated under air pressure at 1300° C. for 3 hours, thereby obtaining sintered body pellets.

In Example F and Comparative Example F, the porosity was measured by a substitution method. The measurement of the average pore diameter and the crystal grain size was performed by SEM (Scanning Electron Microscopy). The evaporation speed was measured by a quartz crystal thickness monitor provided obliquely above the hearth. The specific resistance was measured by a four-terminal four-probe method with the application of a constant current at 25° C. in an atmosphere by using Loresta (trademark) from Mitsubishi Chemical Corporation (HP MCP-T410, probe in series, 1.5 mm pitch) as the measuring instrument. The visible light permeability was measured by placing the substrate after film formation vertically to measurement light for a visible wavelength band (380 to 780 nm) by using a spectrophotometer U-4000 manufactured by Hitachi, Ltd. as the measuring instrument.

Example F1

1% by mass of polyvinyl butyral as a binder was added to 100 g of a raw powder containing 91.2 g of ZnO powder, 5.0 g of $Y_2O_3$ powder, and 3.8 g of $B_2O_3$ powder, and methylated alcohol as a dispersion medium was further added, thereby obtaining a slurry with a concentration of 30% by mass. Next, the slurry was put in a ball mill, air was blown into the slurry, and wet blending was performed, thereby obtaining a gas-containing slurry. The slurry was dry-comminuted after the dispersion medium in the slurry was vaporized by a vacuum drier at 80° C., thereby obtaining porous granulation powder having an average grain size of 200 μm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 20.

Example F2

An organic foaming agent and an inorganic foaming agent were added to 100 g of a raw powder containing 92.2 g of ZnO powder, 5.0 g of $Y_2O_3$ powder, and 2.8 g of $Al_2O_3$ powder, 1% by mass of polyvinyl butyral as a binder was added, and methylated alcohol was further added as a dispersion medium, thereby obtaining a slurry (viscosity 200 to 4000 cps) with a concentration of 30% by mass. For the organic foaming agent, azodicarboxylamide and dinitrosobenta methylene tetramine were used, and for the inorganic foaming agent, carbonate was used. The foaming agent-containing slurry was put in a ball mill, wet blending was performed, then, the slurry was dry-comminuted after the dispersion medium in the slurry was vaporized by a vacuum drier at 80° C., thereby obtaining porous granulation powder having an average grain size of 200 μm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 20.

Example F3

An additive which will be volatized and dissolved upon calcination was added to 100 g of a raw powder containing 92.2 g of ZnO powder, 5.0 g of $Y_2O_3$ powder, and 2.8 g of $Ga_2O_3$ powder, 1% by mass of polyvinyl butyral was added as a binder, and methylated alcohol was further added as a dispersion medium, thereby obtaining a slurry (viscosity 200 to 4000 cps) with a concentration of 30% by mass. For the additive which will be volatized and dissolved upon calcination, 20% by mass of polyvinyl butyral was used. The additive-containing slurry was put in a ball mill, wet blending was performed, then, the slurry was dry-comminuted after the dispersion medium in the slurry was vaporized by a vacuum drier at 80° C., thereby obtaining granulation powder having an average grain size of 200 μm. The granulation powder was molded under a predetermined pressure, and the molded bodies were calcinated such that the additive was volatized and dissolved, thereby producing porous sintered body pellets (ZnO vapor deposition material). The porosity, average pore diameter, and average crystal grain size of the sintered body are shown in Table 20.

Example F4

A porous sintered body pellet (ZnO vapor deposition material) was produced in the same manner as in Example F3 except that 100 g of a raw powder containing 92.0 g of ZnO powder, 5.0 g of $Y_2O_3$ powder, and 3.0 g of $Sc_2O_3$ powder was used and, for the additive which will be volatized and dissolved upon calcination, 20% by mass of starch having a grain size of 50 μm was used. The porosity, average pore diameter, and average crystal grain size of the sintered body are shown in Table 20.

Example F5

The same raw powder as in Example F1 was used, and ZnO powder was filtered such that ZnO powder having an average grain size of 60 μm and a grain size distribution within a range of 55 to 65 μm was obtained. 1% by mass of polyvinyl butyral as a binder and also 30% by mass of methylated alcohol as an organic solvent were added to raw powder containing the ZnO powder and then mixed, thereby preparing a slurry in which the concentration of ZnO powder was 30% by mass. Next, the slurry was spray-dried, thereby obtaining porous granulation powder having an average grain size of 200 μm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 20.

Comparative Example F1

The same raw powder as in Example F1 was used, a slurry was prepared in the same manner as in Example F1 except that introduction of air into the slurry, addition of a foaming agent, and use of an additive which will be volatized and dissolved upon calcination were not performed, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 20.

Comparative Example F2

A slurry was prepared in the same manner as in Example F1 except that raw powder was used in which 5.0 g of $Y_2O_3$ powder was added to 95 g of ZnO powder and no oxide powder of the second additive element was added, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 20.

Comparative Example F3

A slurry was prepared in the same manner as in Example F1 except that 100 g of ZnO powder containing no $YO_2$ powder as a first additive element and no oxide powder of the second additive element was used, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 20.

[Deposition Test F]

A deposition test F was carried out using the ZnO vapor deposition materials of Examples F1 to F5 and the ZnO vapor deposition materials of Comparative Examples F1 to F3. A vapor deposition material as a sample was put in the hearth (diameter 50 mm, depth 25 mm) of the electron beam deposition device, adjustment was done in an atmosphere of an ultimate vacuum $2.66 \times 10^{-4}$ Pa ($2.0 \times 10^{-6}$ Torr) and $O_2$ partial pressure $1.33 \times 10^{-2}$ Pa ($1.0 \times 10^{-4}$ Torr), and an electron beam with an acceleration voltage of 10 kV and a beam scan area of about 40 mm$\phi$ was irradiated to heat the ZnO vapor deposition material, thereby forming a ZnO film. The evaporation speed was measured by a quartz crystal thickness monitor provided obliquely above the hearth. The results are shown in Table 21.

As shown in Tables 20 and 21, in Examples F1 to F5, the evaporation speed is higher than in Comparative Example F1. In Comparative Examples F2 and F3, the evaporation speed is the same as in Example F5, but the specific resistance is large and the conductivity is low.

[Moisture Resistance Test F]

For the samples of Examples F1 to F5 and Comparative Examples F1 and F3, a moisture resistance test F was performed. The moisture resistance test F was performed for 2000 hours in an atmosphere of humidity 60% and temperature 90° C. The specific resistance of a film was measured hourly. The results are shown in Table 22.

As shown in Table 22, with regard to the moisture resistance of a ZnO film formed of a ZnO vapor deposition material containing Y and B, Al, Ga, or Sc, the deterioration rate of specific resistance is several times lower than a ZnO film containing no elements described above. This indicates that a ZnO film containing Y and B, Al, Ga, or Sc is several times more stable.

Examples F6 to F8

A porous sintered body pellet (ZnO vapor deposition material) was produced in the same manner as in Example F1 except that adjustment was done such that the Y content was 0.2% by mass, the B content was 0.1% by mass, and the porosity was in a range of 9 to 30%.

Examples F9 to F11

A porous sintered body pellet (ZnO vapor deposition material) was produced in the same manner as in Example F1 except that adjustment was done such that the Y content was 14.9% by mass, the Al content was 10% by mass, and the porosity was in a range of 9 to 30%.

Comparative Example F4

A porous sintered body pellet (ZnO vapor deposition material) was produced in the same manner as in Examples F6 to F8 except that adjustment was done such that the porosity was 2%.

Comparative Example F5

A porous sintered body pellet (ZnO vapor deposition material) was produced in the same manner as in Examples F9 to F11 except that adjustment was done such that the porosity was 2%.

Comparative Examples F6 to F9

A porous sintered body pellet (ZnO vapor deposition material) was produced in the same manner as in Example F1 except that adjustment was done such that the Y content was 20% by mass, the Ga content was 15% by mass, and the porosity was in a range of 5 to 29%.

For the samples of Examples F6 to F11 and Comparative Examples F4 to F9, a deposition test F was performed. The results are shown in Table 23. As shown in Table 23, similar to Table 20, in Examples F6 to F11, the ZnO vapor deposition material has a high evaporation speed and excellent specific resistance, as compared with Comparative Example F. On the other hand, in Comparative Examples F4, F5, and F9 having a small porosity, the evaporation speed is considerably low at 14.2 to 14.4. In Comparative Examples F6 to F9 in which the Ce content and the Ga content are high, a ZnO film has very large specific resistance and considerably low permeability.

TABLE 20

| | Raw Powder (% by mass) | Slurry | ZnO Vapor Deposition Material | | |
|---|---|---|---|---|---|
| | | | Porosity | Pore Diameter | Crystal Grain size |
| Example F1 | ZnO 91.2%, $Y_2O_3$ 5.0%, $B_2O_3$ 3.8% (Y: 3.9%), (B: 1.2%) | Gas-Containing Slurry | 17.5% | 25 | 57 |
| Example F2 | ZnO 92.2%, $Y_2O_3$ 5.0%, $Al_2O_3$ 2.8% (Y: 3.9%), (Al: 1.5%) | Foaming Agent-Containing Slurry | 24.8% | 34 | 48 |
| Example F3 | ZnO 92.2%, $Y_2O_3$ 5.0%, $Ga_2O_3$ 2.8% (Y: 3.9%), (Ga: 2.3%) | Additive-Containing Slurry | 27.9% | 42 | 42 |
| Example F4 | ZnO 92.0%, $Y_2O_3$ 5.0%, $Sc_2O_3$ 3.0% (Y: 3.9%), (Sc: 2.0%) | Additive-Containing Slurry | 29.7% | 48 | 34 |
| Example F5 | ZnO 91.2%, $Y_2O_3$ 5.0%, $B_2O_3$ 3.8% (Y: 3.9%), (B: 1.2%) | Slurry with Adjustment of Grain Size Distribution | 9.8% | 10 | 58 |
| Comparative Example F1 | ZnO 91.2%, $Y_2O_3$ 5.0%, $B_2O_3$ 3.8% (Y: 3.9%), (B: 1.2%) | Slurry with No Adjustment | 1.7% | 4 | 92 |
| Comparative Example F2 | ZnO 95.0%, $Y_2O_3$ 5.0% (Y: 3.9%) | Gas-Containing Slurry | 17.2% | 22 | 44 |
| Comparative Example F3 | ZnO Alone No Second Additive Element Added | Gas-Containing Slurry | 17.2% | 23 | 43 |

(Note)
Porosity is %, pore diameter is average pore diameter μm, and crystal grain size is average crystal grain size μm

TABLE 21

| | Evaporation Speed | | | Ratio of Evaporation Speed | ZnO Film | |
| --- | --- | --- | --- | --- | --- | --- |
| | 20 mA | 60 mA | 100 mA | | Specific Resistance | Visible Light Permeability |
| Example F1 | 6.1 | 17.7 | 30.7 | 1.3 | $6.8 \times 10^{-4}$ | 90 |
| Example F2 | 8.2 | 24.1 | 36.3 | 1.5 | $6.3 \times 10^{-4}$ | 89 |
| Example F3 | 8.3 | 25.0 | 42.1 | 1.8 | $6.0 \times 10^{-4}$ | 89 |
| Example F4 | 9.0 | 26.1 | 45.8 | 1.9 | $6.1 \times 10^{-4}$ | 89 |
| Example F5 | 5.8 | 17.8 | 25.2 | 1.1 | $6.7 \times 10^{-4}$ | 90 |
| Comparative Example F1 | 5.2 | 14.7 | 23.5 | 1 | $6.7 \times 10^{-4}$ | 90 |
| Comparative Example F2 | 5.9 | 16.8 | 27.9 | 1.2 | $9.5 \times 10^{-4}$ | 89 |
| Comparative Example F3 | 6.0 | 17.0 | 28.3 | 1.2 | $2.3 \times 10^{-2}$ | 92 |

(Note)
Evaporation speed is A/sec, specific resistance is $\Omega \cdot cm$, and visible light permeability is %
Ratio of evaporation speed is ratio to evaporation speed of Comparative Example F1 at 100 mA

TABLE 22

| | Moisture Resistance Test F Result | | | |
| --- | --- | --- | --- | --- |
| | Specific Resistance | Specific Resistance Deterioration Rate | | |
| | After Film Formation (0 hr) | After 500 hr | After 100 hr | After 2000 hr |
| Example F1 | 1 | 1.03 | 1.05 | 1.08 |
| Example F2 | 1 | 1.03 | 1.05 | 1.07 |
| Example F3 | 1 | 1.04 | 1.07 | 1.09 |
| Example F4 | 1 | 1.03 | 1.06 | 1.08 |
| Example F5 | 1 | 1.04 | 1.05 | 1.07 |
| Comparative Example F1 | 1 | 1.03 | 1.05 | 1.09 |
| Comparative Example F3 | 1 | 1.29 | 1.38 | 1.49 |

(Note)
Deterioration rate of specific resistance represents change rate with setting 1 for after film formation.

TABLE 23

| | ZnO Vapor Deposition Material | | Porosity | Evaporation Speed 60 mA | ZnO Film | |
| --- | --- | --- | --- | --- | --- | --- |
| | Y | | | | Specific Resistance | Permeability |
| Example F6 | 0.2 | B | 9 | 19.9 | $7.1 \times 10^{-4}$ | 87 |
| Example F7 | | 0.1 | 14 | 20.4 | $7.3 \times 10^{-4}$ | 87 |
| Example F8 | | | 30 | 28.8 | $7.2 \times 10^{-4}$ | 88 |
| Comparative Example F4 | | | 2 | 14.4 | $7.4 \times 10^{-4}$ | 87 |
| Example F9 | 14.9 | Al | 9 | 17.1 | $8.9 \times 10^{-4}$ | 85 |
| Example F10 | | 10 | 15 | 17.9 | $9.0 \times 10^{-4}$ | 85 |
| Example F11 | | | 30 | 23.0 | $9.1 \times 10^{-4}$ | 85 |
| Comparative Example F5 | | | 2 | 14.2 | $8.8 \times 10^{-4}$ | 84 |
| Comparative Example F6 | 20 | Ga | 5 | 15.9 | $1.5 \times 10^{-2}$ | 84 |
| Comparative Example F7 | | 15 | 14 | 16.7 | $1.6 \times 10^{-2}$ | 84 |
| Comparative Example F8 | | | 29 | 21.8 | $1.2 \times 10^{-2}$ | 83 |
| Comparative Example F9 | | | 2 | 14.3 | $1.5 \times 10^{-2}$ | 83 |
| Comparative Example F3 | 0 | 0 | 1.8 | 14.5 | $2.4 \times 10^{-2}$ | 90 |

(Note)
Porosity is %, pore diameter is average pore diameter μm, crystal grain size is average crystal grain size μm, evaporation speed is A/sec, specific resistance is $\Omega \cdot cm$, and permeability is visible light permeability %

Example G

Hereinafter, Example G Group of this aspect will be described together with Comparative Example G Group. In Example G and Comparative Example G, commercially available ZnO powder, $Pr_6O_{11}$ powder, $B_2O_3$ powder, $Al_2O_3$ powder, $Ga_2O_3$ powder, and $Sc_2O_3$ powder were used. Any powder has purity equal to or greater than 99% and an average grain size of 0.3 μm.

In any case, a slurry was prepared by using a ball mill (with a nylon-coated steel ball having a diameter of 5 to 20 mm), and wet blending was performed for 24 hours. In any case, a uniaxial molding press device was used as the molding device, and molded bodies having an outer diameter of 6.7 mmϕ and a thickness of 2.0 mm were molded under pressure of 100 kgf/cm² (9.8 MPa). The molded bodies were put in an electric furnace and calcinated under air pressure at 1300° C. for 3 hours, thereby obtaining sintered body pellets.

In Example G and Comparative Example G, the porosity was measured by a substitution method. The measurement of the average pore diameter and the crystal grain size was performed by SEM (Scanning Electron Microscopy). The evaporation speed was measured by a quartz crystal thickness monitor provided obliquely above the hearth. The specific resistance was measured by a four-terminal four-probe method with the application of a constant current at 25° C. in an atmosphere by using Loresta (trademark) from Mitsubishi Chemical Corporation (HP MCP-T410, probe in series, 1.5 mm pitch) as the measuring instrument. The visible light permeability was measured by placing the substrate after film formation vertically to measurement light for a visible wavelength band (380 to 780 nm) by using a spectrophotometer U-4000 manufactured by Hitachi, Ltd. as the measuring instrument.

Example G1

1% by mass of polyvinyl butyral as a binder was added to 100 g of a raw powder containing 91.2 g of ZnO powder, 5.0 g of $Pr_6O_{11}$ powder, and 3.8 g of $B_2O_3$ powder, and methylated alcohol as a dispersion medium was further added, thereby obtaining a slurry with a concentration of 30% by mass. Next, the slurry was put in a ball mill, air was blown into the slurry, and wet blending was performed, thereby obtaining a gas-containing slurry. The slurry was dry-comminuted after the dispersion medium in the slurry was vaporized by a vacuum drier at 80° C., thereby obtaining porous granulation powder having an average grain size of 200 μm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 24.

Example G2

An organic foaming agent and an inorganic foaming agent were added to 100 g of a raw powder containing 92.2 g of ZnO powder, 5.0 g of $Pr_6O_{11}$ powder, and 2.8 g of $Al_2O_3$ powder, 1% by mass of polyvinyl butyral as a binder was added, and methylated alcohol was further added as a dispersion medium, thereby obtaining a slurry (viscosity 200 to 4000 cps) with a concentration of 30% by mass. For the organic foaming agent, azodicarboxylamide and dinitrosobenta methylene tetramine were used, and for the inorganic foaming agent, carbonate was used. The foaming agent-containing slurry was put in a ball mill, wet blending was performed, then, the slurry was dry-comminuted after the dispersion medium in the slurry was vaporized by a vacuum drier at 80° C., thereby obtaining porous granulation powder having an average grain size of 200 μm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 24.

Example G3

An additive which will be volatized and dissolved upon calcination was added to 100 g of a raw powder containing 92.2 g of ZnO powder, 5.0 g of $Pr_6O_{11}$ powder, and 2.8 g of $Ga_2O_3$ powder, 1% by mass of polyvinyl butyral was added as a binder, and methylated alcohol was further added as a dispersion medium, thereby obtaining a slurry (viscosity 200 to 4000 cps) with a concentration of 30% by mass. For the additive which will be volatized and dissolved upon calcination, 20% by mass of polyvinyl butyral was used. The additive-containing slurry was put in a ball mill, wet blending was performed, then, the slurry was dry-comminuted after the dispersion medium in the slurry was vaporized by a vacuum drier at 80° C., thereby obtaining granulation powder having an average grain size of 200 μm. The granulation powder was molded under a predetermined pressure, and the molded bodies were calcinated such that the additive was volatized and dissolved, thereby producing porous sintered body pellets (ZnO vapor deposition material). The porosity, average pore diameter, and average crystal grain size of the sintered body are shown in Table 24.

Example G4

A porous sintered body pellet (ZnO vapor deposition material) was produced in the same manner as in Example G3 except that 100 g of a raw powder containing 92.0 g of ZnO powder, 5.0 g of $Pr_6O_{11}$ powder, and 3.0 g of $Sc_2O_3$ powder was used and, for the additive which will be volatized and dissolved upon calcination, 20% by mass of starch having a grain size of 50 μm was used. The porosity, average pore diameter, and average crystal grain size of the sintered body are shown in Table 24.

Example G5

The same raw powder as in Example G1 was used, and ZnO powder was filtered such that ZnO powder having an average grain size of 60 μm and a grain size distribution within a range of 55 to 65 μm was obtained. 1% by mass of polyvinyl butyral as a binder and also 30% by mass of methylated alcohol as an organic solvent were added to raw powder containing the ZnO powder and then mixed, thereby preparing a slurry in which the concentration of ZnO powder was 30% by mass. Next, the slurry was spray-dried, thereby obtaining porous granulation powder having an average grain size of 200 μm. The granulation powder was molded under a predetermined pressure, and the molded bodies were calcinated, thereby producing porous sintered body pellets (ZnO vapor deposition material). The porosity, average pore diameter, and average crystal grain size of the sintered body are shown in Table 24.

Comparative Example G1

The same raw powder as in Example G1 was used, a slurry was prepared in the same manner as in Example G1 except that introduction of air into the slurry, addition of a foaming agent, and use of an additive which will be volatized and dissolved upon calcination were not performed, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 24.

Comparative Example G2

A slurry was prepared in the same manner as in Example G1 except that raw powder was used in which 5.0 g of $Pr_6O_{11}$ powder was added to 95 g of ZnO powder and no oxide powder of the second additive element was added, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 24.

Comparative Example G3

A slurry was prepared in the same manner as in Example G1 except that 100 g of ZnO powder containing no oxide powder of the first additive element and no oxide powder the second additive element was used, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). The porosity, average pore diameter, and average crystal grain size of the sintered body are shown in Table 24.

[Deposition Test G]

A deposition test G was carried out using the ZnO vapor deposition materials of Examples G1 to G5 and the ZnO vapor deposition materials of Comparative Examples G1 to G3. A vapor deposition material as a sample was put in the hearth (diameter 50 mm, depth 25 mm) of the electron beam deposition device, adjustment was done in an atmosphere of an ultimate vacuum $2.66 \times 10^{-4}$ Pa ($2.0 \times 10^{-6}$ Torr) and $O_2$ partial pressure $1.33 \times 10^{-2}$ Pa ($1.0 \times 10$ Torr), and an electron beam with an acceleration voltage of 10 kV and a beam scan area of about 40 mmϕ was irradiated to heat the ZnO vapor deposition material, thereby forming a ZnO film. The evaporation speed was measured by a quartz crystal thickness monitor provided obliquely above the hearth. The results are shown in Table 25.

As shown in Tables 24 and 25, in Examples G1 to G5, the evaporation speed is higher than in Comparative Example G1. In Comparative Examples G2 and G3, the evaporation speed is the same as in Example G5, but the specific resistance is large and the conductivity is low.

[Moisture Resistance Test G]

For the samples of Examples G1 to G5 and Comparative Examples G1 and G3, a moisture resistance test G was performed. The moisture resistance test G was performed for 2000 hours in an atmosphere of humidity 60% and temperature 90° C. The specific resistance of a film was measured hourly. The results are shown in Table 26.

As shown in Table 26, with regard to the moisture resistance of a ZnO film formed of a ZnO vapor deposition material containing Pr and B, Al, Ga, or Sc, the deterioration rate of specific resistance is several times lower than a ZnO film containing no elements described above. This indicates that a ZnO film containing Pr and B, Al, Ga, or Sc is several times more stable.

Examples G6 to G8

A porous sintered body pellet (ZnO vapor deposition material) was produced in the same manner as in Example G1 except that adjustment was done such that the Pr content was 0.2% by mass, the B content was 0.1% by mass, and the porosity was in a range of 10 to 31%.

Examples G9 to G11

A porous sintered body pellet (ZnO vapor deposition material) was produced in the same manner as in Example G1 except that adjustment was done such that the Pr content was 14.9% by mass, the Al content was 10% by mass, and the porosity was in a range of 9 to 32%.

Comparative Example G4

A porous sintered body pellet (ZnO vapor deposition material) was produced in the same manner as in Examples G6 to G8 except that adjustment was done such that the porosity was 2%.

Comparative Example G5

A porous sintered body pellet (ZnO vapor deposition material) was produced in the same manner as in Examples G9 to G11 except that adjustment was done such that the porosity was 2%.

Comparative Examples G6 to G9

A porous sintered body pellet (ZnO vapor deposition material) was produced in the same manner as in Example G1 except that adjustment was done such that the Pr content was 20% by mass, the Ga content was 15% by mass, and the porosity was in a range of 2 to 31%.

For the samples of Examples G6 to G11 and Comparative Examples G4 to G9, a deposition test G was performed. The results are shown in Table 27. As shown in Table 27, similar to Table 24, in Examples G6 to G11, the ZnO vapor deposition material has a high evaporation speed and excellent specific resistance, as compared with Comparative Example G On the other hand, in Comparative Examples G4, G5, and G9 having a small porosity, the evaporation speed is considerably low at 14.2 to 14.4. In Comparative Examples G6 to G9 in which the Pr content and the Ga content are high, a ZnO film has very large specific resistance and considerably low permeability.

TABLE 24

| | | | ZnO Vapor Deposition Material | | |
| --- | --- | --- | --- | --- | --- |
| | Raw Powder (% by mass) | Slurry | Porosity | Pore Diameter | Crystal Grain size |
| Example G1 | ZnO 91.2%, $Pr_6O_{11}$ 5.0%, $B_2O_3$ 3.8% (Pr: 4.1%), (B: 1.2%) | Gas-Containing Slurry | 18.1% | 25 | 59 |
| Example G2 | ZnO 92.2%, $Pr_6O_{11}$ 5.0%, $Al_2O_3$ 2.8% (Pr: 4.1%), (Al: 1.5%) | Foaming Agent-Containing Slurry | 25.2% | 34 | 48 |
| Example G3 | ZnO 92.2%, $Pr_6O_{11}$ 5.0%, $Ga_2O_3$ 2.8% (Pr: 4.1%), (Ga: 2.3%) | Additive-Containing Slurry | 28.3% | 40 | 44 |
| Example G4 | ZnO 92.0%, $Pr_6O_{11}$ 5.0%, $Sc_2O_3$ 3.0% (Pr: 4.1%), (Sc: 2.0%) | Additive-Containing Slurry | 29.8% | 52 | 34 |
| Example G5 | ZnO 91.2%, $Pr_6O_{11}$ 5.0%, $B_2O_3$ 3.8% (Pr: 4.1%), (B: 1.2%) | Slurry with Adjustment of Grain Size Distribution | 10.5% | 10 | 60 |
| Comparative Example G1 | ZnO 91.2%, $Pr_6O_{11}$ 5.0%, $B_2O_3$ 3.8% (Pr: 4.1%), (B: 1.2%) | Slurry with No Adjustment | 1.8% | 4 | 94 |

TABLE 24-continued

|  | Raw Powder (% by mass) | Slurry | ZnO Vapor Deposition Material | | |
|---|---|---|---|---|---|
|  |  |  | Porosity | Pore Diameter | Crystal Grain size |
| Comparative Example G2 | ZnO 95.0%, Pr$_6$O$_{11}$ 5.0% (Pr: 4.1%) | Gas Containing Slurry | 17.3% | 23 | 44 |
| Comparative Example G3 | ZnO Alone No Second Additive Element Added | Gas-Containing Slurry | 17.2% | 23 | 43 |

(Note)
Porosity is %, pore diameter is average pore diameter μm, and crystal grain size is average crystal grain size μm

TABLE 25

|  | Evaporation Speed | | | Ratio of Evaporation Speed | ZnO Film | |
|---|---|---|---|---|---|---|
|  | 20 mA | 60 mA | 100 mA |  | Specific Resistance | Visible Light Permeability |
| Example G1 | 6.7 | 18.9 | 31.8 | 1.4 | 8.1 × 10$^{-4}$ | 92 |
| Example G2 | 8.5 | 25.4 | 37.8 | 1.6 | 8.1 × 10$^{-4}$ | 91 |
| Example G3 | 8.7 | 26.6 | 44.7 | 1.9 | 8.1 × 10$^{-4}$ | 90 |
| Example G4 | 9.3 | 26.9 | 48.0 | 2.0 | 8.1 × 10$^{-4}$ | 90 |
| Example G5 | 6.0 | 18.9 | 26.9 | 1.1 | 8.1 × 10$^{-4}$ | 92 |
| Comparative Example G1 | 5.2 | 14.7 | 23.5 | 1 | 8.1 × 10$^{-4}$ | 92 |
| Comparative Example G2 | 6.1 | 17.2 | 28.6 | 1.2 | 1.8 × 10$^{-3}$ | 92 |
| Comparative Example G3 | 6.0 | 17.0 | 28.3 | 1.2 | 2.3 × 10$^{-2}$ | 92 |

(Note)
Evaporation speed is Å/sec, specific resistance is Ω·cm, and visible light permeability is %
Ratio of evaporation speed is ratio to evaporation speed of Comparative Example G1 at 100 mA

TABLE 26

Moisture Resistance Test G Results

| | Specific Resistance After Film Formation (0 hr) | Specific Resistance Deterioration Rate | | |
|---|---|---|---|---|
| | | After 500 hr | After 100 hr | After 2000 hr |
| Example G1 | 1 | 1.05 | 1.07 | 1.09 |
| Example G2 | 1 | 1.04 | 1.08 | 1.11 |
| Example G3 | 1 | 1.05 | 1.07 | 1.10 |
| Example G4 | 1 | 1.05 | 1.09 | 1.11 |
| Example G5 | 1 | 1.04 | 1.07 | 1.09 |
| Comparative Example G1 | 1 | 1.04 | 1.07 | 1.10 |
| Comparative Example G3 | 1 | 1.29 | 1.38 | 1.49 |

(Note)
Deterioration rate of specific resistance represents change rate with setting 1 for after film formation.

TABLE 27

|  | ZnO Vapor Deposition Material | | Evaporation Speed | ZnO Film | |
|---|---|---|---|---|---|
|  | Pr | Porosity | 60 mA | Specific Resistance | Permeability |
| Example G6 | 0.2 | B 10 | 19.9 | 9.1 × 10$^{-4}$ | 86 |
| Example G7 |  | 0.1 15 | 20.4 | 9.3 × 10$^{-4}$ | 86 |
| Example G8 |  | 31 | 28.8 | 9.2 × 10$^{-4}$ | 87 |
| Comparative Example G4 |  | 2 | 14.4 | 9.4 × 10$^{-4}$ | 86 |
| Example G9 | 14.9 | Al 9 | 17.1 | 1.2 × 10$^{-3}$ | 85 |
| Example G10 |  | 10 16 | 17.9 | 1.4 × 10$^{-3}$ | 85 |
| Example G11 |  | 32 | 23.0 | 1.3 × 10$^{-3}$ | 86 |
| Comparative Example G5 |  | 2 | 14.2 | 1.2 × 10$^{-3}$ | 85 |
| Comparative Example G6 | 20 | Ga 4 | 15.9 | 1.9 × 10$^{-2}$ | 83 |
| Comparative Example G7 |  | 15 15 | 16.7 | 1.8 × 10$^{-2}$ | 83 |
| Comparative Example G8 |  | 31 | 21.8 | 1.7 × 10$^{-2}$ | 82 |
| Comparative Example G9 |  | 2 | 14.3 | 1.9 × 10$^{-2}$ | 83 |
| Comparative Example G3 | 0 | 0 1.8 | 14.5 | 2.4 × 10$^{-2}$ | 90 |

(Note)
Porosity is %, pore diameter is average pore diameter μm, crystal grain size is average crystal grain size μm, evaporation speed is Å/sec, specific resistance is Ω·cm, and permeability is visible light permeability %

Example H

Hereinafter, Example H Group of this aspect will be described together with Comparative Example H Group. In Example H and Comparative Example H, commercially available ZnO powder, Ce oxide powder, Y oxide powder, La oxide powder, Pr oxide powder, Nd oxide powder, Pm oxide powder, and Sm oxide powder were used. Any powder has purity equal to or greater than 99% and an average grain size of 0.3 µm.

A slurry was prepared by using a ball mill (with a nylon-coated steel ball having a diameter of 5 to 20 mm), and wet blending was performed for 24 hours. In any case, a uniaxial molding press device was used as a molding device, and a molded body was molded under pressure of 100 kgf/cm$^2$ (9.8 MPa). The molded bodies were put in an electric furnace and calcinated under air pressure at 1300° C. for 3 hours, thereby forming a plate-shaped (vertical 5 mm×horizontal 5 mm×thickness 2 mm) sintered body (ZnO vapor deposition material). In Example H and Comparative Example H, the porosity was measured by a substitution method. The measurement of the average pore diameter and the crystal grain size was performed by SEM (Scanning Electron Microscopy). The evaporation speed upon film formation was measured by a quartz crystal thickness monitor provided obliquely above the hearth.

A ZnO film was formed of the ZnO vapor deposition material to have a thickness of 200 nm on a glass substrate by an electron beam deposition method. The film formation conditions were that an ultimate vacuum was $1.0 \times 10^{-4}$ Pa, oxygen gas partial pressure was $1.0 \times 10^{-2}$ Pa, and substrate temperature was 200° C. The evaporation speed upon film formation was measured by a quartz crystal thickness monitor provided obliquely above the hearth. The specific resistance and visible light permeability of the formed ZnO film were measured. The specific resistance was measured by a four-terminal four-probe method with the application of a constant current at a so-called normal temperature of 25° C. in an atmosphere by using Loresta (trademark) from Mitsubishi Chemical Corporation (HP MCP-T410, probe in series, 1.5 mm pitch) as the measuring instrument. The permeability was measured by placing the substrate after film formation vertically to measurement light for a visible wavelength band (380 to 780 nm) by using a spectrophotometer U-4000 manufactured by Hitachi, Ltd. as the measuring instrument. The results were shown in Tables 28 and 29.

Example H1

1% by mass of polyvinyl butyral as a binder was added to 100 g of a raw powder containing 93.8 g of ZnO powder and 6.2 g of CeO$_2$ powder, and methylated alcohol as a dispersion medium was further added, thereby obtaining a slurry with a concentration of 30% by mass. Next, the slurry was put in a ball mill, air was blown into the slurry, and wet blending was performed, thereby obtaining a gas-containing slurry. The slurry was dry-comminuted after the dispersion medium in the slurry was vaporized by a vacuum drier at 80° C., thereby obtaining porous granulation powder having an average grain size of 200 µm. The granulation powder was molded under a predetermined pressure, and the molded bodies were calcinated, thereby producing porous sintered body pellets (ZnO vapor deposition material). A ZnO Film was formed of the ZnO vapor deposition material.

Example H2

A porous sintered body pellet (ZnO vapor deposition material) was produced in the same manner as in Example H1 except that 5.0 g of Sc$_2$O$_3$ powder was used instead of CeO$_2$ powder, and a foaming agent was added instead of blowing air into the slurry. A ZnO film was formed of the ZnO vapor deposition material.

Example H3

A porous sintered body pellet (ZnO vapor deposition material) was produced in the same manner as in Example H1 except that 5.0 g of Y$_2$O$_3$ powder was used instead of CeO$_2$ powder, and a foaming agent was added instead of blowing air into the slurry. A ZnO film was formed of the ZnO vapor deposition material.

Example H4

A porous sintered body pellet (ZnO vapor deposition material) was produced in the same manner as in Example H1 except that 5.8 g of La$_2$O$_3$ powder was used instead of CeO$_2$ powder, and an additive which will be volatized and dissolved upon calcination was added instead of blowing air into the slurry. A ZnO film was formed of the ZnO vapor deposition material.

Example H5

A porous sintered body pellet (ZnO vapor deposition material) was produced in the same manner as in Example H1 except that 5.0 g of Pr$_6$O$_{H}$ powder was used instead of CeO$_2$ powder, and starch was used as an additive, which will be volatized and dissolved upon calcination, instead of blowing air into the slurry. A ZnO film was formed of the ZnO vapor deposition material.

Example H6

A porous sintered body pellet (ZnO vapor deposition material) was produced in the same manner as in Example H1 except that 5.0 g of Nd$_2$O$_3$ powder was used instead of CeO$_2$ powder, and an additive which will be volatized and dissolved upon calcination was used instead of blowing air into the slurry. A ZnO film was formed of the ZnO vapor deposition material.

Example H7

A porous sintered body pellet (ZnO vapor deposition material) was produced in the same manner as in Example H1 except that 5.0 g of Pm$_2$O$_3$ powder was used instead of CeO$_2$ powder, and a foaming agent was added instead of blowing air into the slurry. A ZnO film was formed of the ZnO vapor deposition material.

Example H8

5.0 g of Sm$_2$O$_3$ powder was used instead of CeO$_2$ powder, and ZnO powder was filtered such that ZnO powder having an average grain size of 60 µm and a grain size distribution of 55 to 65 µm was obtained instead of blowing air into the slurry. 1% by mass of polyvinyl butyral as a binder and 30% by mass of methylated alcohol as an organic solvent were added to mixed raw powder of the ZnO powder and Sm oxide powder and mixed, thereby preparing a slurry in which the concentration of ZnO powder was 30% by mass. Next, the slurry was spray-dried, thereby obtaining porous granulation powder having an average grain size of 200 µm. The granulation powder was molded under a predetermined pressure, and the molded bodies were calcinated, thereby producing porous sintered body pellets (ZnO vapor deposition material). A ZnO film was formed of the ZnO vapor deposition material.

Comparative Example H1

The same raw powder as in Example H1 was used, a slurry was prepared in the same manner as in Example H1 except that introduction of air into the slurry, addition of a foaming agent, and use of an additive which will be volatized and dissolved upon calcination were not performed, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). A ZnO film was formed of the ZnO vapor deposition material.

Comparative Example H2

A slurry was prepared in the same manner as in Example H1 except that 100 g of ZnO powder was used and no oxide powder of the additive elements was added, and the slurry was spray-dried, thereby obtaining granulation powder having an average grain size of 200 μm. The granulation powder was molded under a predetermined pressure, and the molded bodies were calcinated, thereby preparing a sintered body pellet (ZnO vapor deposition material). A ZnO film was formed of the ZnO vapor deposition material.

[Deposition Test]

A deposition test was carried out using the ZnO vapor deposition materials of Examples H1 to H5 and the ZnO vapor deposition materials of Comparative Examples H1 to H3. A vapor deposition material as a sample was put in the hearth (diameter 50 mm, depth 25 mm) of the electron beam deposition device, adjustment was done in an atmosphere of an ultimate vacuum $2.66 \times 10^{-4}$ Pa ($2.0 \times 10^{-6}$ Torr) and $O_2$ partial pressure $1.33 \times 10^{-2}$ Pa ($1.0 \times 10$ Torr), and an electron beam with an acceleration voltage of 10 kV and a beam scan area of about 40 mmφ was irradiated to heat the ZnO vapor deposition material, thereby forming a ZnO film. The evaporation speed was measured by a quartz crystal thickness monitor provided obliquely above the hearth. The results are shown in Table 29.

As shown in Tables 28 and 29, in Examples H1 to H5, the evaporation speed is higher than in Comparative Example H1. In Comparative Examples H2 and H3, the evaporation speed is the same as in Example H5, but the specific resistance is large and the conductivity is low.

[Moisture Resistance Test]

For the samples of Examples H1 to H5 and Comparative Examples H1 and H2, a moisture resistance test was performed. The moisture resistance test was performed for 2000 hours in an atmosphere of humidity 60% and temperature 90° C. The specific resistance of a film was measured hourly. The results are shown in Table 30.

As shown in Table 30, with regard to the moisture resistance of a ZnO film formed of a ZnO vapor deposition material containing Ce, Sc, Y, La, Pr, Nd, Pm, or Sm, the deterioration rate of specific resistance is several times lower than a ZnO film containing no elements described above. This indicates that a ZnO film containing Ce, Sc, Y, La, Pr, Nd, Pm, or Sm is several times more stable.

Examples H6 to H8

A porous sintered body pellet (ZnO vapor deposition material) was produced in the same manner as in Example H1 except that adjustment was done such that the Ce content was 0.2% by mass, the Nd content was 0.1% by mass, and the porosity was in a range of 10 to 29%.

Examples H9 to H11

A porous sintered body pellet (ZnO vapor deposition material) was produced in the same manner as in Example H1 except that adjustment was done such that the Ce content was 14.9% by mass, the Pm content was 10% by mass, and the porosity was in a range of 10 to 31%.

Comparative Example H4

A porous sintered body pellet (ZnO vapor deposition material) was produced in the same manner as in Examples H6 to H8 except that adjustment was done such that the porosity was 2%.

Comparative Example H5

A porous sintered body pellet (ZnO vapor deposition material) was produced in the same manner as in Examples H9 to H11 except that adjustment was done such that the porosity was 2%.

Comparative Examples H6 to H9

A porous sintered body pellet (ZnO vapor deposition material) was produced in the same manner as in Example H1 except that adjustment was done such that the Ce content was 20% by mass, the Sm content was 15% by mass, and the porosity was in a range of 8 to 30%.

For the samples of Examples H6 to H11 and Comparative Examples H4 to H9, a deposition test was performed. The results are shown in Table 31. As shown in Table 31, similar to Table 28, in Examples H6 to H11, the ZnO vapor deposition material has a high evaporation speed and excellent specific resistance, as compared with Comparative Example H. On the other hand, in Comparative Examples H4, H5, and H9 having a small porosity, the evaporation speed is considerably low at 14.8 to 14.9. In Comparative Examples H6 to H9 in which the Ce content and the Sm content are high, a ZnO film has very large specific resistance and considerably low permeability.

TABLE 28

| | Raw Powder (% by mass) | Slurry | ZnO Vapor Deposition Material | | |
|---|---|---|---|---|---|
| | | | Porosity | Pore Diameter | Crystal Grain size |
| Example H1 | ZnO 93.8%, $CeO_2$ 6.2% | Gas-Containing Slurry | 17.9% | 22 | 45 |
| Example H2 | ZnO 95.0%, $Sc_2O_3$ 5.0% | Foaming Agent-Containing Slurry | 26.0% | 32 | 47 |
| Example H3 | ZnO 95.0%, $Y_2O_3$ 5.0% | Additive-Containing Slurry | 29.8% | 40 | 42 |

TABLE 28-continued

|  | Raw Powder (% by mass) | Slurry | ZnO Vapor Deposition Material Porosity | Pore Diameter | Crystal Grain size |
|---|---|---|---|---|---|
| Example H4 | ZnO 94.2%, La$_2$O$_3$ 5.8% | Additive-Containing Slurry | 31.2% | 48 | 35 |
| Example H5 | ZnO 95.0%, Pr$_6$O$_{11}$ 5.0% | Additive-Containing Slurry | 30.4% | 47 | 38 |
| Example H6 | ZnO 95.0%, Nd$_2$O$_3$ 5.0% | Additive-Containing Slurry | 30.9% | 48 | 37 |
| Example H7 | ZnO 95.0%, Pm$_2$O$_3$ 5.0% | Foaming Agent-Containing Slurry | 29.6% | 42 | 40 |
| Example H8 | ZnO 95.0%, Sm$_2$O$_3$ 5.0% | Slurry with Adjustment of Grain Size Distribution | 11.2% | 55 | 57 |
| Comparative Example H1 | Same As Example H1 | Slurry with No Adjustment | 1.7% | 4 | 94 |
| Comparative Example H2 | ZnO Alone No Additive Element Added | Gas-Containing Slurry | 17.2% | 23 | 43 |

(Note)
Porosity is %, pore diameter is average pore diameter μm, and crystal grain size is average crystal grain size μm

TABLE 29

|  | Evaporation Speed | | | Ratio of Evaporation Speed | ZnO Film Specific Resistance | Visible Light Permeability |
|---|---|---|---|---|---|---|
|  | 20 mA | 60 mA | 100 mA | | | |
| Example H1 | 6.2 | 17.1 | 28.4 | 1.2 | 8.1 × 10$^{-4}$ | 89 |
| Example H2 | 8.3 | 24.7 | 36.9 | 1.6 | 9.2 × 10$^{-4}$ | 87 |
| Example H3 | 8.8 | 24.7 | 43.9 | 1.9 | 9.5 × 10$^{-4}$ | 89 |
| Example H4 | 9.6 | 27.2 | 48.3 | 2.1 | 8.4 × 10$^{-4}$ | 91 |
| Example H5 | 9.3 | 26.1 | 47.2 | 2.0 | 1.8 × 10$^{-3}$ | 92 |
| Example H6 | 9.5 | 26.9 | 48.1 | 2.1 | 2.3 × 10$^{-3}$ | 90 |
| Example H7 | 9.1 | 25.7 | 45.3 | 1.9 | 3.1 × 10$^{-3}$ | 89 |
| Example H8 | 5.9 | 16.9 | 25.9 | 1.1 | 2.9 × 10$^{-3}$ | 91 |
| Comparative Example H1 | 5.1 | 14.2 | 23.3 | 1 | 8.4 × 10$^{-4}$ | 89 |
| Comparative Example H2 | 6.3 | 17.1 | 28.3 | 1.2 | 2.3 × 10$^{-2}$ | 92 |

(Note)
Evaporation speed is Å/sec, specific resistance is Ω · cm, and visible light permeability is %
Ratio of evaporation speed is ratio to evaporation speed of Comparative Example H1 at 100 mA

TABLE 30

Moisture Resistance Test Results

|  | Specific Resistance After Film formation (0 hr) | Specific Resistance Deterioration Rate | | |
|---|---|---|---|---|
|  | | After 500 hr | After 100 hr | After 2000 hr |
| Example H1 | 1 | 1.02 | 1.04 | 1.06 |
| Example H2 | 1 | 1.03 | 1.05 | 1.08 |
| Example H3 | 1 | 1.02 | 1.05 | 1.07 |
| Example H4 | 1 | 1.03 | 1.05 | 1.08 |
| Example H5 | 1 | 1.04 | 1.06 | 1.08 |
| Comparative Example H1 | 1 | 1.02 | 1.03 | 1.04 |
| Comparative Example H2 | 1 | 1.29 | 1.38 | 1.49 |

(Note)
Deterioration rate of specific resistance represents change rate with setting 1 for after film formation.

TABLE 31

|  | ZnO Vapor Deposition Material | | Evaporation Speed | ZnO Film | |
|---|---|---|---|---|---|
|  | Ce | Porosity | 60 mA | Specific Resistance | Permeability |
| Example H6 | 0.2 | Nd 10 | 20.4 | 8.1 × 10$^{-4}$ | 89 |
| Example H7 | | 0.1 14 | 22.8 | 8.8 × 10$^{-4}$ | 89 |
| Example H8 | | 29 | 30.1 | 8.6 × 10$^{-4}$ | 88 |
| Comparative Example H3 | | 2 | 14.9 | 8.3 × 10$^{-4}$ | 89 |
| Example H9 | 14.9 | Pm 10 | 19.8 | 7.2 × 10$^{-3}$ | 86 |
| Example H10 | | 10 | 17 | 21.4 | 7.5 × 10$^{-3}$ | 86 |

TABLE 31-continued

| | ZnO Vapor Deposition Material | | | Evaporation Speed | ZnO Film | |
|---|---|---|---|---|---|---|
| | Ce | | Porosity | 60 mA | Specific Resistance | Permeability |
| Example H11 | | | 31 | 24.4 | $7.9 \times 10^{-3}$ | 85 |
| Comparative Example H4 | | | 2 | 14.9 | $7.5 \times 10^{-3}$ | 86 |
| Comparative Example H5 | 20 | Sm | 8 | 17.4 | $9.3 \times 10^{-2}$ | 84 |
| Comparative Example H6 | | 15 | 15 | 18.2 | $9.4 \times 10^{-2}$ | 83 |
| Comparative Example H7 | | | 30 | 22.9 | $9.1 \times 10^{-2}$ | 82 |
| Comparative Example H8 | | | 2 | 14.8 | $9.5 \times 10^{-2}$ | 83 |
| Comparative Example H2 | 0 | 0 | 1.8 | 14.5 | $2.4 \times 10^{-2}$ | 90 |

(Note)
Porosity is %, pore diameter is average pore diameter μm, crystal grain size is average crystal grain size μm, evaporation speed is Å/sec, specific resistance is Ω · cm, and permeability is visible light permeability %

INDUSTRIAL APPLICABILITY

According to the present invention, it is possible to form a ZnO film having high permeability, excellent denseness, and high durability. Further, it is possible to obtain a film having excellent moisture resistance and gas and vapor barrier properties. Therefore, the present invention is industrially applicable.

The invention claimed is:

1. A ZnO vapor deposition material for formation of a transparent conductive film comprising:
a porous ZnO sintered body containing Ce and Al,
wherein the Ce content is higher than the Al content, the Ce content is in a range of 0.1 to 14.9% by mass, the Al content is in a range of 0.1 to 10% by mass, and the sintered body has a porosity of 20 to 50%.

2. The ZnO vapor deposition material according to claim 1, wherein the total content of Ce and Al is in a range of 0.2 to 15% by mass.

3. The ZnO vapor deposition material according to claim 1, wherein the porous ZnO sintered body has pores having an average pore diameter of 0.1 to 500 μm.

4. The ZnO vapor deposition material described in claim 1, wherein the porous ZnO sintered body is a sintered body of grains having an average crystal grain size of 1 to 500 μm.

5. The ZnO vapor deposition material described in claim 1, wherein the porous ZnO sintered body is polycrystal or monocrystal.

6. The ZnO vapor deposition material described in claim 1, wherein the Ce content is in a range of 3 to 6% by mass.

7. The ZnO vapor deposition material described in claim 1, wherein the Al content is in a range of 1 to 3% by mass.

8. The ZnO vapor deposition material described in claim 1, wherein the surface area of the porous ZnO sintered body is in a range of 5 to 40 m²/g.

9. The ZnO vapor deposition material described in claim 1, wherein the porous ZnO sintered body is a sintered body of grains having an average crystal grain size of 5 to 40 μm.

10. The ZnO vapor deposition material described in claim 1, wherein the porous ZnO sintered body is molded in the form of pellets.

* * * * *